United States Patent
Shelef et al.

(10) Patent No.: US 9,006,560 B2
(45) Date of Patent: Apr. 14, 2015

(54) SOLAR RECEIVER

(76) Inventors: Ben Shelef, Cupertino, CA (US);
Shmuel Erez, San Jose, CA (US)

( * ) Notice: Subject to any disclaimer, the term of this patent is extended or adjusted under 35 U.S.C. 154(b) by 989 days.

(21) Appl. No.: 13/086,315

(22) Filed: Apr. 13, 2011

(65) Prior Publication Data

US 2011/0247679 A1 Oct. 13, 2011

Related U.S. Application Data

(60) Provisional application No. 61/323,857, filed on Apr. 13, 2010, provisional application No. 61/334,560, filed on May 13, 2010, provisional application No. 61/351,946, filed on Jun. 7, 2010, provisional application No. 61/370,755, filed on Aug. 4, 2010, provisional application No. 61/407,911, filed on Oct. 29, 2010, provisional application No. 61/432,584, filed on Jan. 14, 2011.

(51) Int. Cl.

| | |
|---|---|
| *H02N 6/00* | (2006.01) |
| *H01L 31/042* | (2014.01) |
| *F24J 2/38* | (2014.01) |
| *F24J 2/02* | (2006.01) |
| *F24J 2/12* | (2006.01) |

(Continued)

(52) U.S. Cl.
CPC .... *F24J 2/12* (2013.01); *F24J 2/07* (2013.01); *F24J 2/52* (2013.01); *H01L 31/0525* (2013.01); *F24J 2/523* (2013.01); *F24J 2002/1085* (2013.01); *Y02E 10/42* (2013.01); *Y02E 10/47* (2013.01); *Y02E 10/52* (2013.01); *Y02E 10/41* (2013.01)

(58) Field of Classification Search
CPC .................. F24J 2/07; F24J 2/12; F24J 2/52; F24J 2/523; F24J 2002/1085; H01L 31/0525; Y02E 10/41; Y02E 10/42; Y02E 10/47; Y02E 10/52

USPC ........................ 136/246; 126/600, 680, 690
See application file for complete search history.

(56) References Cited

U.S. PATENT DOCUMENTS

| | | |
|---|---|---|
| 513,525 A | 1/1894 | Nelson |
| 4,030,102 A | 6/1977 | Kaplan et al. |

(Continued)

FOREIGN PATENT DOCUMENTS

| | | | |
|---|---|---|---|
| CN | 2441084 Y | * 8/2001 | ............ F24J 2/02 |
| DE | 102007051714 | * 5/2009 | ............ H01L 31/04 |

OTHER PUBLICATIONS

English abstract of DE102007051714, Oct. 30, 2007.*

(Continued)

*Primary Examiner* — Tamir Ayad
(74) *Attorney, Agent, or Firm* — Nixon Peabody LLP; Joseph Bach, Esq.

(57) ABSTRACT

A lightweight reflector with a load bearing structure based on a tensile spoke-wheel. The spoke structure is especially compatible with dish parabolic mirrors, but has utility as a carrier structure for any round functional surface, including flat or slightly-curved mirrors used in central tower solar systems, parabolic dishes for radio telescopes and antennas, and for non-concentrating thin film solar panels. There are no radial members loaded in compression. All the spokes pull the rim inwards, and the rim is compressed in the circumferential direction. The imbalance in spoke tension results from the application of load provides the rigidity of the rim in respect to the hub, both for in-plane and out-of-plane forces. Ribs stiffen the spokes to resist wind and gravity, but are not structurally supported by either the hub or the rim. Lightweight reflector tiles match the wheel structure and create the reflective surface.

20 Claims, 39 Drawing Sheets

(51) Int. Cl.
*F24J 2/07* (2006.01)
*F24J 2/52* (2006.01)
*H01L 31/052* (2014.01)
*F24J 2/10* (2006.01)

(56) References Cited

U.S. PATENT DOCUMENTS

| | | | |
|---|---|---|---|
| 4,056,309 | A | 11/1977 | Harbison et al. |
| 4,172,443 | A | 10/1979 | Sommer |
| 4,352,112 | A | 9/1982 | Leonhardt et al. |
| 4,354,484 | A | 10/1982 | Malone et al. |
| 4,432,342 | A | 2/1984 | Lucas et al. |
| 4,552,438 | A | 11/1985 | Murphy |
| 4,682,865 | A | 7/1987 | Rogers et al. |
| 5,054,466 | A | 10/1991 | White et al. |
| 5,325,844 | A | 7/1994 | Rogers et al. |
| 6,415,783 | B1 | 7/2002 | Harrison |
| 2007/0238536 | A1 | 10/2007 | Smits |
| 2008/0163864 | A1 | 7/2008 | Larson |
| 2008/0265659 | A1 | 10/2008 | Heyse |
| 2009/0277498 | A1 | 11/2009 | Angel |
| 2011/0206453 | A1 | 8/2011 | Shelef et al. |

OTHER PUBLICATIONS

English machine translation of abstract of CN2441084Y, Huang Yi, publication date Aug. 1, 2001, 1 page.*

Rabla, "Optical and Thermal Properties of Compound Parabolic Concentrators", Solar Energy, vol. 18, Issue 6, pp. 497-511, Mar. 1976.

International Search Report and Written Opinion for PCT/US2011/032378 dated Aug. 31, 2011.

Office Action in Chinese Patent Application No. 201180029235.8 dated Aug. 5, 2014.

* cited by examiner

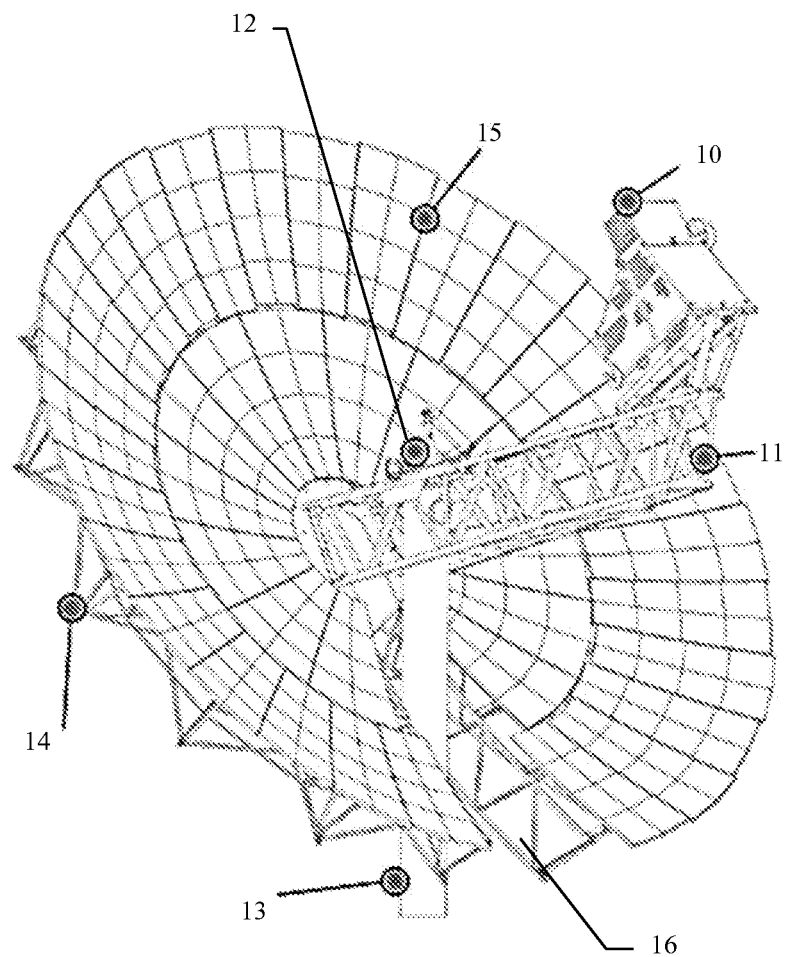
Figure 1 – Prior Art

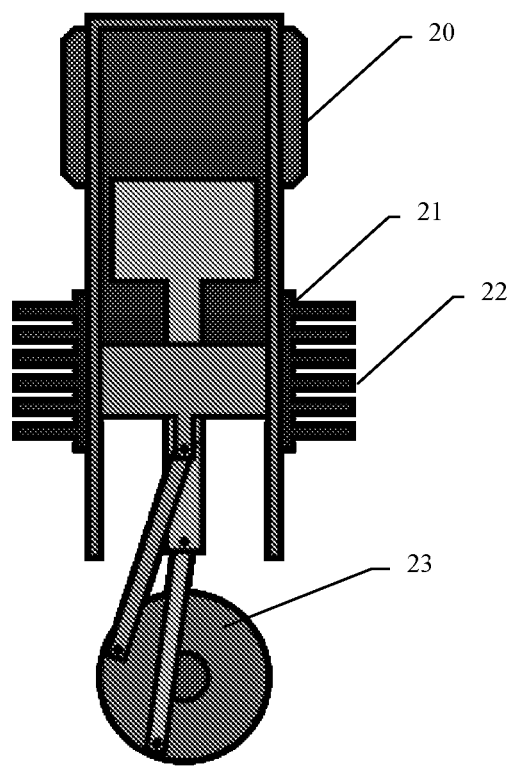
Figure 2 – Prior Art

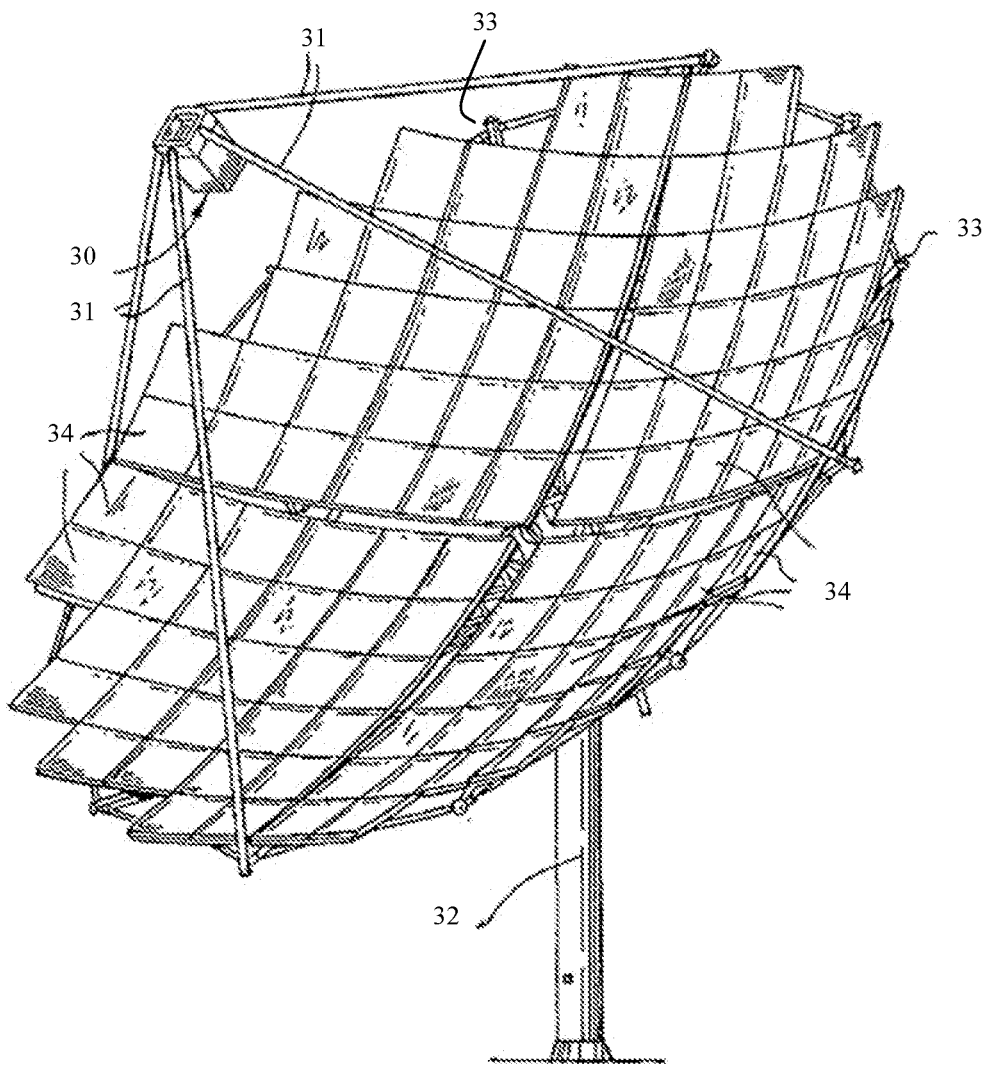
Figure 3 – Prior Art

Figure 4 – Prior Art

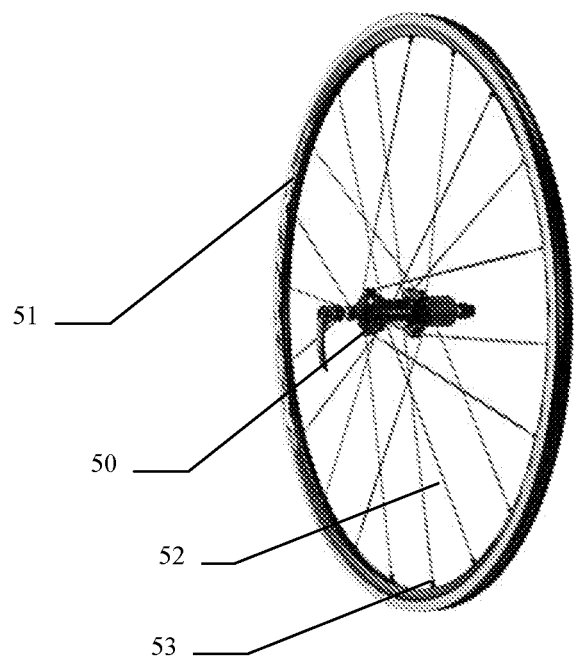
Figure 5 – Prior Art

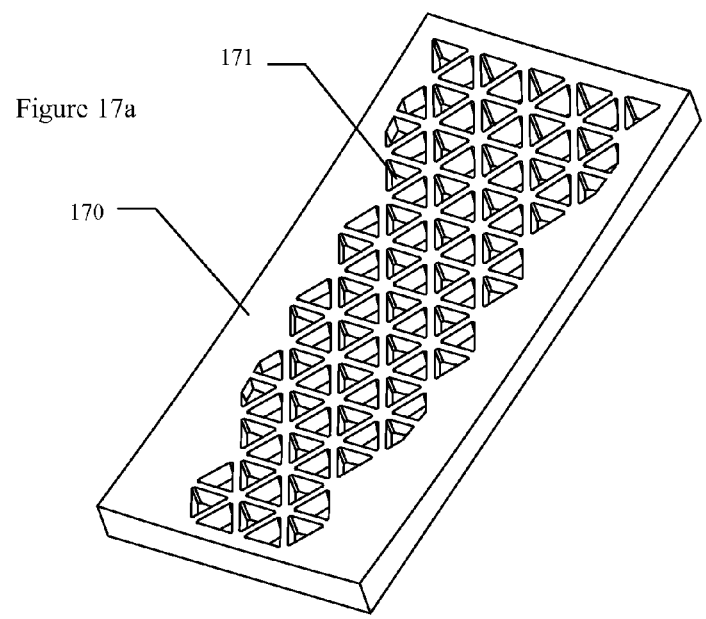
Figure 17a
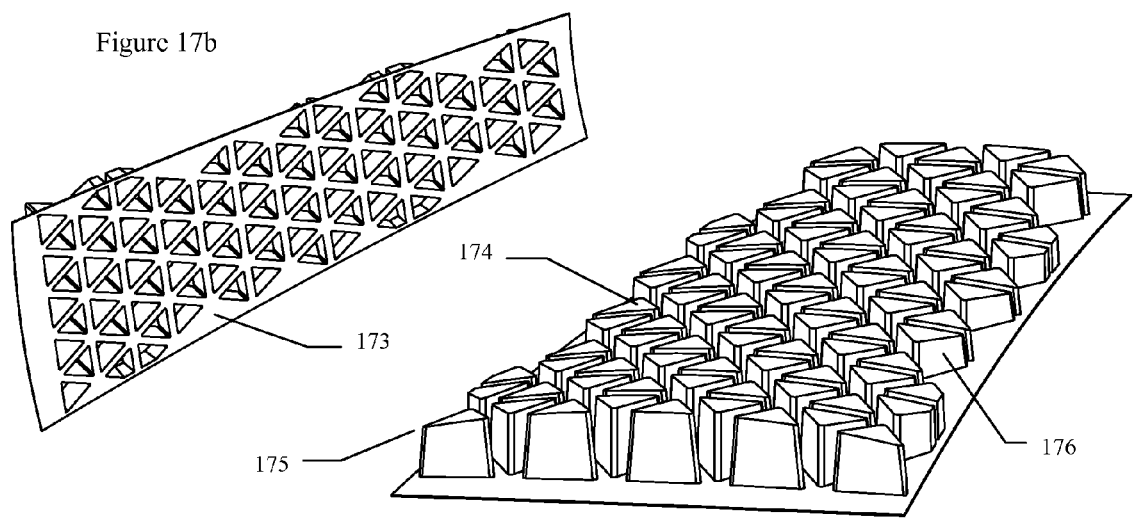
Figure 17b
Figure 17c

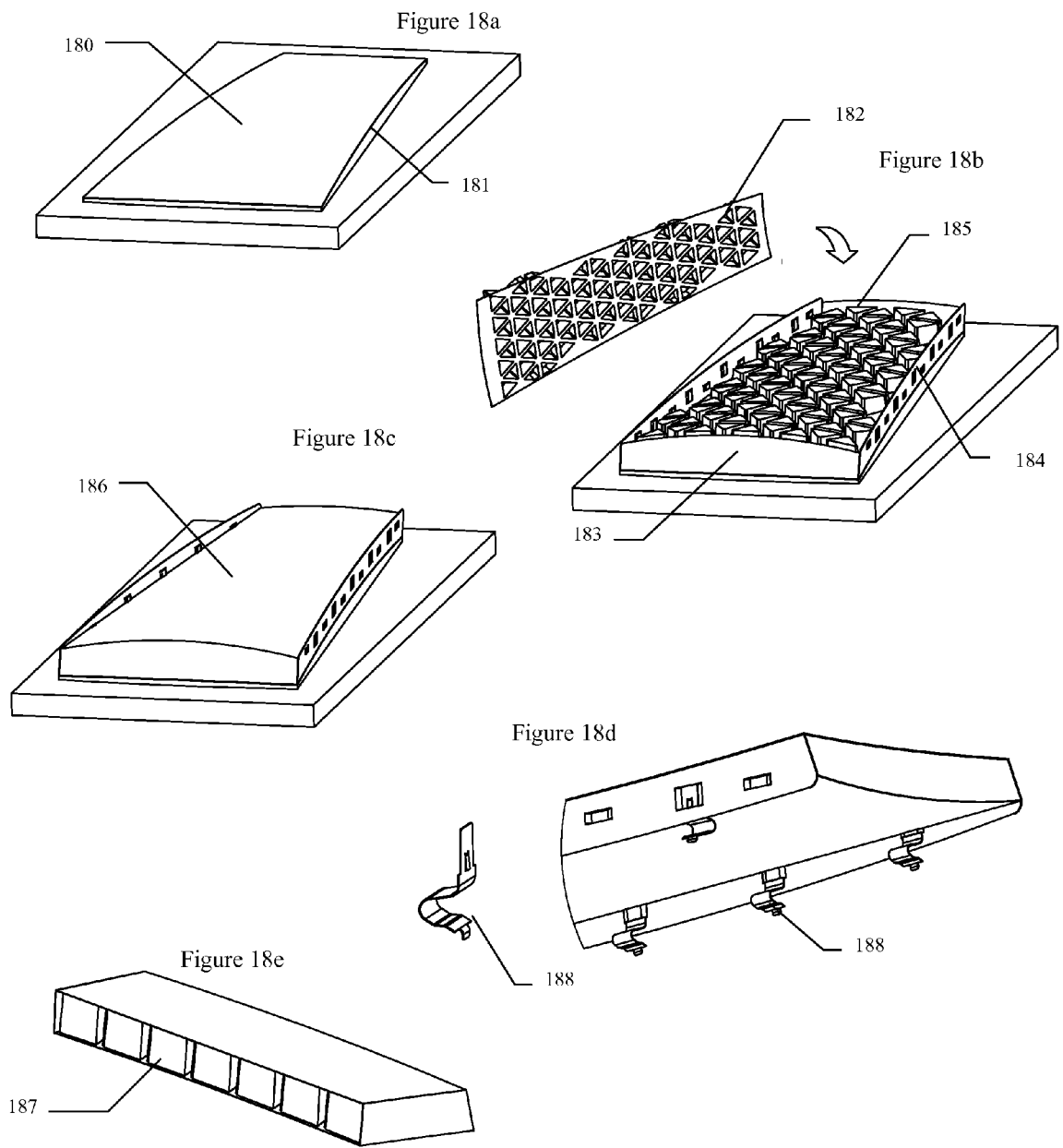

(Front)

(Back)

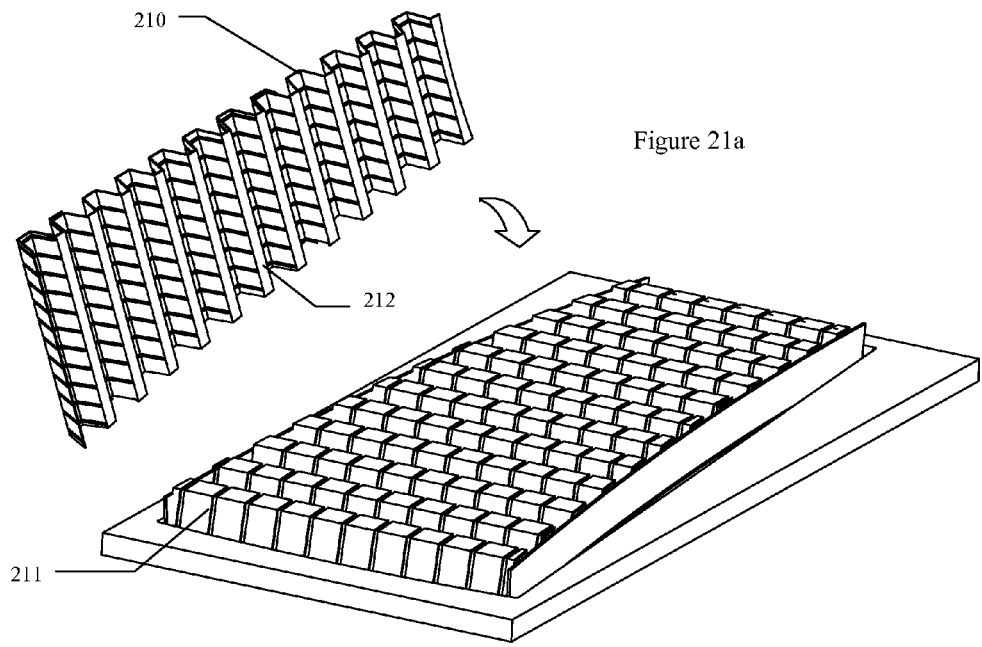
Figure 21a
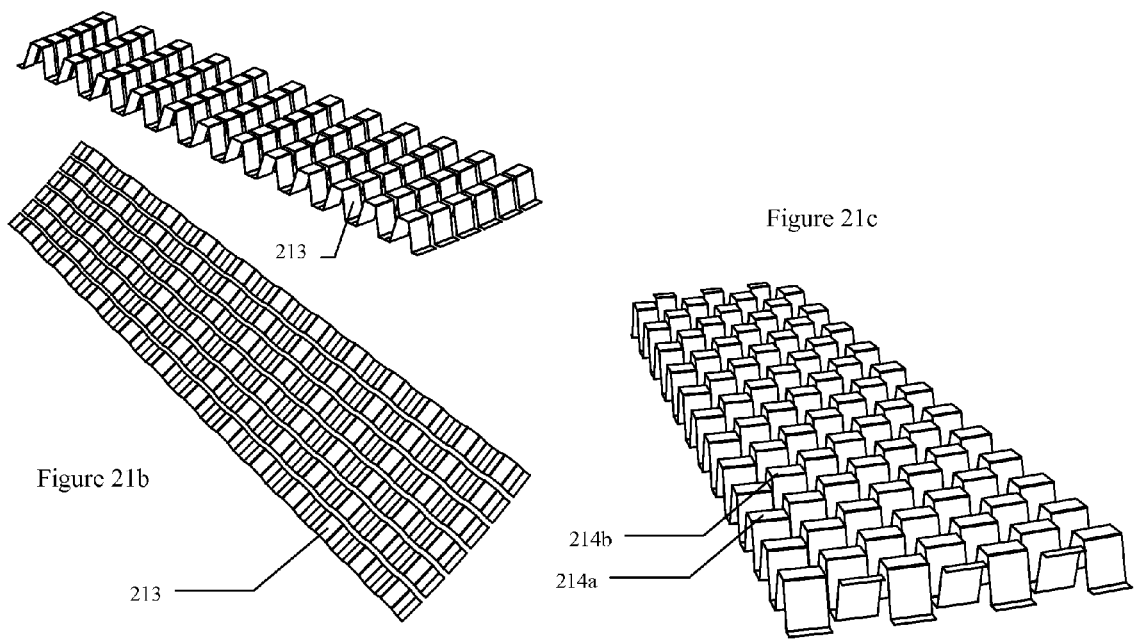
Figure 21b
Figure 21c

Front View

Back View

SOLAR RECEIVER

CROSS-REFERENCE TO RELATED APPLICATIONS

This application claims priority from U.S. Provisional patent applications No. 61/323,857 filed on Apr. 13, 2010; No. 61/334,560 filed on May 13, 2010; No. 61/351,946 filed on Jun. 7, 2010; No. 61/370,755 filed on Aug. 4, 2010; No. 61/407,911 filed on Oct. 29, 2010; No. 61/432,584 filed on Jan. 14, 2011; the entireties of which are incorporated herein by reference.

FIELD

The present application belongs to the field of solar energy systems.

BACKGROUND

1. Context

Concentrated solar power (CSP) systems are ones that concentrate incoming solar light before converting it into useful power. The conversion itself can be photovoltaic or thermal, but the common theme is that it is cheaper to collect the light over a large area and into a small power conversion unit (PCU) than it is to build a large power converter.

There are several methods to concentrate solar power, including lenses, sun-tracking parabolic dish reflectors that position the PCU at the focus of a paraboloid, and central tower systems in which a large number of principally flat tracking mirrors direct the sun onto the top of a tower where the PCU is housed.

In the case of dish reflectors, the PCU is part of the moving structure since it has to be kept at the focal point of the dish as it tracks the sun. Additionally, since dish reflectors are typically large, they themselves are comprised of smaller reflectors held rigidly together to form the complete optical surface. Typically, these smaller reflectors need to be aligned relative to the dish structure during assembly in the field. Dish reflectors can use photovoltaic (PV) PCUs, Stirling engines, turbines, or heat collectors and steam generators.

2. State of the Art

FIG. 1 shows a conventional solar thermal dish design (manufactured by Stirling Energy Systems of Arizona) containing a thermal PCU [10] connected to a dish through a boom [11] (or balance beam), which connects to pivot actuation machinery [12] that is mounted on a pole (also called a pedestal) [13]. The dish and PCU [10] are roughly balanced via the boom [11] with respect to the pedestal [13], reducing the gravity loads on the actuation machinery [12]. The dish is comprised of a carrier truss [14] and reflector tiles [15]. Because of the balance-beam design, such dishes must have a slice [16] cut into them to prevent the pedestal [13] from hitting the dish when it points upwards. The shape of the reflector surface of the dish (made up of the sum of the reflector surfaces of the tiles [15]) is approximately a paraboloid (a parabolic arc revolved around its optical axis) and the aperture of the PCU [10] is located at the focal point of the paraboloid. The pivot actuation machinery [12] is controlled by a sun-tracker that keeps the optical axis of the dish pointed at the sun.

The reflector tiles [15] themselves are made from thin glass which is warped elastically over a metallic shell and bonded to it. In other systems, thick glass is hot-formed and plastically deformed into the desired shape. In other systems, the thin glass is replaced with a thin Aluminum or Steel sheet with a reflective coating.

FIG. 2 shows a schematic of a Stirling engine PCU, which is a type of a thermal engine. (In FIG. 1, the PCU was denoted as item 10). Like all thermal engines, this PCU has a hot side [20] and a cold side [21]. The hot side [20] is illuminated by the light reflected from the dish and is traditionally mounted facing it and closest to it. The cold side [21] is therefore traditionally mounted further away from the dish, towards the sun. The cold side [21] is connected to a heat exchanger [22] which rejects heat into the environment and keeps its temperature from rising. An electric generator [23] is powered by the engine and mechanically coupled to it. In most thermal designs, both the heat exchanger [22] and the generator [23] are part of the PCU package [10]. It is the high weight of thermal PCUs that traditionally dictates the balance-beam design for the dish.

FIG. 3 shows a conventional dish-based photovoltaic system (manufactured by Solar Systems of Australia). Since photovoltaic PCUs are lighter than thermal PCUs, the system does not use a balance beam, and instead the PCU [30] is connected to the dish via a focal support structure [31]. The dish, in turn, is directly connected to the actuation machinery [hidden] and pedestal [32]. The dish is comprised of a carrier truss [33] and reflective tiles [34], same as in the solar thermal dish and the shape of the optical surface of the primary dish is similarly a piece-wise segmented paraboloid. In a PV system, there is no generator, but there is still a need for a heat exchanger, since the PV cells need to be kept cold. In many PV dishes, the heat exchanger is located on the ground and coolant is piped between it and the PCU [30].

The optical area of both dishes shown above is about 100 $m^2$. In the PV dish, the concentration factor is about 1000, the area of the aperture of the receiver is 0.1 $m^2$, and it is built from approximately 1000 PV cells, each only 1 cm on a side, arranged in a "dense array" roughly 30 cm across (shown schematically in FIG. 4b, 44). Since PV cells produce low voltage (~3V), and since the output voltage of the dish must be high (100-600 V) to keep the current manageable, many of the cells need to be wired in series, a process known as "stringing". Cells on the same string must produce the same amount of current or else the efficiency of the string drops due cell current mismatch, known as a "stringing losses".

FIG. 4a shows a single photovoltaic cell. The cell has an active area [41] covered with thin conductive lines known as the collection grid [42] that leads to two side contacts [43] commonly known as bus bars. The two bus bars [43] correspond to the "plus" side of the photovoltaic junction, and the back surface of the cell corresponds to the "minus" side. The grid lines [42] are created by metallic deposition and are made tall and thin to minimize shading, but still produce significant shading for light that is arriving at a shallow angle relative to the front surface of the cell. Cells designed for high concentration are typically made by depositing multiple layers of semiconductor materials on a Germanium substrate, but other technologies are equally relevant to this invention. Such "multi-junction" cells are made by companies such as Spectrolab, Emcore, and Solar Junction.

In traditional dish systems, the carrier truss is non-adjustable and is assembled in the field to the best practical precision. The truss is then placed on top of the pedestal, and the reflector tiles are assembled onto it using adjustable mating mechanisms—typically three adjustment screws at the back of each tile that connect to three points on the truss. At this stage, using an optical reference (e.g. pointing at the moon, or a laser system that bounces off of the reflector tiles) the orientation of each reflector tile is adjusted by turning the screws until it is properly aligned relative to the focal point.

Deficiencies in Existing Art

The "truss and glass" dish architecture described above is performance limited due to several factors.

Typical truss-based primary mirror designs weigh around 50 kg/m², and their assembly and alignment in the field is very time consuming, taking more than a day for the 100 m² reflector described above.

The truss is made from a very large number of members, which have to be bolted, riveted, or welded together, in the field. The large part count introduces tolerance stack-up errors, and the large number of joints are all sources of stress concentration, fatigue, and structural creep.

The tile alignment process requires bringing each tile into the correct orientation by tweaking three screws on its back side. The required tolerance is 1 mRad or tighter, and for 100 tiles there are 300 such screws. The person doing the tweaking cannot see the reflection from the tile, and so needs to receive the information from someone else. If the structure creeps over time, alignment has to be re-done. If tiles need to be replaced, they need to be re-aligned—all requiring highly-trained manpower.

The heavy weight of the dish and in particular its large moment of inertia makes precise tracking difficult, and either increases the cost of the actuation machinery or reduced tracking accuracy, which results in reduced output. In boom-based designs, the mass is distributed in a dumbbell-like way, which is the worst case in terms of rotational moment of inertia, which makes tracking more difficult. Boom flexing adds another oscillation mode and further complicates alignment and tracking. Stiffening the boom adds mass to the system. The slice that has to be cut in the dish reduces the optical area, reduces its rigidity, and degrades optical accuracy.

The optical surface precision of the reflector tiles is also lacking in practice, due to the shell/glass structure having insufficient precision. This problem can be solved with "brute force" precision optical processes such as glass grinding, but in solar power design, cost and fabrication speed are major design considerations, and those processes are prohibitive.

Finally, optical performance is hindered by accumulated dust and dirt on the optical surfaces. Cleaning frequency is limited since it requires extensive manpower, and since it wastes large quantities of water.

Dense array photovoltaic receivers also suffer from several performance issues:

Thermal: The temperature of the PV cells has to be kept low—typically less than 100 C to prevent failure, but preferably near 30 C to prevent performance losses and lifetime issues. The receiver therefore has to reject the generated heat, and at 1000× illumination and with tightly packed PV cells this is a difficult problem, since there is very little area the cells can reject heat into.

Optical: Any lit area covered with the wires or traces used to collect the electricity from the front surface of the cells plus any gaps between the cells, do not produce electricity and thus lead to a corresponding loss in efficiency. Since the cells are small and the current densities large, these effects are much more significant than in non-concentrating PV cells.

Electrical: The above constraints motivate the use of very thin conductors, which create Ohmic losses and wasted power in the conductor network.

Uniformity: In the dense array receiver, the cells near the edge of the array receive more cooling and less illumination than those near its center. The non-uniform illumination stems from several reasons, all ultimately stemming from the imaging nature of the paraboloid optics. (In an imaging optical system, if for example one side of the sun is blocked by a cloud, then half the receiver correspondingly goes dark, whereas in a perfect non-imaging optical system, the entire receiver becomes uniformly half-lit.)

First, the sun is not a uniform source but rather a Gaussian one. Second, the image on the receiver is the sum of many images from the various reflector panels, and since they each have independent deviations, the statistical sum is brightest at their nominal aiming point. Finally, tracking errors move the sun away from the center of the image, so the point of peak illumination moves around and does not coincide with the center of the receiver, thus requiring the field of view of the receiver to extend around the nominal position of the sun and resulting in an image that is even darker in its periphery.

These effects create a large variance in the electricity production level of the cells, and so result in stringing losses. It is not uncommon for a receiver that uses 40% efficient PV cells to provide only 25% efficiency at the system level.

Other Art

Many solar system designs have been proposed and implemented over the years. The challenge in them is not simply to make electricity from solar light, but to do so in a way that has acceptable cost, construction time, efficiency, longevity, and environmental impact.

Other PV dish systems were developed by companies such as Solar Systems of Australia and Zenith Solar of Israel.

Other Thermal dish-based systems were developed commercially by companies such as Stirling Energy Systems of AZ, Infinia Corporation of WA, and Southwest Solar of AZ, and HeliFocus of Israel.

There have been many designs proposed for improving on the truss based design, ranging from flexible structures (e.g. U.S. Pat. No. 4,056,309) to inflatable structures (e.g. U.S. Pat. No. 4,432,342) and even vacuum-pulled membranes (e.g. U.S. Pat. No. 4,352,112). Commercial companies that design dishes include Schlaich Bergermann Solar of Germany.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

The invention described herein is a dish-based solar power generation system that has several novel features whose utility is to reduce or eliminate the problems outlined above. While each of these features provides independent benefits and can be utilized alone or in combination with other features to enhance prior art systems, they can be made to work in concert with each other to provide a complete system, and so they are described jointly in this specification.

The primary reflector structure is based on a unique spoke-wheel-like tensile carrier structure that is very lightweight, has a low moment of inertia, high strength and stiffness, and allows for rapid field alignment during assembly. Reflector tiles are mounted to it to create the complete primary reflector.

In various embodiments of this invention, opposite to the way customary dishes are built, it is the carrier structure that is the entity aligned to form, and the reflector tiles are fixed to it in a non-adjustable way. A very important feature of this structure is that the alignment procedure is based on its geometry and does not rely on its optics, which allows the creation of any revolved optical shape, not just a paraboloid. The structure is named the Alignable Carrier Structure, or ACS.

Additionally, in embodiments of this invention the primary structure has a central rigid hub which is concentric to the axis of revolution and supports the functioning of several other system components. Like a bicycle wheel, the structure has adjustable tensioners between the spokes and the rim, but in this invention the tensioners are implemented in a kinematic way to enhance precision. The rim is comprised of many individual straight segments, and each tensioner has four lines of force (two spokes and two rim segments) that cross each other at a single point.

According to embodiments of the invention, the reflectors that complete the dish structure, which in this application are called reflector tiles or panels, are constructed using a unique method based on a special vacuum-formed core that yields very rigid and lightweight bodies, which can have any arbitrary continuous optical shape. The reflector tiles can use any thin reflector material as their front surface.

According to embodiments of the invention, the reflector structure and reflector panels work in concert to achieve several other advantages. The tiles attach to the primary structure from the back side, which allows them to be replaced without interference with the rest of the dish, without placing people inside the optical path, and without requiring subsequent re-alignment.

Additionally, according to embodiments of the invention, the primary structure determines the position of the front surface of the tiles which enhances the precision of the formed surface. The composite front surface created is continuous, and so allows for collection of the water used while washing the mirror. The central hub is used to support a built-in rotating washing arm so that the washing process is autonomous.

Being rigid and coaxial to the optical axis, the front side of the hub may also be used as the anchor point for a kinematic hexapod used to position the secondary optic or PCU. At the front end of the hexapod a precision mechanical mount (called "the fiduciary") may be attached and may be used to co-locate the PCU, a laser guide used to guide and test the alignment of the primary reflector, and an optical tracker used for solar tracking By having all three of these components attach to essentially the same mechanical interface, precision is further enhanced.

In a photovoltaic embodiment of the invention, the shape of the primary optical reflector surface is not a regular paraboloid as is customarily used, but rather a revolved shape around an axis of revolution (also sometimes called axis of rotation) with a generatrix in the shape of a parabola whose optical axis is parallel but radially offset from the axis of revolution. In this application, this shape is called an offset paraboloid (OP). An OP is naturally constructed with a hole in its center with a radius at least as large as the offset between the optical axis and the axis of revolution.

The offset paraboloid structure creates a novel narrow ring shaped optical form that has several advantages for a PV receiver.

In a traditional "dense array" PV dish receiver the PV cells are packed into a 2-dimensional array that is placed at the focal point. This creates differentiation between the cells near the center of the array and those near its edges, with the central cells getting more illumination and less cooling. This non-uniformity is further enhanced due to tracking inaccuracies, as the image of the dish shifts relative to the receiver. Since the cells need to subsequently be stringed into a larger electrical circuit, this non-uniformity creates a large drop in overall receiver efficiency.

Embodiments of the invention provide a ringed receiver. In the ringed receiver, all the cells are geometrically equivalent, and so receive the same amount of illumination and cooling. Additionally, since the ring is essentially a 1-dimensional array of cells, the radial dimension is free to be uses for cooling and electrical connection routing, two tasks which are very difficult in a two-dimensional array.

Since each point in the ringed receiver sees its corresponding portion of the offset paraboloid dish with a narrow field of view, a ringed secondary optical element (SOE) can be used to further increase the level of concentration and uniformity of the received light. Several such SOEs are described.

Several cooling methods are described, including using a conductive heat sink and forced air flow, using a pumped vapor-chamber and a separate condenser, and using liquid coolant.

The effect of a tracking error on the ringed receiver is always a predictable non-uniformity illumination pattern, with minimum and maximum illumination occurring on diametrically opposed points, along the direction of the tracking error (which is itself not known), and illumination varying smoothly between the minimum to maximum points. Taking advantage of this predictability, in order to reduce stringing losses, the cells are divided into several interleaved groups referred to as circuits, with each circuit having cells distributed essentially uniformly around the ring. Each circuit is wired internally in parallel so in and of itself can accommodate non-uniform illumination. However, since the interleaved circuits are affected in a similar way by this non-uniform illumination effect, the circuits can then be wired in series and only incur minimal stringing losses. The output from the individual cells of any of the circuits is also used as the sensor for providing feedback to the closed-loop tracking system.

The features just described work in concert to eliminate the problems outlined in the background portion of this specification. For example, the electrical interleaving and cooling method are benefited by the ring geometry of the receiver, which is itself benefited by a practical non-paraboloid dish, which is itself benefited by a non-optical alignment method.

Some of the design features outlined above have utility outside the scope of a ring-optics photovoltaic dish system. For example, the ACS in combination with the reflector tiles can create any optics of revolution, including a traditional parabolic dish, and thus can be used with other PCU technologies such as thermal PCUs. The reflector tile technology by itself can create reflective optical bodies for other geometries such as for parabolic troughs or rigid heliostats. The ACS can be used for any lightweight approximately round reflector such as a stretched membrane heliostat reflector, or even for non-reflective surface such as thin film solar panels.

In addition, the ACS is useful when constructing a non-optical receiver or transmitter such as a direction RF antenna, where the reflective surfaces reflect longer wavelength EM radiation, often not for the purpose of producing power but for signal communication.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1: Prior art—Traditional solar thermal dish with payload boom

FIG. 2: Prior art—Schematic of a Stirling engine

FIG. 3: Prior art—Traditional photovoltaic dish receiver

FIG. 5: Prior art—Tensile torque bearing spoked bicycle wheel

FIG. 17: Reflector tile—Core and fabrication according to an embodiment of the invention FIG. 18: Reflector tile—Structure and fastening according to an embodiment of the invention FIG. 21: Reflector tile—Sheet metal core according to an embodiment of the invention

DETAILED DESCRIPTION

System Level and Optical Path

Figure 4A:
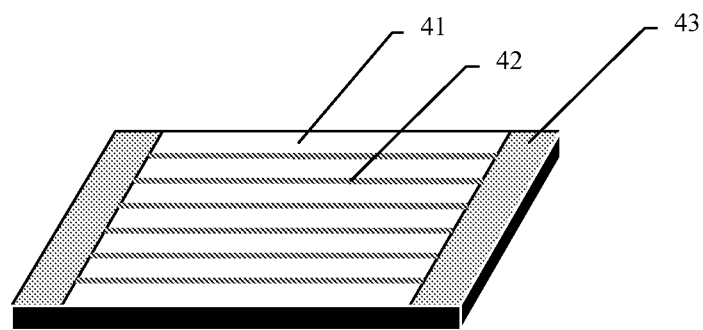
FIG. 4: Prior art—Dense array photovoltaic receiver and cell
Figure 4B:
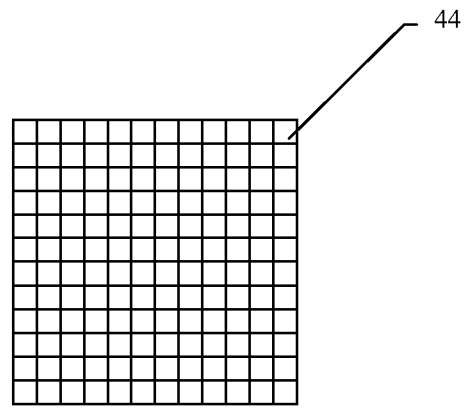
Figure 6:
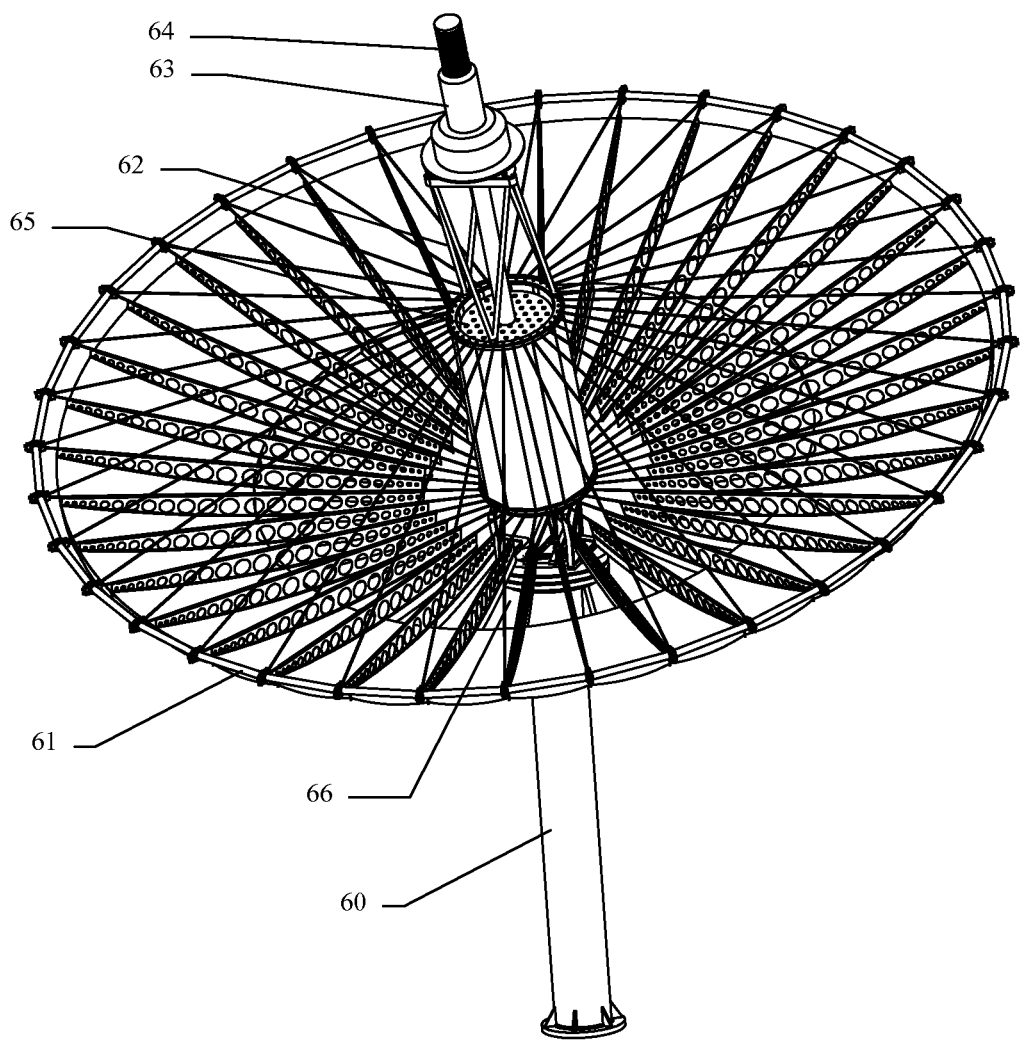
FIG. 6: System overview—Dish system with solar thermal receiver according to an embodiment of the invention

FIG. 6 shows an embodiment of this invention using a solar thermal PCU. The system is comprised of a pedestal [60], pivot actuation machinery [66] at the top of the pedestal, a dish reflector [61], a hexapod mount [62], a thermal PCU [63] having a hot end [64], and a heat exchanger [65]. In this embodiment the hot end is shown surrounded by heat absorbing coils in which the thermodynamic fluid flows, but in other embodiments the heat can be transferred directly through the wall of the hot end.

Note that in this embodiment the thermal engine is oriented so that its hot end is away from the dish (opposite to the conventional mounting scheme), and the light illuminates its entire perimeter, transferring heat inwards. The structure of the dish is discussed further below under the sections "Alignable Carrier Structure" (ACS) and "Reflective Tiles", and the placement and structure of the Thermal PCU is discussed under the section "Thermal PCU"

The role of the pedestal [60] and actuation machinery [66] is to ensure that the dish reflector [61] is correctly pointing into the sun and tracking it. The role of the dish reflector [61] is to concentrate the solar light towards its focal point. The role of the hexapod [62] is to position the hot end [64] of the PCU [63] at the focal point. The role of the PCU [63] is to convert the light into electricity. The role of the heat exchanger [65] is to cool the cold end of the PCU [63] by exchanging heat with the environment. These roles are largely the same as in a traditional dish-based system.

Figure 7:
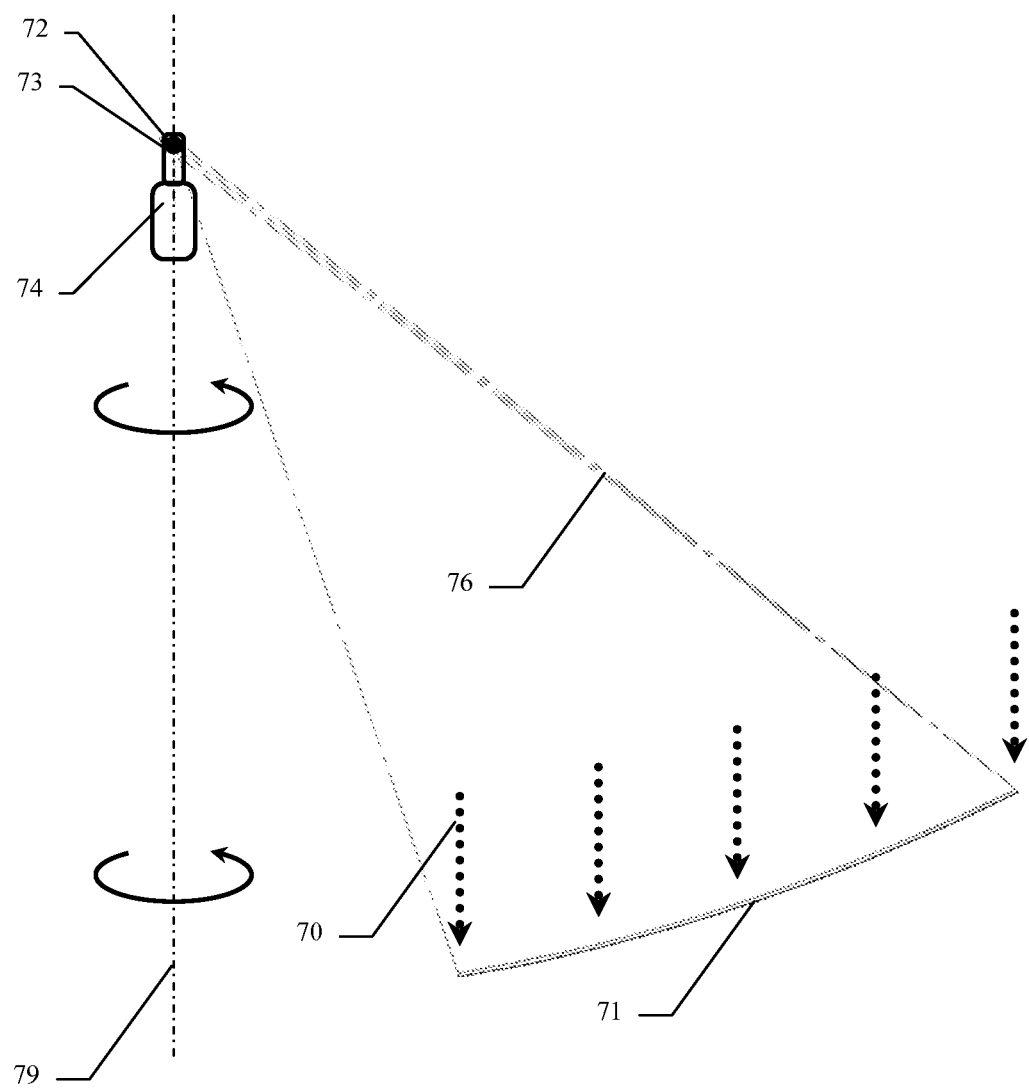
FIG. 7: System overview—Dish system with solar thermal receiver optical path according to an embodiment of the invention

FIG. 7 shows the optical path of this embodiment in a meridian cross-section. (one that passes through the center axis of revolution [79]). At each such cross-section, incoming solar light [70] is reflected off of the primary reflector parabolic arc [71] and focused into a focal point [72] which lies on the optical axis of the arc. Since in a paraboloid the optical axis of the generatrix parabolic arc and the center axis of revolution are one and the same, the focal points of all the arcs in the revolved shape coincide and become the single focal point of the paraboloid. The focal point lies inside the hot end [73] of the thermal engine [74]. Roughly speaking, the acceptance full-angle [76] of the system is equal to the length of the hot end [73] of the engine [74] divided by the mean distance from it to the parabolic arc [71]. The heat engine was labeled as [63] in FIG. 6

Figure 8:
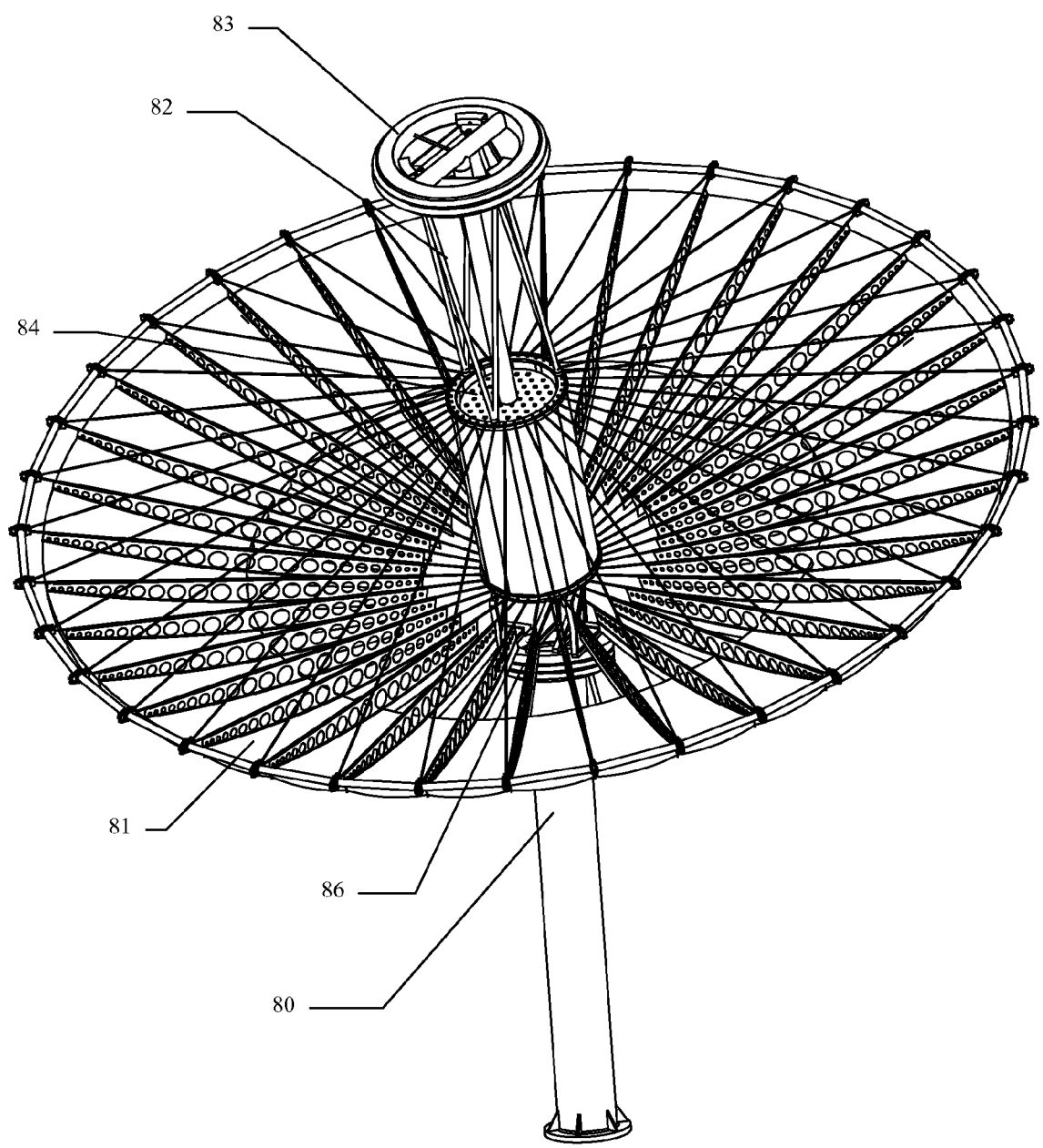
FIG. 8: System overview—Offset paraboloid with ring photovoltaic receiver according to an embodiment of the invention

FIG. 8 shows an embodiment of this invention using a photovoltaic PCU. The system is comprised of a pedestal

[80], pivot actuation machinery [86] at the top of the pedestal, a reflector dish [81], a hexapod mount [82], a photovoltaic PCU [83], and a heat exchanger [84]. The structure of the dish is discussed further below under the sections "Alignable Carrier Structure" (ACS) and "Reflective Tiles". The placement and structure of the PV PCU is discussed under the section "PV PCU".

The role of the pedestal [80] and actuation machinery [86] is to ensure that the dish reflector [81] is correctly pointing into the sun and tracking it, the role of the dish reflector [81] is to concentrate the solar light towards the PCU [83]. The role of the hexapod [82] is to position the PCU [83] correctly in relation to the dish reflector [81], and the role of the PCU [83] is to convert the light into electricity. These roles are the same as in a traditional dish-based system.

In this embodiment of the invention, the shape of the primary optical reflector [81] surface is not a regular paraboloid as is customarily used, but rather a revolved shape with a generatrix in the shape of a parabola whose optical axis is parallel but offset in the radial direction from the axis of revolution of the dish. In this application, this shape is called an offset paraboloid and abbreviated as OP.

Figure 9:
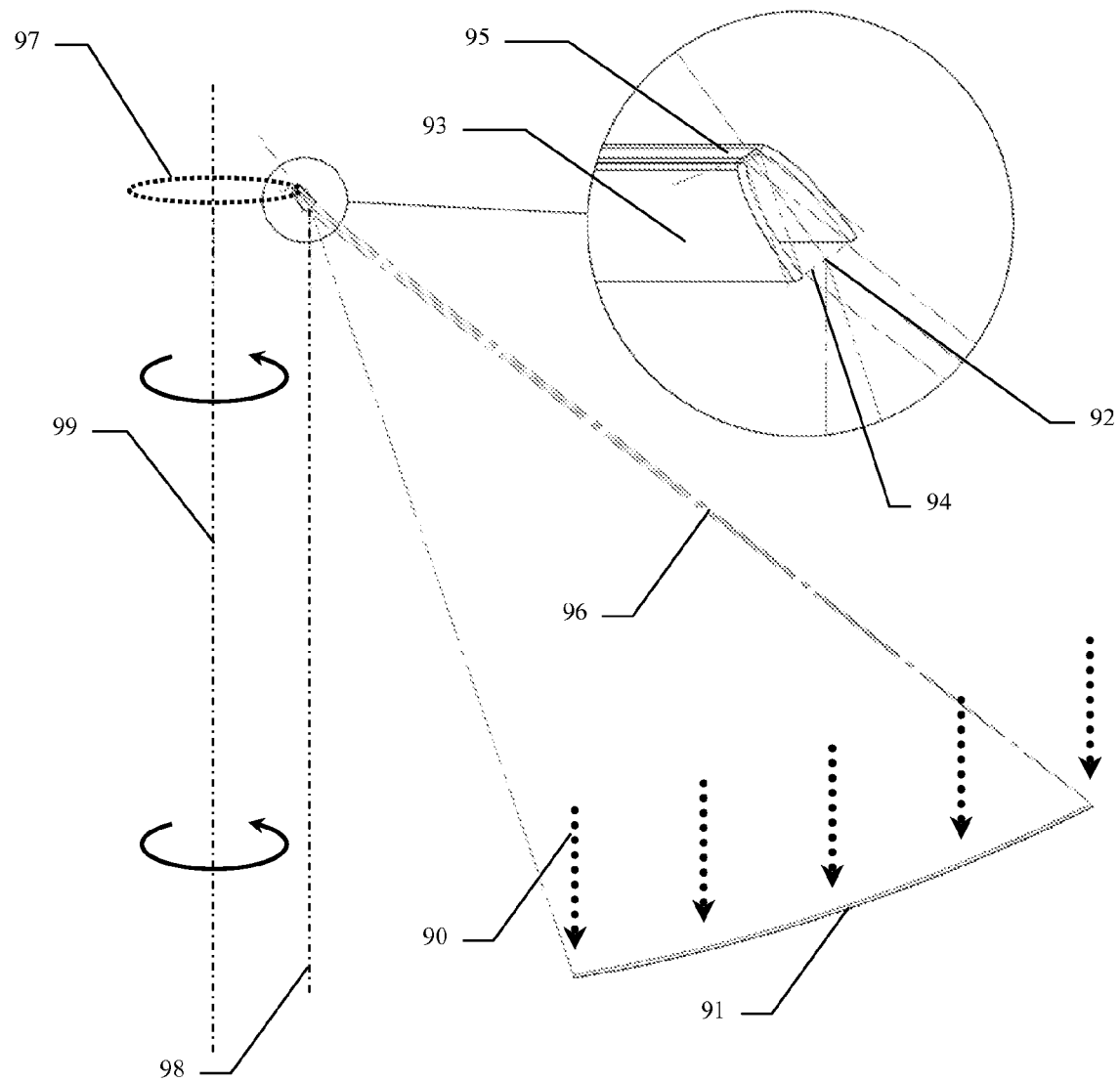
FIG. 9: System overview—Offset paraboloid with ring PV receiver optical path according to an embodiment of the invention

FIG. 9 shows the optical path of this embodiment, in a meridian cross-section, showing the axis of revolution [99] of the dish [81]. At each such cross-section, incoming solar light [90] is reflected off of the primary reflector parabolic arc [91] and focused into a focal point [92] which lies on the optical axis [98] of the arc. Thus, light reflected from the complete revolved dish [81] is focused into a ring [97], rather than into a single focal point. A secondary optical element [93] (SOE) has a cross section that is also revolved around the axis of revolution [99] of the dish [81] and has an aperture [94] that encompasses the focal ring [97], further concentrating the light and homogenizing it before directing it to the PV cells [95] that are appropriately arranged in their own ring shape. Thus, light reflected from dish [81] is concentrated onto the ring of PV cells [95]. The surfaces of the SOE [93] as well as the active PV surface of the cells [95] are also surfaces of revolution or close approximation thereof. Roughly speaking, the acceptance full-angle [96] of the system is equal to the width of the aperture [94] of the SOE [93] divided by the mean distance from it to the parabolic arc.

It is important to note that unlike in a paraboloid dish where the individual focal points of each parabolic arc in a meridian plane coincide into a unique focal point of the entire paraboloid, in an OP the individual focal points do not coincide but rather form a ring. In this embodiment, the ringed shape of the PV PCU [83] matches the ringed focal shape of the focal region of the OP dish [81].

In the conventional paraboloid optical path shown in FIG. 7 all of the focal points coincide, and the optical path is called "imaging", which means that for a non-point light source such as the sun, the light forms an image of the sun around the focal point. So for example if the sun has a sun spot or is partially obscured by a passing airplane or cloud, there will be a drop in intensity in the corresponding spot in the image. This property is detrimental for photovoltaic receivers since it only affects some of their cells, resulting in stringing losses as described above. The concentration level achieved by the conventional paraboloid dish is equal to the square of the concentration achieved by the parabolic arc of the concentrator. Thus if in a meridian cross section the parabolic arc achieves a concentration factor of 30, then the paraboloid dish will achieve a concentration factor of $30^2=900$.

In contrast, the offset paraboloid (OP) optical path described in FIG. 9, the focal points of the parabolic arcs do not coincide but rather form a ring. This means that if the sun is similarly partially obscured, the corresponding localized drop in intensity is repeated an infinite number of times around the ring, and so is naturally "smeared" across the entire receiver. This is highly advantageous for a photovoltaic receiver. In addition the concentration achieved by the OP dish is comprised of three factors: The concentration achieved by the parabolic arc in the meridian plane, the added concentration achieved by the secondary optical element, also in the meridian plane, and finally the "radial squeezing" concentration that results from the fact that the circumference of the receiver ring is significantly smaller than the mean circumference of the OP dish. For example, if the if the parabolic arc achieves a concentration factor of 30, and the SOE achieves a concentration factor of 3, and the radial squeeze concentration factor is 9, the total concentration of the OP dish is $30\times3\times9=810$. It is possible to trade off these concentration levels. For example, if the SOE is eliminated completely, but the diameter of the receiver ring is reduced by a factor of 3 thus increasing the radial squeeze concentration factor from 9 to 27, then the total concentration of the SOE-less OP dish remains the same as $30\times1\times27=810$. The SOE has other advantages such as further homogenization of the light but in general the optical design can be tweaked by using less aggressive or even completely eliminating the SOE.

In both types of dishes described above, the focal length of the parabolic arc in the generatrix plays an important role, since it determines the length of the physical structure that positions the PCU there. The focal distance is often stated as a multiple of the dish diameter, known as the focal ratio (f/d). Commonly used focal ratios in parabolic dishes are between 0.5 and 1.5 of the diameter of the dish. Longer focal lengths make it difficult to maintain the position of the PCU accurately. In addition, longer focal lengths mean that the image of the sun has more distance to diverge, and so the level of possible concentration drops. Shorter focal lengths mean that the PCU sees the dish with a wider apparent angle, and so is illuminated over a large arc of itself. Additionally, short focal length dishes have more steeply inclined surfaces, and are so less efficient in their use of reflector material. Thus an f/D ratio of 0.5 to 1.5 is a good design choice for dish systems. For non-round or polygonal rims, the mean diameter, or the perimeter/pi, is used as an approximation for a true diameter.

In heliostats applications (discussed later) the PCU resides on a separate immobile structure and is shared by many reflectors. In such applications, larger f/D ratio, typically over 5, are used, and the reflectors are very close to being flat. Since the direction of illumination in Heliostat systems varies throughout the day, and since the desired concave shape is so close to flat, the precise shape of the reflector is less important and the concavity is often stated as the ratio of the depth of the mirror surface to its diameter, typically no more than a few cm per m.

As described further below, these components work in concert to eliminate or reduce all of the problems that plague state-of-the-art photovoltaic dish reflectors systems, as enumerated in the background section of this specification. Some of these components have further utility for other types of dish systems, and for other types of solar systems.

[Nomenclature]

When describing geometries of revolution, there is always a unique axis of revolution, and any plane that contains the axis of revolution is referred to as a "meridian plane", and the two principal directions of the plane are the axial and radial directions. The local circumferential direction is perpendicular to a meridian plane. The shape in a meridian plane that creates the geometry of revolution is called a generatrix. A surface is considered to be a surface of revolution even if it is only partial to a complete surface or revolution spanning a complete revolution of the generatrix about the axis of revolution.

A paraboloid is a surface of revolution created by a generatrix whose shape is a parabolic arc whose axis coincides with the axis of revolution.

In this specification, an offset paraboloid (OP) is the surface of revolution created from a generatrix whose shape is a parabolic arc [91] whose optical axis [98] is parallel to and offset radially from the axis of revolution [99]. For example, in the embodiment shown in FIG. 8 and whose meridian plane description is shown in FIG. 9, the optical surface of the dish reflector [81] is an OP, and the aperture [92] of the PCU is a conical ring whose radius is approximately equal to the offset of the axis of the generatrix of the OP. The optical axis of the entire revolved dish is the axis of revolution.

The angle of acceptance in solar systems is the angle by which light rays can deviate from the nominal direction (parallel to the optical axis of the dish) and still be directed into the aperture of the PCU. In this application the "full angle" is used, which is the angle between the two most extreme light rays that still get directed into the aperture. (as opposed to the "half angle", which is the angle between the nominal ray and an extreme ray. Depending on the symmetricity of the optical path, the full angle value is typically twice that of the half angle value.

In this specification, when describing portions of the system, the direction towards the sunlight is labeled "front", with associated descriptors such as "in front". Similarly, the opposite direction is labeled "back". Note that inside the solar receiver, which is typically mounted facing towards the primary reflector, the "front" end is the one closer to the primary reflector.

In this application, the term Photovoltaic (abbreviated PV) device refers to any device that converts light into electricity directly without relying on first converting the light into heat. The prevalent photovoltaic technologies today belong to the group of semiconductor band-gap materials, but other direct conversion methods such as optical rectennas or advanced quantum phenomena such as quantum dots are also considered as photovoltaic in this application. These technologies stand in contrast to thermodynamic technologies that use solar light to heat up a working medium, and then generate power from this heat without reliance on the source of the heat. Some proposed photovoltaic technologies operate at elevated temperatures, but they do not make use of that temperature to produce power, since simply heating them up without exposing them to light will not create any power.

In this application the term power conversion unit (PCU) refers to the device that converts solar light into electricity. A PCU can be photovoltaic, thermal, or employ a yet-unclassified technology.

In this application, the term UTS is used in its common capacity to denote Ultimate Tensile Strength for a material, measured in units of stress, equivalent to units of pressure.

[Alignable Carrier Substructure]

The alignable carrier structure (ACS) replaces the carrier truss in conventional dishes. It differs from a conventional truss in several ways. First and foremost, unlike a conventional truss which is of a fixed shape, the ACS is an adjustable structure, designed to be assembled first, and then tweaked into shape. Second, rather than being built entirely from rigid members like a conventional truss, the ACS mimics the structure of a tensile spoked bicycle wheel, where the radial load carrying members (the spokes) are slender and flexible (bendable) and only loaded in tension. This is achieved by preloading them in tension to a sufficient degree—to a tension higher than the maximum compressive load they would have otherwise experienced. This way, when an external load is applied, the pretension decreases and compressive forces never occur.

Bicycle wheels can be either free-spinning, in which case the centerlines of the spokes intersect the centerline of the wheel, or torque-carrying, in which case the centerlines of the spokes are tangent to a small circle around the centerline of the wheel and so do not intersect it. Non-torque-bearing spoke geometry are sometimes referred to as radial spokes, and do not have spokes crossing each other. Since the torque loads in the plane of the dish are negligible, in some of the embodiments described herein the spokes may be radial. A spoked bicycle wheel is depicted in FIG. 5, showing the hub [50], rim [51], and spokes [52]. At the connection between the spokes and rim are adjustable tensioners [53]. This image is of a torque carrying (non-radial) wheel.

Figure 10:
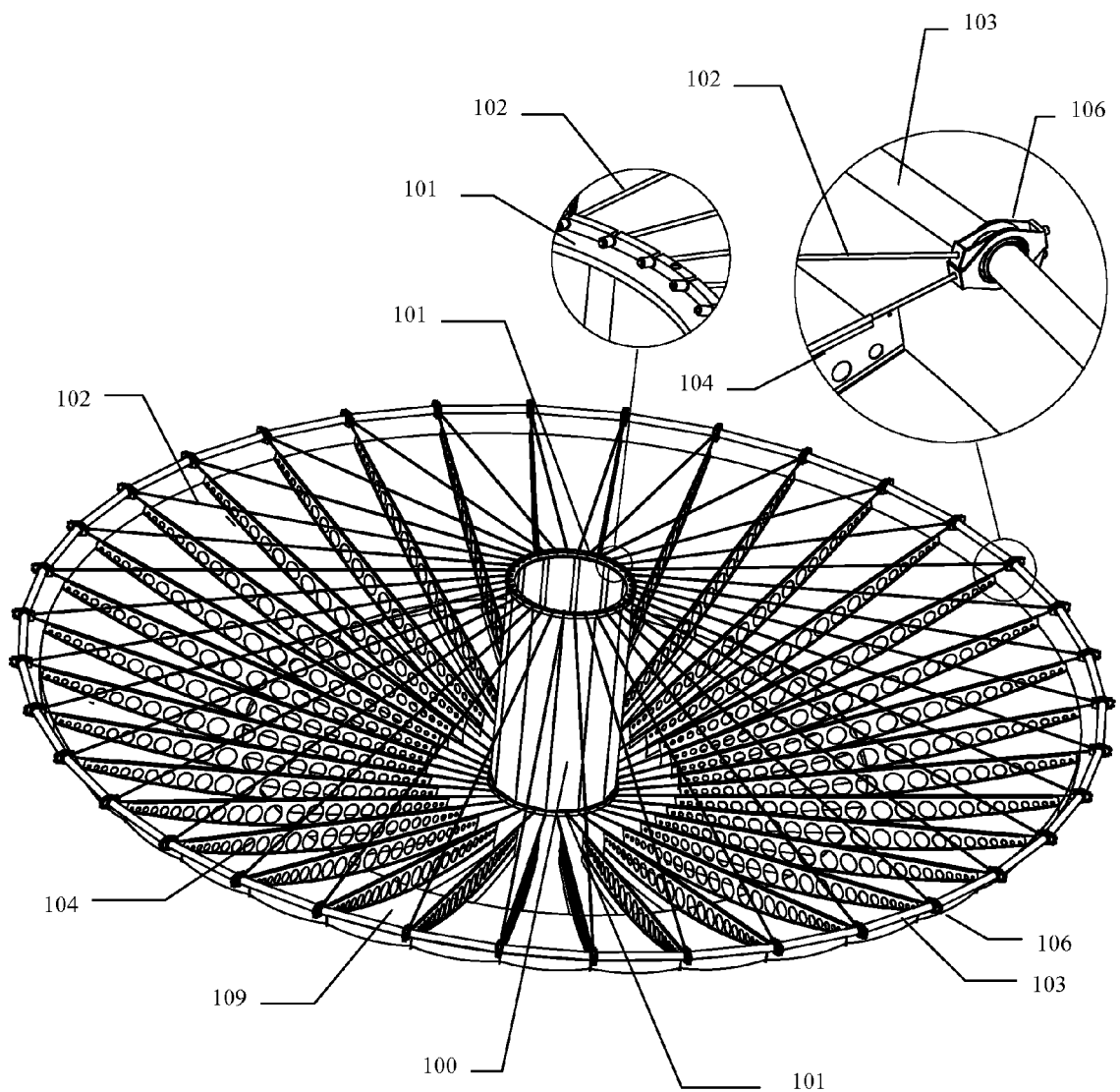
FIG. 10: Carrier—Tensile spoked wheel carrier structure according to an embodiment of the invention

FIG. 10 shows an embodiment of the ACS. A central hub has a barrel section and two crowns [101]. The crowns [101] are used to anchor thirty-six pairs of spokes [102] which connect to a rim at thirty-six coupling nodes [106]. In this embodiment the rim is not made of a single ring but is rather composed of thirty-six straight rim segments [103], thereby making it easier to transport and assemble. The tensioner nodes [106] are located at each intersection of two spokes [102] and two rim segments [103], and can adjust the effective length of each of their spokes [102]. Ribs [107] are provided on the back spokes [102] and include reflector guides, as will be described more fully below. In this embodiment the coupling node serves as a tensioning device as explained below, but in other embodiments the tensioning can also occur from the hub, as also detailed below. Also shown are reflector tiles [109] though they are not part of the ACS and will be described later.

The embodiment of the ACS shown in FIG. 10 differs from a bicycle wheel in several ways. First the rim is not a continuous circle but made out individual straight segments. This is an improvement from a structural point of view since the rim is loaded in compression and straight segments are more resilient against buckling than curved segments. It is an improvement from a logistical point of view since the straight segments are easier to transport than a single monolithic rim hoop. Second, the tensioner nodes contain two spokes and two tensioners each, as opposed to a standard bicycle wheel where each tensioner node has only one spoke and one tensioner. This arrangement eliminates out-of-plane forces on the rim as are present in a traditional bicycle wheel.

The amount of tension preload (pretension) applied to the spokes is calculated so that when the external load is at its maximum value, all of the spokes remain in tension. This can be seen by considering a single spoke pair. It the tensioning node is pushed backwards in the axial direction, the tensile load on the front spoke increases, while the tensile load on the back spoke decreases. If it is not pretensioned enough, the tensile load on it will decrease past zero and become a compression load, at which point the spoke will buckle since it is too slender to resists compressive loads. Since the most significant source of external loads is wind, and the direction of the wind is not predictable, this can affect both front or back spokes, and so each of them has to be pretensioned to the value load induced on the spoke by the maximum predicted wind in its most unfavorable direction to that spoke. However, when the wind is blowing in the opposite direction, the tensile load on the spoke will equal the sum of the pretension and the wind-induced load, thus equaling to twice the pretension. Thus the UTS of the spoke must be at least equal to twice the pretension load. It is not necessary, however, to preload the spokes all the way to 50% of the UTS, since the designing engineer will typically leave a design margin below the UTS, and also because other considerations (such as stiffness) can drive towards a spoke that has a much higher UTS than the design requires. Even a 10% UTS preload is sufficient to create a tensile structure that can resist significant load, and a 33% UTS preload will leave 33% margin on UTS in the worst-case external load situation, which is a reasonable margin to prevent low-cycle fatigue failure of the spokes. Thus a pretension value of 25%-40% UTS is a good design range, depending on the specific properties of the spoke material.

In order to decrease the risk of fatigue related failures, in this embodiment the spokes are made of twisted multi-strand wire ropes or cables. Similarly, a weaved roped can be used, or a fiber-composite thin rod. In this specification, the term "braid" is used to include various multi-stranded tensile member structures.

Figure 11A:
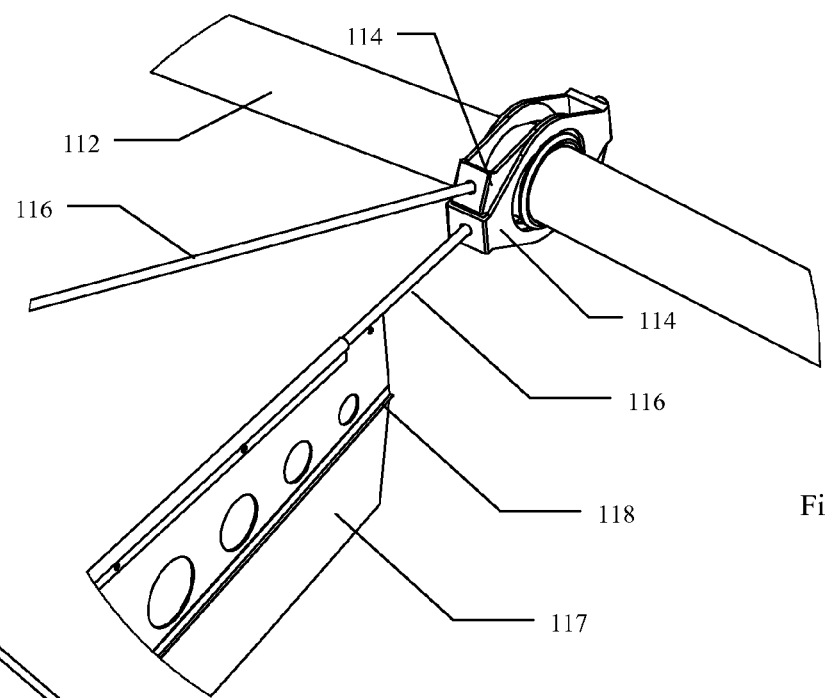
FIG. 11: Carrier—Rim and kinematic tensioner node design according to an embodiment of the invention
Figure 11B:
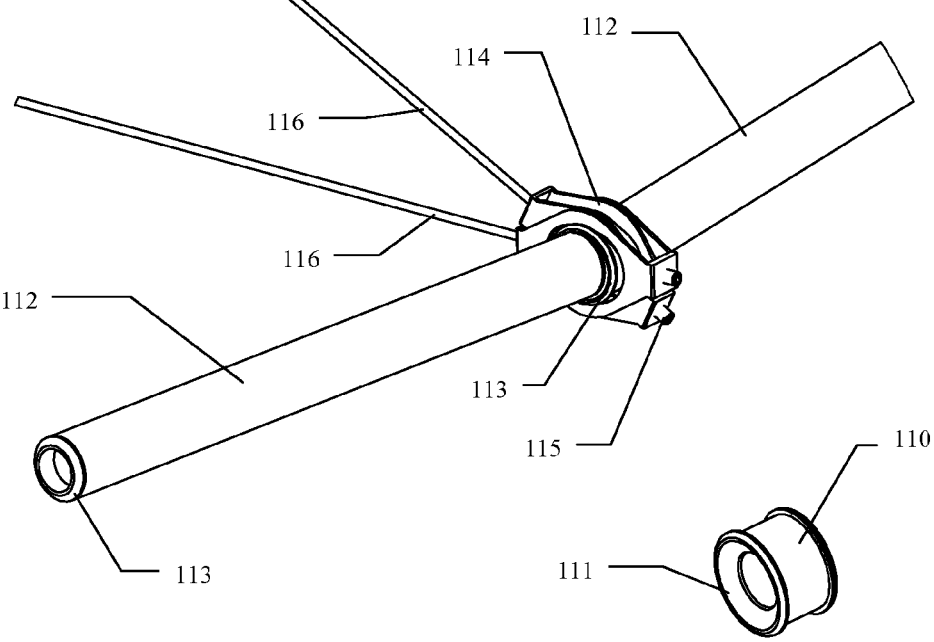
Figure 11C:
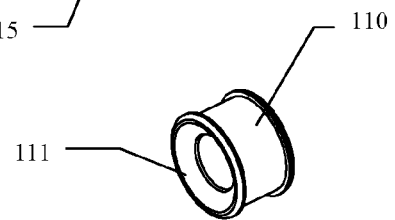

FIG. 11a-c shows the detailed composition of a tensioner node according to an embodiment of the invention. A central coupling element [110] in the shape of a short thick-walled tube has two spherical depressions [111] on its ends. The coupling element [110] is held in compression between two rim segments in the form of tubes [112], each of which has spherical protrusions [113] at its ends, thus forming two ball-and-socket compression joints. Two tensioner links [114] are free to rotate around the coupling element [110], and each of them pushes against it with an adjustment screw [115]. The two links [114] are also each connected to a spoke [116]. Turning the adjustment screw [115] causes the tensioner link [114] to move in the direction of the spoke [116], pulling it inwards or outwards. The lines of force therefore intersect (to a very close degree) at the center of the coupling element [110], creating a kinematic joint. This is true even during assembly when the angles between the components are not at their nominal value, since both the rim tubes and the tensioner links can rotate to self-align to the direction of the force. In general, an assembly is kinematic if the numbers of degrees of motion equal the number of constraints. In this case since the forces meet at a single point and therefore do not exert torques, there are only three degrees of motion per tensioner node, and in the complete dish there are three times as many constraints (rim segments and spokes) as there are tensioner nodes. It is also possible to replace the direction of each of the ball-and-socket joints, so that the in the joint the ball is on the coupling element and the socket (spherical depression) is on the rim segment.

In this embodiment therefore the tensioners are used to adjust the ACS until the rim becomes circular and flat. At each tensioner node, turning the adjustment screws in opposite directions shortens one spoke and elongates the other, thus moving the tensioner node in the axial direction. Turning the adjustment screws in the same direction either elongates or shortens both spokes, moving the tensioner node in the radial direction. The alignment of the ACS is therefore a systematic procedure which can be carried out repeatedly to almost arbitrary precision—as is done in bicycle shops on a regular basis.

The resultant structure is kinematic, highly rigid, and unlike a traditional dish truss does not have lattice arms that cantilever from the center outwards—the ACS is actually most stiff and precise right at the rim. Just like a bicycle wheel, all the spokes merely pull the rim inwards, and the rim is compressed in the circumferential direction. It is the imbalance in spoke tensions that results from the application of load that provides the rigidity of the rim in respect to the hub, both for in-plane and out-of-plane forces.

As is the case with a regular bicycle wheel, the spokes [102,116] are pre-tensioned so as to never go slack, and therefore the rim segments [112] are always loaded in compression. The hub barrel [100] is compressed by the combined action of the spokes [102,116], and the hub crowns [101] work principally in tension. When the hub is used to impart torque on the dish in the tip or tilt directions, the magnitude of the forces in the individual spokes vary, but the design is such that the polarity of the load never changes (between tension and compression). These consistent loads reduce fatigue issues and allow for very efficient use of material. (For example, the spokes are slender enough that if they ever experience compression, they will buckle)

As is common in large diameter sheet metal cylindrical structures, to optimize transportation costs, the barrel can be shipped to the field in three 120° slices which can be nested for packaging and shipping and assembled together to form the a complete cylinder.

In this embodiment, the back set of spokes has stiffener ribs [104, 117] attached to them. The ribs are not cantilevered from the hub, but are merely attached to the spokes, encompass them, and serve to stiffen the spokes from bending in a radial plane. The back spokes are only visible as they emerge from the ribs at their ends, near the back crown and the tensioners.

Each back spoke is encapsulated by a rib [117] which stiffens it and contain curved guide rulers [118] welded to them that are later used to position the reflector tiles, which will be brought from the back side and pushed against it. Thus if the coupling elements [110] are brought into their correct locations in space, the guide rulers [118] establish precise radial guides for the optical surface. These continuous radial guides are much more precise than individual support points on a conventional truss.

It is important to note the dual role of the ribs. In a tensile bicycle wheel, the spokes create a very strong and rigid spatial relationship between the hub and the rim (both in and out-of-plane) but the spokes themselves can be bent by pushing on them sideways in their mid-spans. Since the load on the solar dish will be distributed, the ribs function to stiffen the spokes against such deflections. Additionally, the ribs mediate mechanically between the straight spokes and the curved guide rulers which establish the final optical shape of the dish. The guide rulers are attached to the ribs in-factory during fabrication, and so this process can be done to a very high degree of accuracy—much higher than the accuracy of field assembly.

It is also important to note that the ACS is constructed, stabilized, and aligned before the tiles are attached. Thus the hub, rim, and spokes together provide the alignable carrier structure. The ribs provide a geometrical fit between the spokes and the desired optical shape and further stiffen the structure for supporting a distributed load, and the tiles merely attach to the ribs and do not contribute in any significant manner to the strength or stiffness of the ACS in bending or translation. If the ACS has radial spokes, the tiles do contribute to stiffness against torsional motion around the optical axis, but such torsional loads are insignificant.

When the rim is aligned to shape, the guide rulers are necessarily in place and provide thirty-six arcs that are precisely located in space. In the case of a simple paraboloid dish, these arcs are parabolas whose optical axis coincides with the central axis (define as being central and perpendicular to the rim circle). In the case of an OP, the guide rulers are also parabolic arcs, but during fabrication they are attached to the ribs so that their optical axes are properly offset. Thus by controlling the shape of the guide rulers during fabrication, different dish shapes can be produced when the rim is brought into alignment.

The alignment of the dish is indifferent to which optical shape is being created by the guide rulers, and this is very important if the desired optical shape is not a simple paraboloid. Additionally, the alignment of the dish can take place before any reflector tiles are installed on the ACS. This is also important since reflector tiles can later be replaced without affecting alignment.

Figure 12:
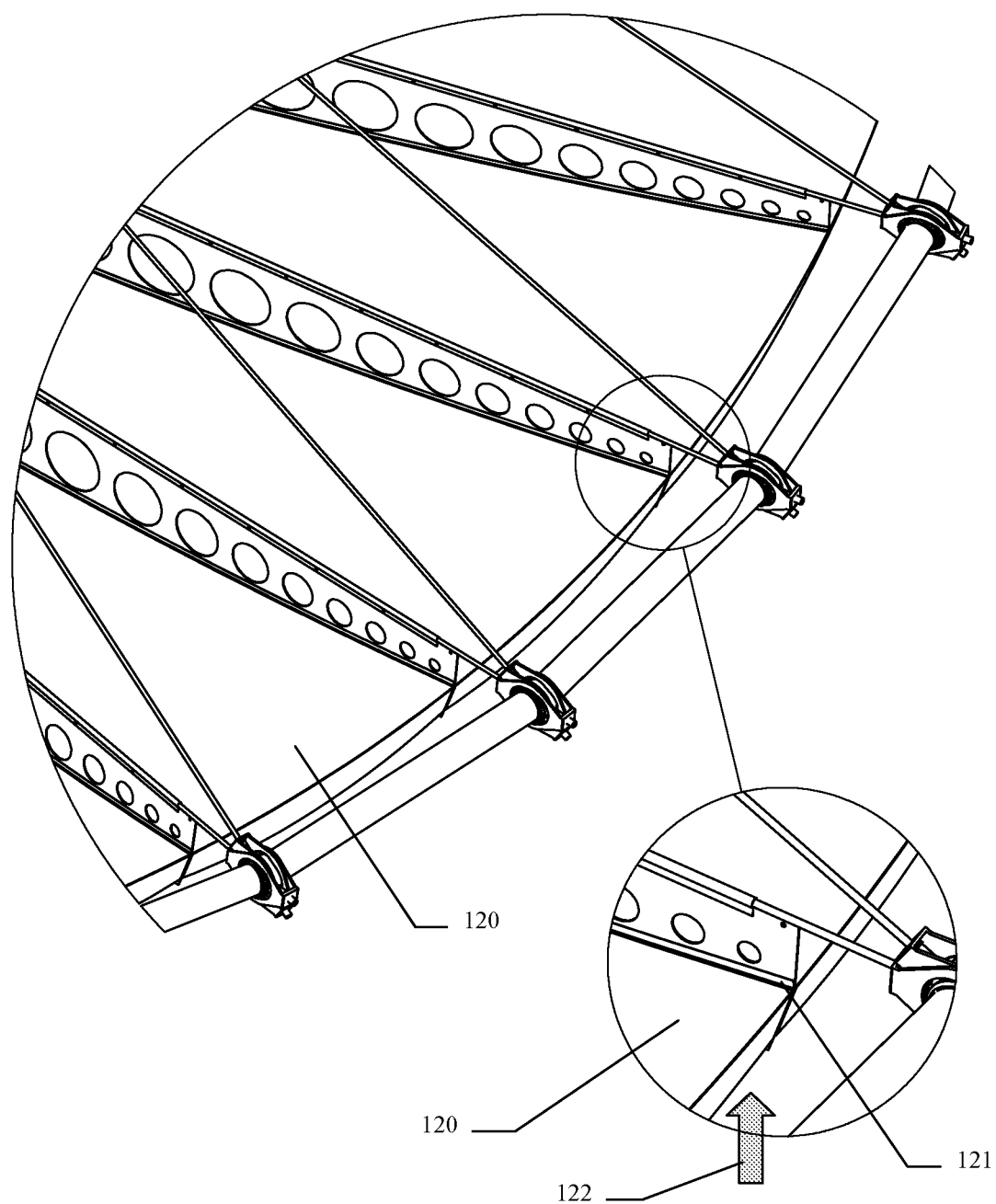
FIG. 12: Carrier—Rib, alignment guide ruler, and tile interface according to an embodiment of the invention

FIG. 12 shows how the reflector tile [120] interfaces with the rib guide ruler [121] in this embodiment. The tile is brought from the back of the dish and pushed forward [122] against the guide ruler. In this tile embodiment, this is done using spring clips shown as [188] in FIG. 18d. Since the guide rulers position the front surface of the tile, the alignment is insensitive to variations in the thickness of the tile—it is the optical surface of the tile that is brought to place.

Figure 13:
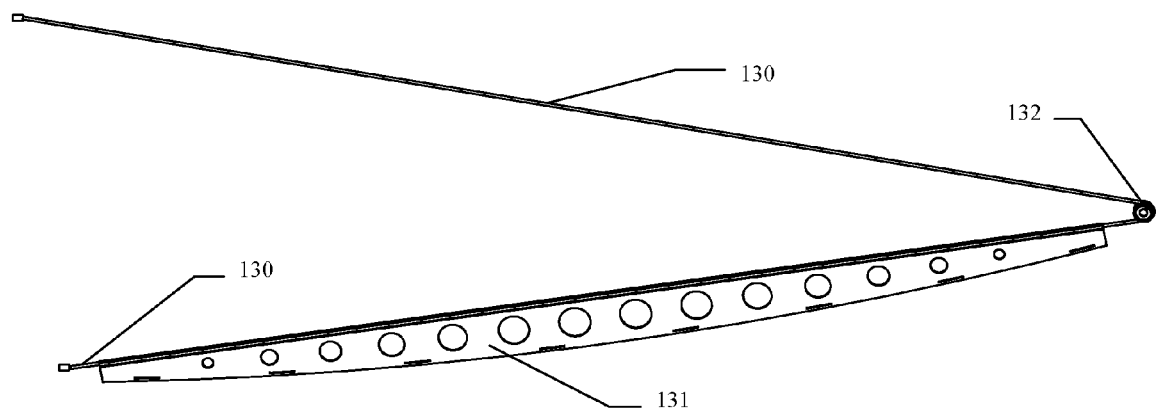
FIG. 13: Carrier—Assembly unit according to an embodiment of the invention

The ACS is assembled around its hub on its pedestal. The hub is first oriented vertically so it can spin around the vertical axis without wobbling. At that point, the subassembly shown in FIG. 13, comprised of two spokes [130], a rib [131], and a tensioner node [132] is attached to the hub, followed by a rim segment [not shown, close to perpendicular to the plane of the page], and the hub is then rotated by 10 degrees. This step is repeated thirty-six times, until the ACS is complete. During assembly, the adjustment screws on the tensioners are set for maximum spoke length, and after assembly is complete they are tightened to create the pre-tension in the spokes.

In this embodiment, the ACS is 8 m in diameter, and the 36 spokes are ¼" multi-stranded 7×19 steel cable, preloaded in tension at about 500 kgf of force. A typical hub has a diameter of about 10% of the dish diameter, and a height of about 25% of the dish diameter. Other embodiments can have different proportions, diameters, numbers of spokes, cable thicknesses, and material selections. Specifically, the number of rim segments can be reduced very significantly from the value of thirty-six. As this is done, the length of the rim segments increases, and they become more susceptible to buckling. However, even having as few as six segments is still an approximation to a round rim.

The hub of the ACS is its backbone and most rigid and dense component. The tracking actuation mechanism attaches to the back-side crown of the hub, and the front-side crown attaches to the PCU mount. The rest of the ACS structure is distributed and will not support a concentrated load at any single point. This is a positive trait that indicates that material is used efficiently.

In addition to aligning the primary reflector to shape, the ACS has to precisely locate the PCU relative to the primary. The connection between the ACS and the PCU must therefore be rigid and precise.

Figure 14:
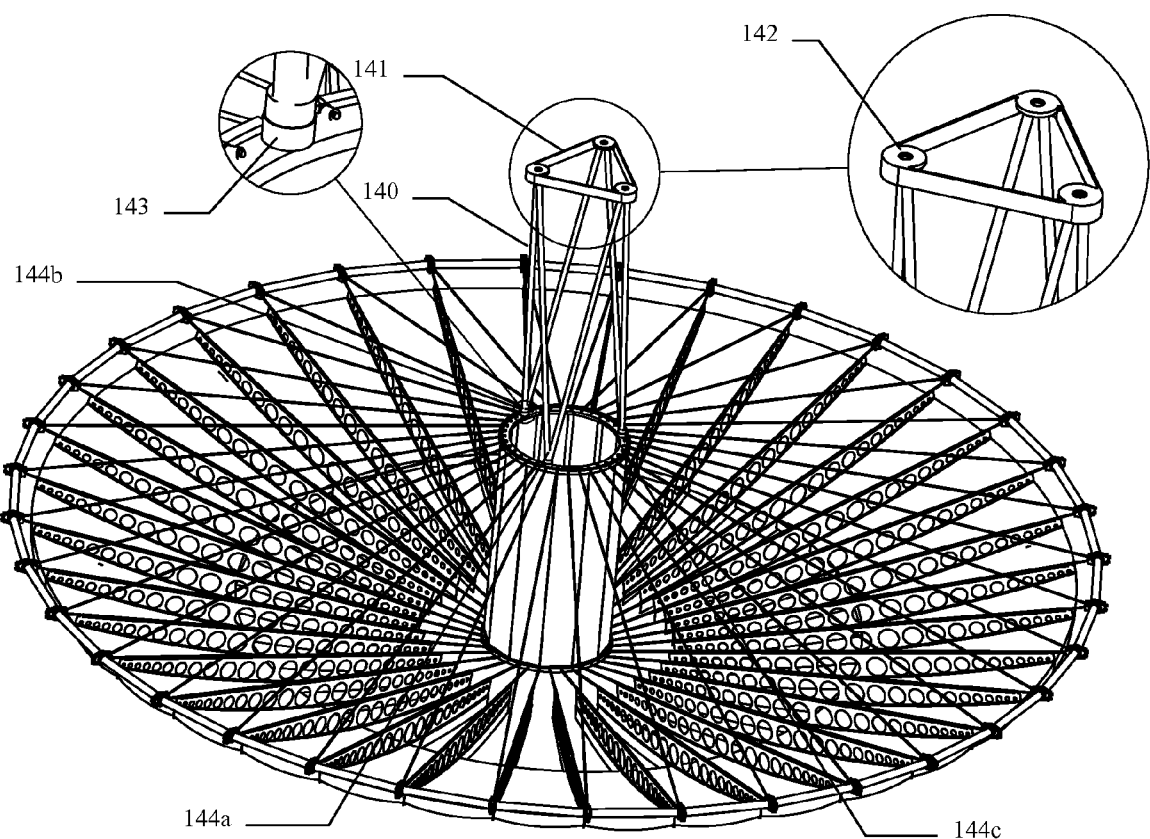
FIG. 14: Carrier—Hub design with hexapod and fiduciary plate, actuated according to an embodiment of the invention

In the embodiment shown in FIG. 14, this is achieved using a kinematic truss structure known as a hexapod. A hexapod consists of six rods, and attaches to three points on each of two bodies, kinematically constraining the six degrees of freedom that can exist between them. As shown in FIG. 14, the six rods are connected as three pairs to three anchor points 144a-144c on the back of the hexapod which is co-located with the front crown [101] of the hub [100], but each rod from these three pairs form a pairing with a rod from another pair to be pair-connected to anchor points on the front of the hexapod which is co-located with the PCU interface [141], also referred to herein as the fiduciary.

The six struts [140] connect the front hub crown to a precision mechanical interface [141] called the fiduciary which serves as the defining optical reference for the dish. In other embodiments the hexapod can be replaced by a thin walled-tube, or a thin walled tube with a perforated wall surface for weight reduction. As described later, the hexapod can be actively tilted to perform a tracking function using liner actuators [143].

The fiduciary is a kinematic coupling. Kinematic couplings are used to connect two objects in a way that a) relieves any stresses due to thermal expansion or misalignments and b) allows them to be disassembled from each other and then reassembled in a highly repeatable way, so each reassembly results in the same spatial relationship between the objects. The kinematic coupling is later used to attach the PCU and other optical elements to the fiduciary interface [141].

This embodiment uses the kinematic coupling described in U.S. patent application Ser. No. 13/032,607, but other standard kinematic couplings such as a three-groove mount, a six-point mount, or a flat surface with locating pins can also be used.

In this embodiment, the portion of the kinematic coupling that resides on the fiduciary consists of a triplet of conical depressions [142]. Each cone serves as a seat for a fixed-size sphere that is tangent to it, and so defines a unique point at the center of this sphere. The reference plane is defined as passing through the centers of these spheres, and the reference axis is defined as being perpendicular to this plane and passing through the center of the circle defined by the centers. As per U.S. patent application Ser. No. 13/032,607, the PCU has three beads on it that match the cones.

In an embodiment that uses the standard three groove mount, the fiduciary has three spheres attached to it, and the PCU has three radial grooves that match the spheres.

In order to establish a fiduciary-based reference against which to perform the rim alignment, a rotary laser guide (RLG) is fastened to the fiduciary interface. By using the fiduciary interface for both the primary mirror (ACS) alignment guide and as the positioning mechanism for the PCU, there is no need to later align the position of the PCU to the focal point or axis of the ACS. To allow the concurrent mounting of both a PCU and an RLG, the fiduciary interface in the embodiment below contains two triplets of co-located conical depressions—an inner one [157] for the RLG, and an outer one for the PCU.

Figure 15:
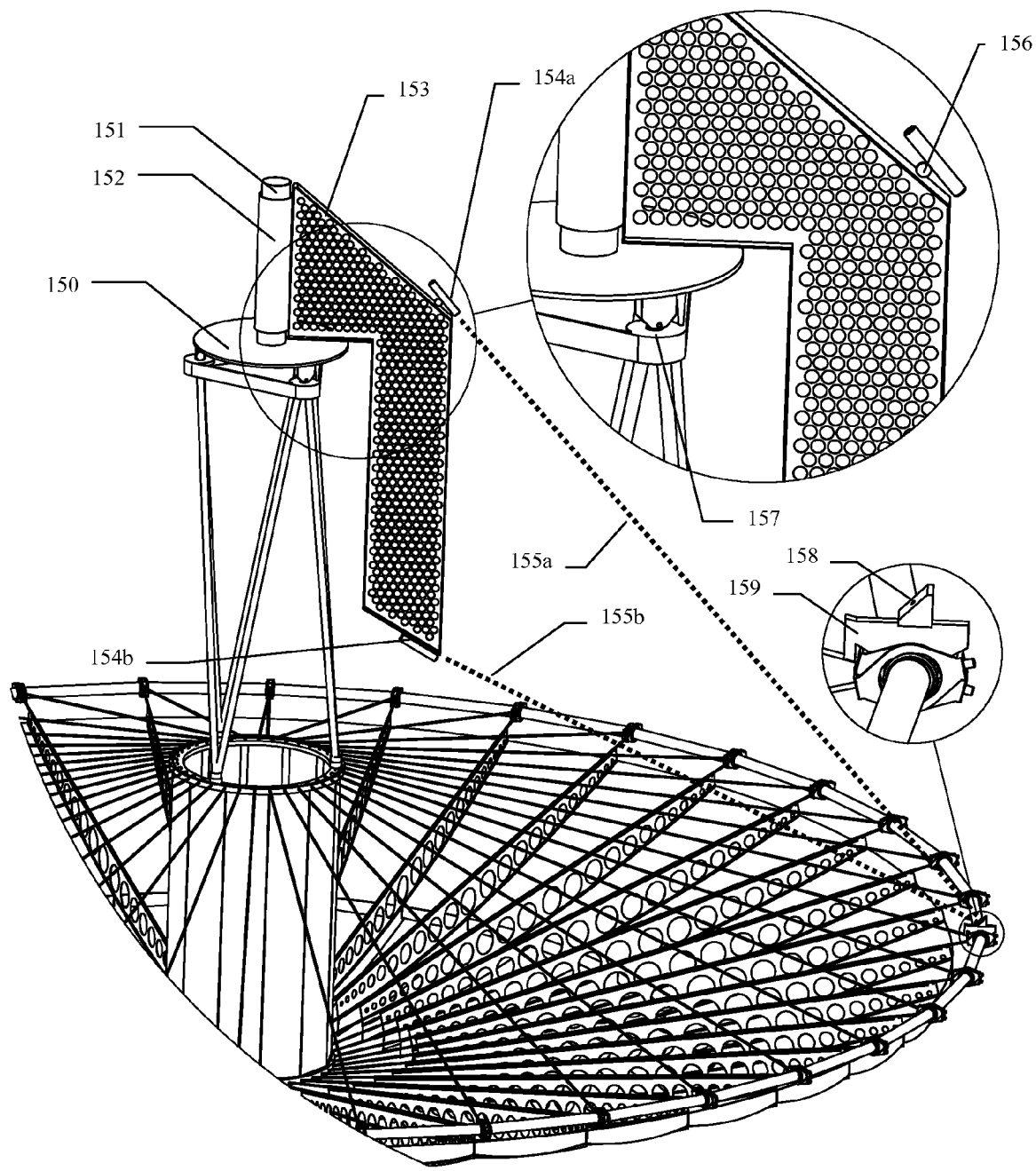
FIG. 15: Carrier—Laser alignment guide according to an embodiment of the invention

FIG. 15 shows an embodiment of the RLG which uses two intersecting laser beams that rotate around the main dish axis. This rotation describes two coaxial cones of light that intersect at a circle, which becomes the reference for the rim. A baseplate [150] is mounted to the inner fiduciary interface [157], leaving the outer one free for mounting the PCU. An inner guide tube [151] is attached to the baseplate and is perpendicular to it. A coaxial outer tube [152] encapsulates the inner tube [151] and rotates around it. A suitable bearing (not shown) may be provided between the inner and outer tubes. A rigid carrier plate [153] carried two lasers [154a, 154b], mounted through an adjustment mechanism [156] so that their beams [155a, 155b] are made to intersect at a predetermined point relative to the fiduciary. In this embodiment, many holes are drilled in the carrier plate [153] so as to reduce its weight. As the outer tube [152] rotates, the point of intersection describes a circle to which the rim is subsequently aligned. It is beneficial to have the two laser beams be of different colors.

In this embodiment the fiduciary has two kinematic couplings and thus two triplets of cones—an inner one and an outer one—with the alignment guide attached to the inner triplet, leaving the outer one for the PCU, so the alignment guide can be mounted even when the PCU (described later) is in place.

An integral or temporary laser target [159] is placed on each tensioner node as it is being adjusted. The target rests on the center-body of the ACS and on the front spoke, so its position and attitude relative to the rim is fully constrained. An aiming zone [158] is marked on the target. During adjustment, the operator turns the adjustment screws of the tensioner so as to bring both laser beams into the aiming zone.

Figure 16:
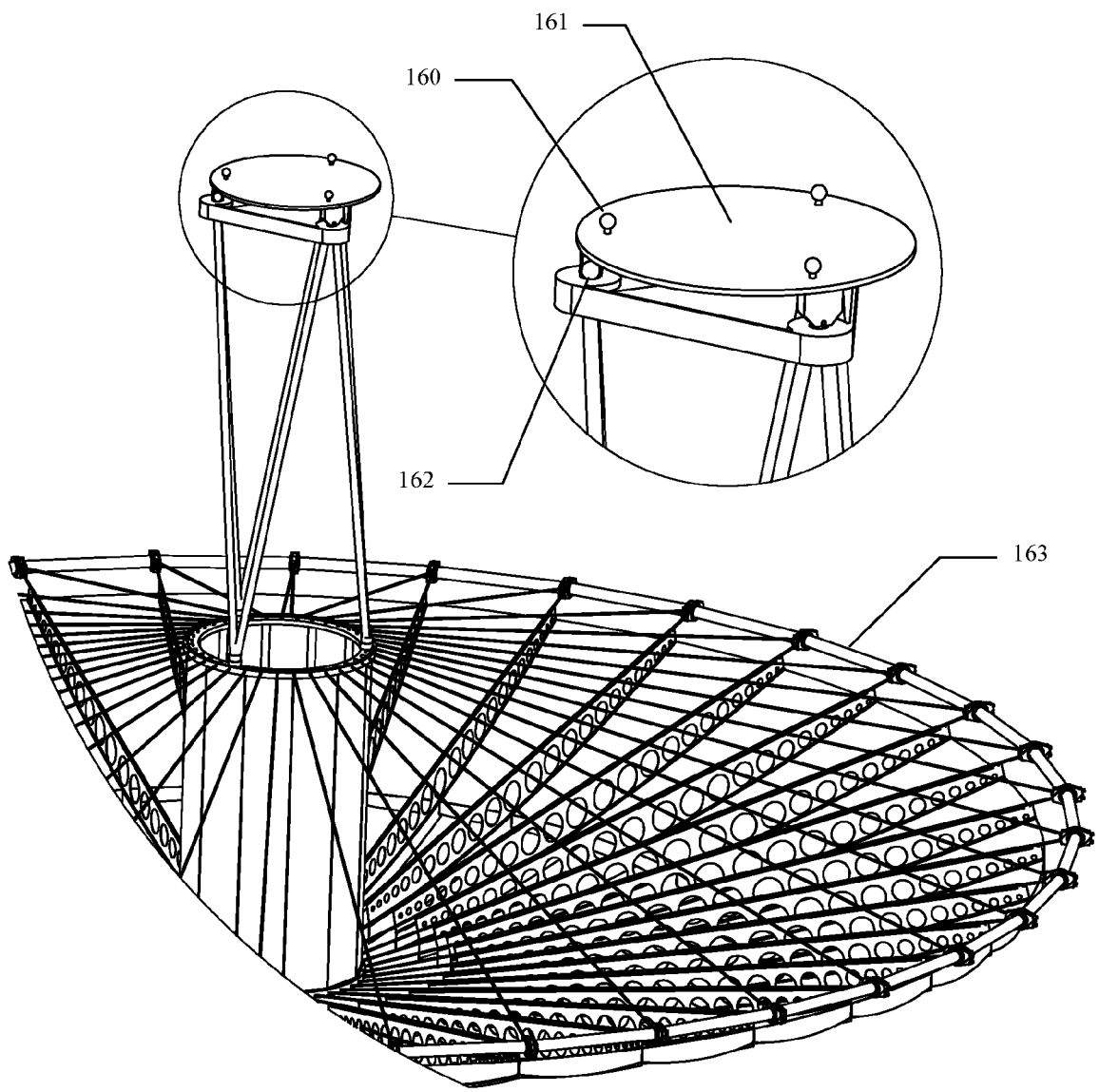
FIG. 16: Carrier—Fiduciary reference plate with three spheres according to an embodiment of the invention

FIG. 16 shows another embodiment, in which three tooling balls [160] are placed on a reference plate [161] that attaches to fiduciary interface [162]. The distance between the balls is pre-known and they define a reference axis in the same way that the fiduciary interface does. The alignment of the dish relative to the balls is ascertained either using a laser radar (such as Nikon model MV224) or photogrammetry techniques, using the edges of the rim tubes [163] as the defining features of the inspected geometry. The tooling balls can be made a permanent feature of the fiduciary plate itself, situated permanently in the inner set of conical depressions.

In another embodiment, alignment is done by placing the dish horizontally and rotating it while comparing the position of the tensioners to a fixed ground base—as is done in bicycle shops when truing a bicycle wheel. Each of the thirty-six data points will have an axial component and a radial component. If the elevation drive does not perfectly align the rim axis with the axis of rotation, there will be a sine-wave embedded in the axial component of the measurement, but it can be removed using statistical fitting. This method does not relate the alignment to the fiduciary, but can serve as a fast "low tech" way of quickly inspecting a dish with no special equipment.

Another method to confirm that the dish is perfectly aligned is by monitoring the tension of the spokes which should be uniform for all the front spokes, and for all of the back spokes. Since the front spokes are not encapsulated by ribs, their tension can be measured acoustically by plucking them. This can done spoke by spoke with the equivalent of a guitar string tuner, or by imparting a mechanical impulse to the hub and using a microphone and spectrum analyzer to pick up vibration frequencies that indicate an off-tension spoke.

In another embodiment, as shown in FIG. 14, the three mount points [144a-c] between the hexapod [140] and the hub are actuated along the direction of the optical axis of the dish by short-travel linear actuators [143], resulting in a 3-DOF tip-tilt-piston motion of the fiduciary plate from its nominal position. Only a small actuation travel range is required to tilt the hexapod a few degrees, and so it is used to correct tracking errors in real time. This either enhances the effective tracking accuracy, or alternatively compensates for a much reduced performance tracker. The actuation can be achieved using means such as pistons, bellows, lead screws, voice coils, piezo drives, cams, or eccentric shafts.

Among the novel features of the ACS as described above are: unlike conventional trusses, the structure itself is adjustable, and its alignment procedure is independent of the optics of the dish. Unlike conventional trusses (including cable-assisted ones) there are no radial members cantilevered or loaded in compression—it is the rim that enables the "magic" by which all radial members are always in tension. The ACS can therefore be fabricated in relatively small parts that can be easily transported to and assembled on location, without losing precision due to tolerance stack ups.

Among the utilities of the ACS as described so far are: ability to align-to-form in the field even for complex optical shapes, ability to replace reflector tiles without re-alignment, low weight, low moment of inertia, low part count, high strength and rigidity, high geometrical precision, single fiduciary mechanical interface that defines the optical axis for all optical components of the dish.

The ACS can additionally be used for any lightweight approximately round reflector such as a stretched membrane heliostat reflector, or even for non-reflective surface such as thin film solar panels or Fresnel-lens sheets. In heliostat systems, there is no PCU on the ACS, since it is located on the central tower. In a Fresnel lens embodiment, the tiles held by the ACS are transparent, refracting the light to a focal point behind the plane of the ACS.

Figure 39:
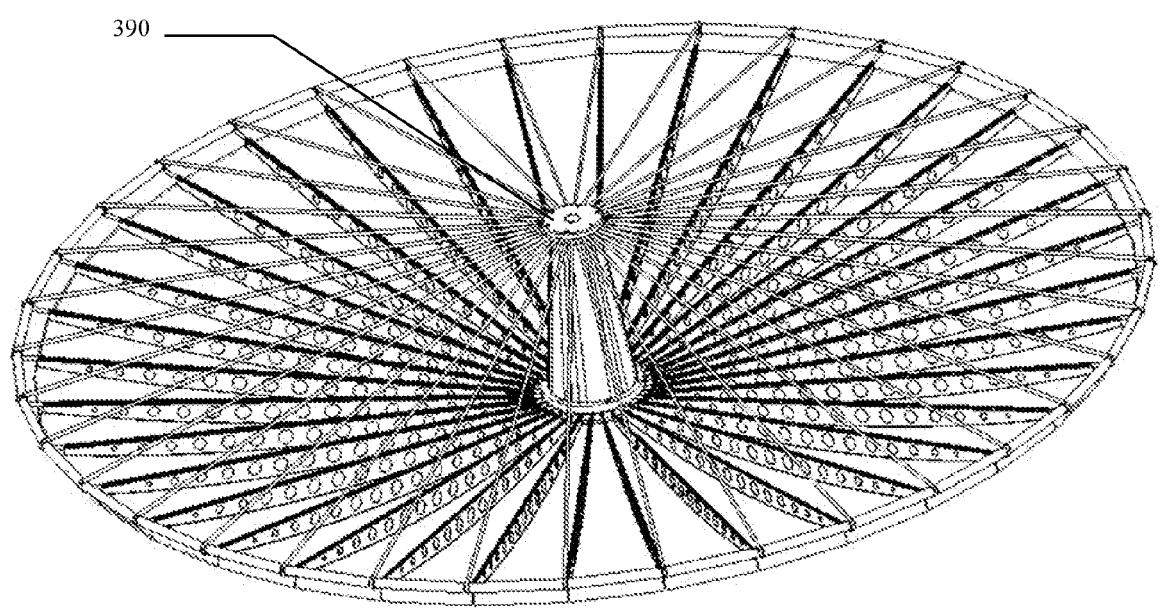
FIG. 39: Carrier—ACS with conical hub

In another embodiment shown in FIG. 39, a ACS is shown with a conical hub [390]. Conical hubs are beneficial in that they nest for transport, and as explained above, they minimize shading if the reflector is not pointed directly at the sun, as in the case of heliostats.

Figure 31A:
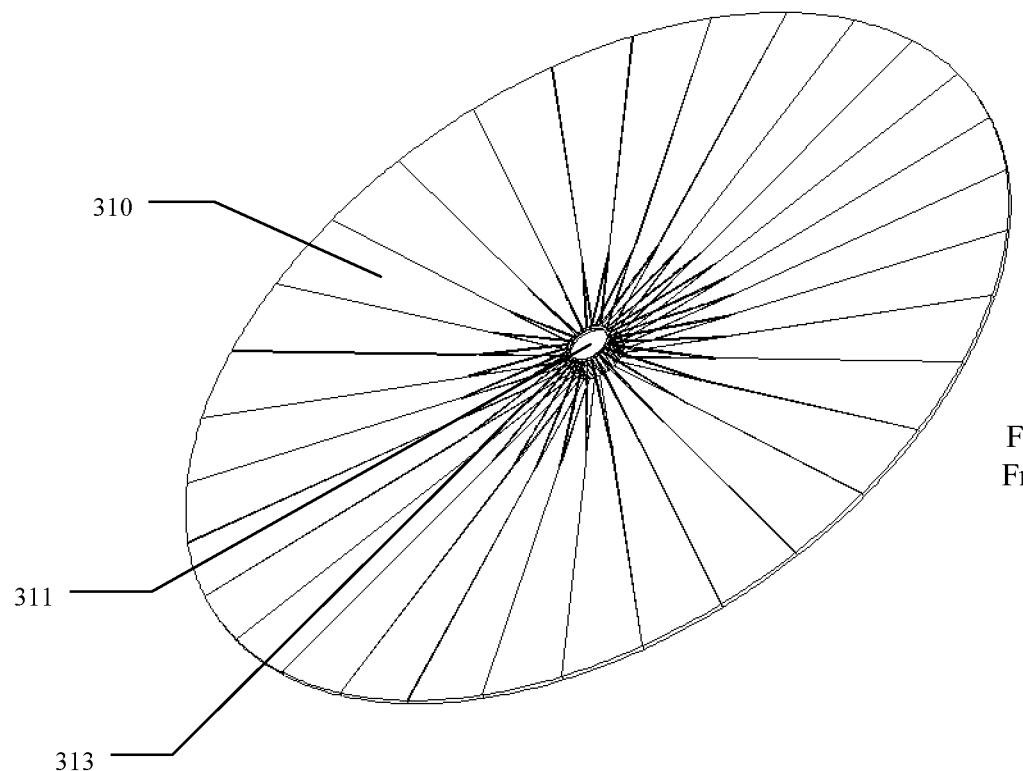
FIG. 31: Carrier—Flat reflector for heliostats according to an embodiment of the invention
Figure 31B:
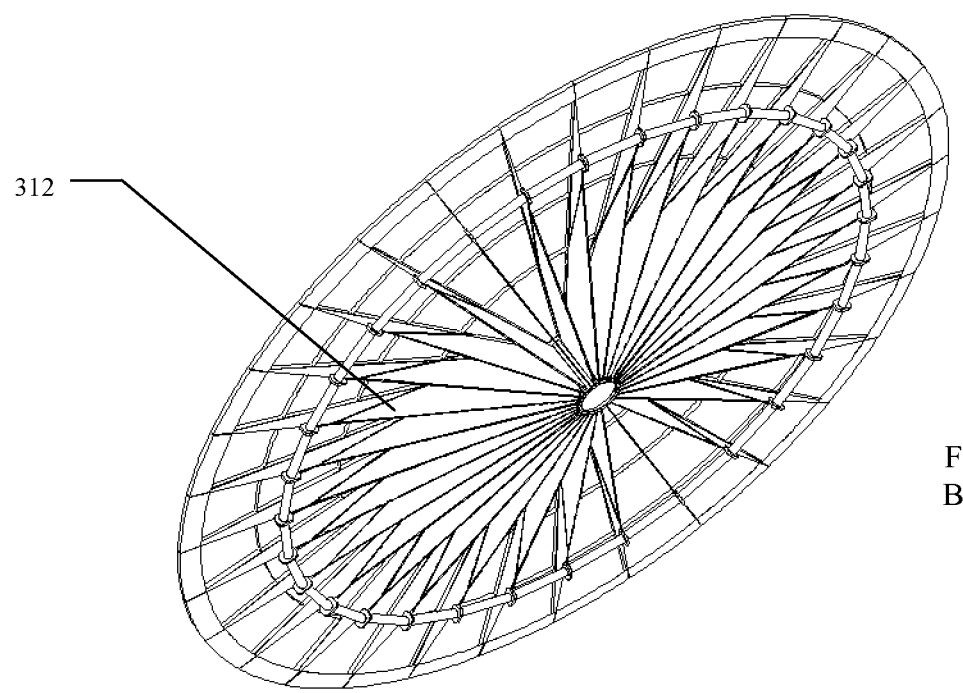

Another embodiment, also suitable for a heliostat, is shown in FIG. 31a-b. The reflector tiles [310] are principally flat and located near the front of the hub [311] in order to minimize shading (since heliostat mirrors do not point directly into the sun) and the spokes [312] and ribs [313] are largely behind the tiles.

Figure 32:
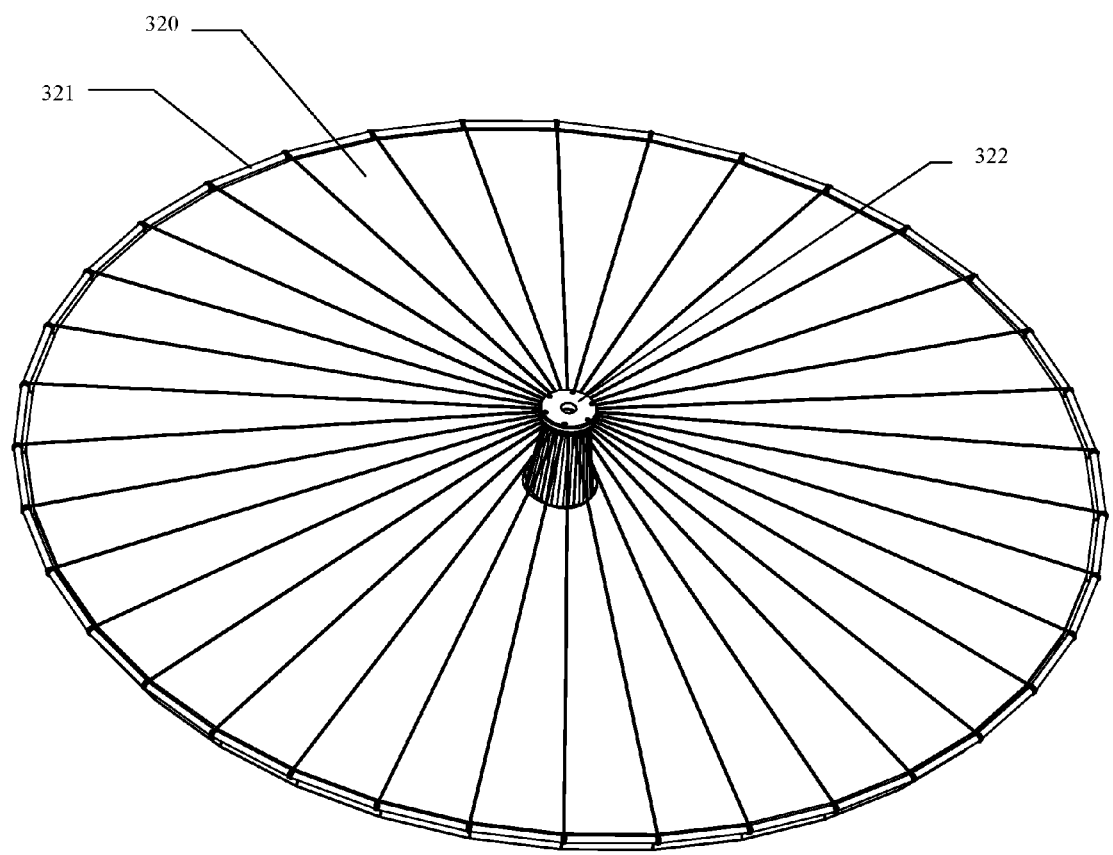
FIG. 32: Carrier—ACS with stretched membrane design according to an embodiment of the invention

In another such embodiment, shown in FIG. 32, the ACS is used to hold a stretched membrane [320] reflector usable with either heliostats in central-tower solar thermal systems or with dish systems. In this embodiment the flatness of the rim [321] controls the periphery of the stretched membrane. The curvature of the membrane is induced from its back side [not shown] either by a mechanical structure or a second membrane and vacuum in between them. (Stretched membrane reflectors are existing art and not in the scope of this specification). Again, to reduce shading in heliostats, the hub [322] is conical in shape.

Figure 33:
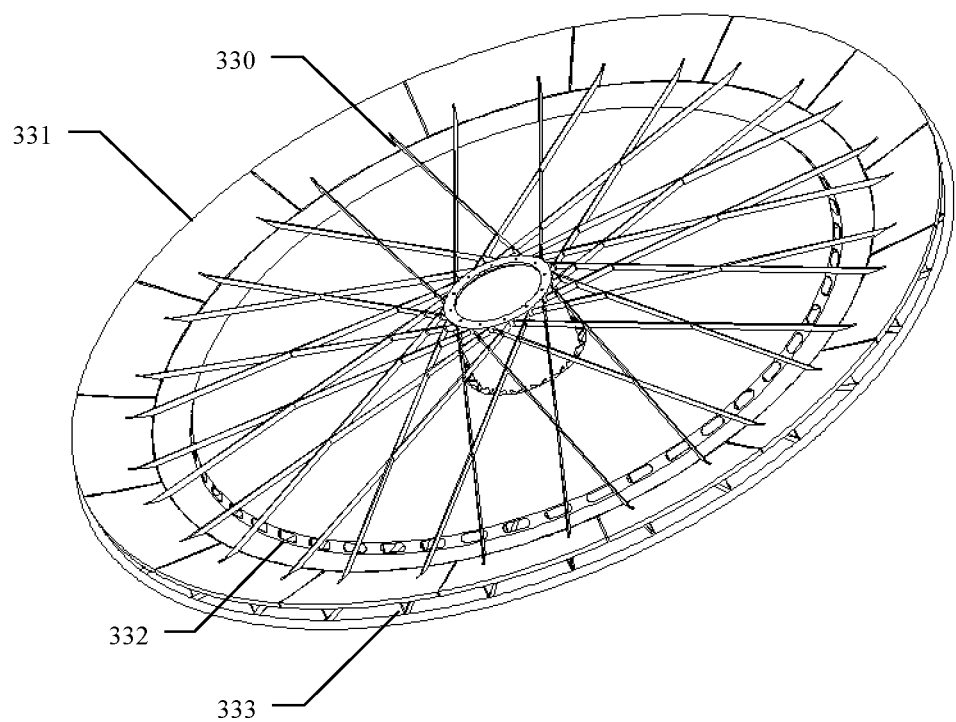
FIG. 33: Carrier—The ACS with vertical band spokes according to an embodiment of the invention

In another embodiment of the ACS shown in FIG. 33, the spokes [330] are bands oriented roughly in parallel with the optical axis of the dish, to minimize shading. The reflective surface [331] of the dish in this embodiment is a Fresnel paraboloid, comprised of two paraboloid rings with different focal lengths but sharing the same focal point. Openings [332] in the gap between the rings help reduce pressure differentials across the dish caused by aerodynamic effects. A Fresnel paraboloid can have two or more rings.

Figure 34:
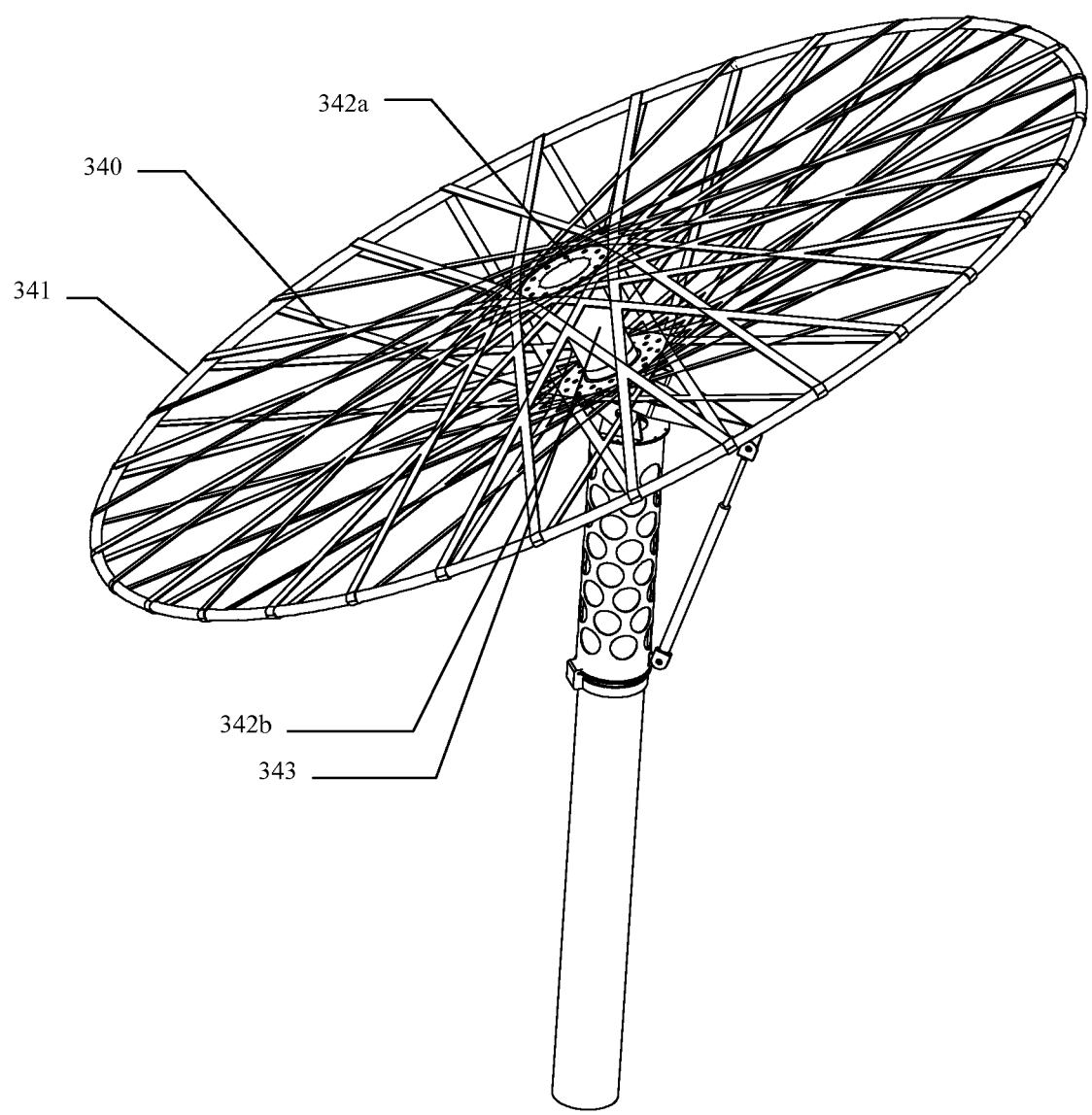
FIG. 34: Carrier—The ACS with horizontal band spokes according to an embodiment of the invention

In another embodiment shown in FIG. 34, the spokes [340] are band oriented roughly in parallel with the plane of the dish, and simply wrap around the rim [341]. The rim tensioner mechanisms are not implemented in this embodiment, and preloading of all the spokes after assembly is achieved by moving the two crowns [342a, 342b] away from each other on the hub using threaded rods [343]. Since this embodiment is less precise, it useful as a large tracking structure for flat panel PV receivers.

Figure 35:
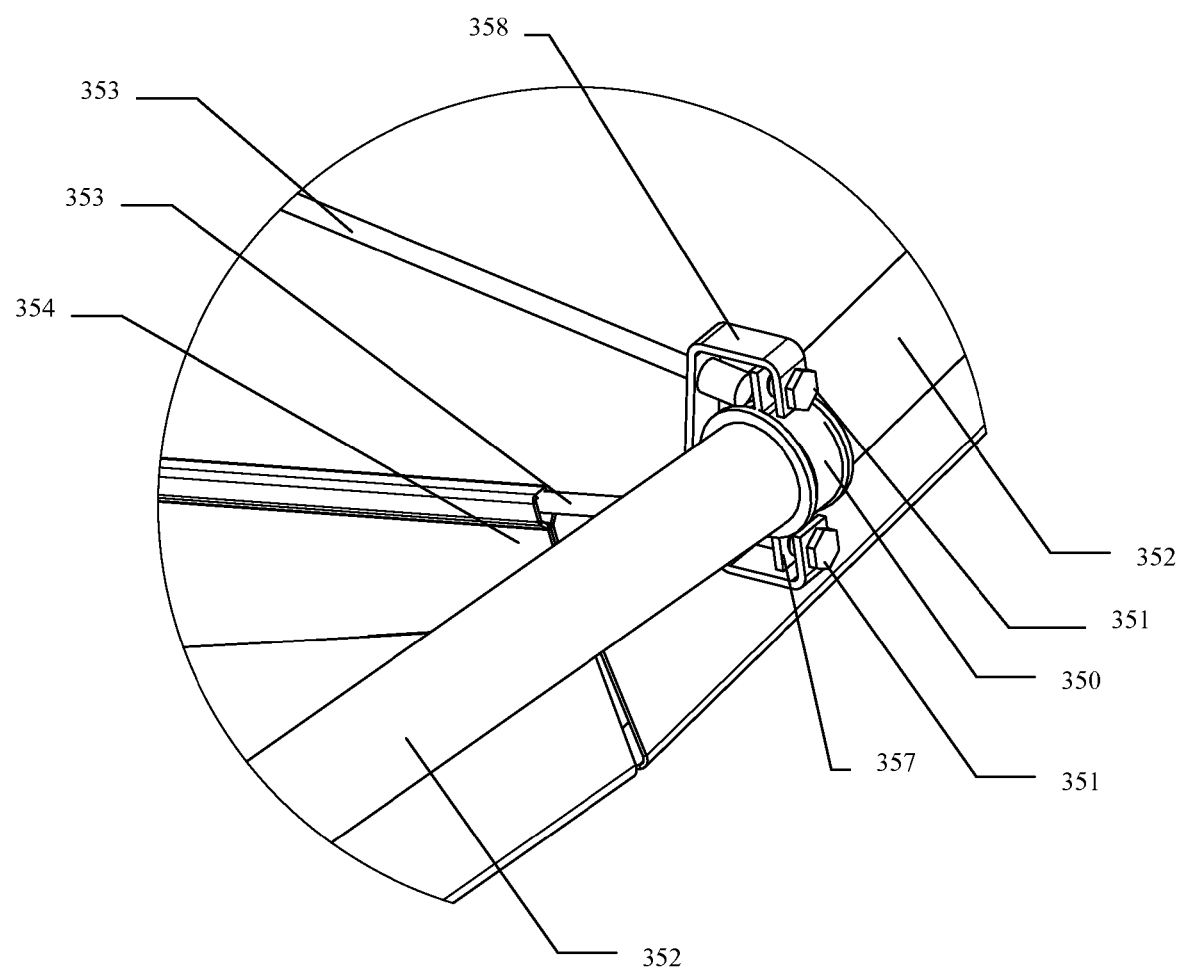
FIG. 35: Carrier—Rim-based tensioner node according to an embodiment of the invention

Another embodiment of the tensioner node is shown in FIG. 35. A central coupling element [350] in the form of a thick-walled tube is held in compression between two rim segments in the form of tubes [352]. The coupling element [350] has two surfaces at its ends that are appropriately angled with respect to its axis to accommodate the two rib segments [352]. The coupling element [350] also has a fixed bracket [357] attached to it. Two spokes [353] are connected at their ends to a movable bracket [358]. Two adjustment screws [351] adjust the position of the movable bracket [358] with respect to the fixed bracket [357]. Stiffening ribs [354] are attached to the back spokes just like in the embodiment shown in FIG. 11.

Figure 36:
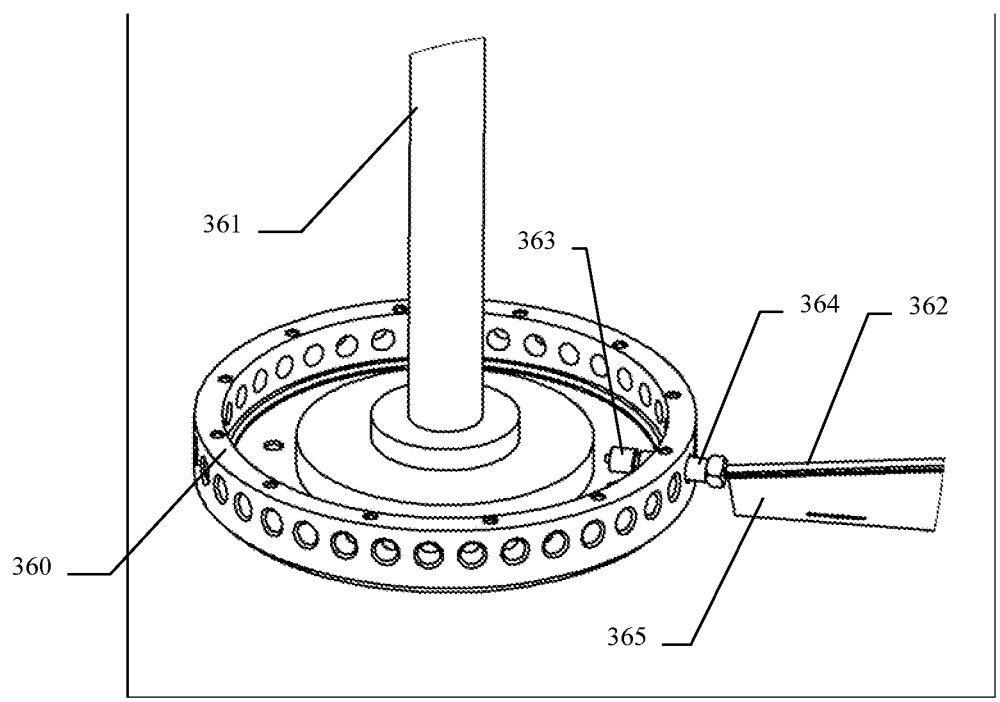
FIG. 36: Carrier—Hub-based tensioner according to an embodiment of the invention

Another embodiment of a tensioner is shown in FIG. 36. In this embodiment, the spoke tensioners reside on the hub rather than on the rim. The drawing depicts the back crown [360] of the hub, with the hub walls removed for clarity. A central column [361] is part of the support structure connecting the back crown [360] to the front crown (not shown). Each spoke [362] is terminated with a swage [363] and goes through a tensioning screw [364] that has a hole drilled through it and is threaded into the crown. By turning the screw [364] clockwise (inwards), the spoke [362] is pulled inwards with it, and is thus tightened. Also shown is the stiffener rib [365]. For clarity, only one spoke is shown. This embodiment is useful if tensioning is automated and motorized, since the tensioning motors all reside next to each other and wiring is thus minimized.

[Reflector Tiles]

As explained above, in various embodiments of the invention, the ACS provides each reflector tile with two precisely formed and located radial curved guide rulers as mounting points. While other manners of affixing the reflector tiles to the ACS can be used, it is believed that the embodiments described herein provide enhanced precision.

Traditional composite panels are comprised of a front membrane, a back membrane, and a core. The term membrane signifies that a sheet-like member can only support in-plane stresses. It is stiff in-plane, but flexible out-of-plane. A letter-size sheet of paper and a 1 m² sheet of 0.5 mm thick Aluminum are two examples of membranes. The core's role is to connect the two membranes and transfer sheer between them, so that the entire panels can resist out-of-plane bending. Typically, the core itself is rather flimsy and cannot support bending by itself either. Typical cores include honeycombs, general ribbed structures (even including cardboard ribs), and expanding foams. The membranes can be made out of Aluminum, steel, plastic, or glass. A traditional residential door, for example, is made from two very thin plywood membranes, and cardboard ribs in between acting as a core. Surfboards are often made with fiberglass membranes and foam cores. A person's weight will bend the membrane and break the foam, but the composite surfboard can support the person's weight even when the board is supported only at its tips.

Figure 37:
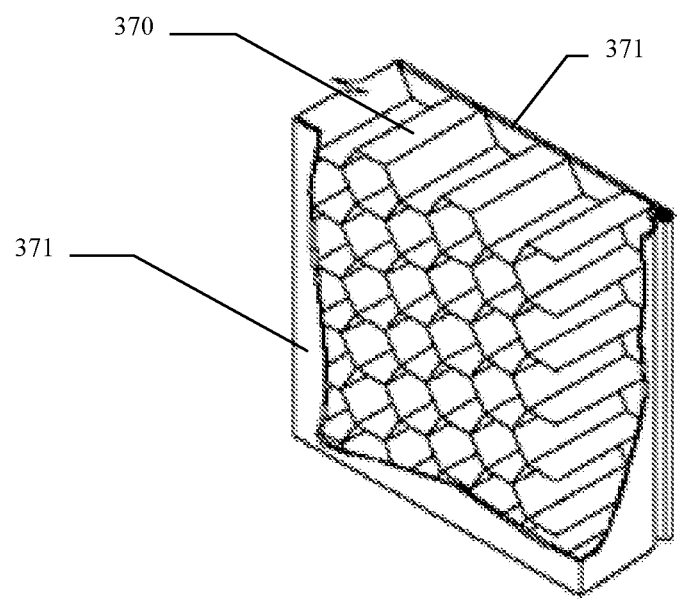
FIG. 37: Prior Art—A honeycomb core composite panel

FIG. 37 depicts a standard flat honeycomb core composite panel. The panel is comprised of the honeycomb core, which consists of a large number of ribs [370] oriented in three principal directions, and two membranes [371]. It is evident that the bonding area between the ribs and the membrane is very limited, consisting only of the edges of the ribs.

Precisely curved composite panels are more difficult to form quickly, since most ribbed structures are naturally flat. Honeycombs in particular, which are the most efficient ribbed structures, are almost exclusively flat, are awkward to handle in small, irregular shapes, and can be difficult to bond to because of the small surface area of the membrane-core joint. Injectable expanding foams get around these limitations and function well in flat or curved panels, but their mass/stiffness ratio is lower, their cost is high, and the curing process is both time consuming and environmentally problematic since it releases large amounts of solvents.

In some of the embodiment shown here, the core of the reflector tiles is formed using the process of thin-gauge vacuum forming, which is typically used to create objects such as yogurt cups. In this process, a thin plastic sheet is heated to a temperature in which it is easily deformed plastically. It is then placed over a mold containing an array of depressions, and lowered down to seal against it. Vacuum is then applied between the sheet and the mold, and the soft sheet it sucked into the depressions, creating an entire tray of yogurt cups at once. This process is fast, scalable, and cheap.

In these embodiment, we adapt this process to create a honeycomb-like ribbed core structure which is pre-curved to match the intended curvature of the tile, pre-formed to match the non-regular shape of a slice of a dish, and is able to conform to a high precision optical surface without inducing stresses in itself. (The ideal panel core structure has high stiffness in shear, but low stiffness in bending.)

FIG. 17a shows the vacuum forming mold that forms the core, which has a front surface [170] that conforms to the intended optical shape of the tile. The back surfaces of the depressions in the mold [171] jointly form a piece-wise surface that defines the back side of the core. As in all vacuum forming molds, small conduits or holes allow the vacuum forming machine to apply vacuum into the depressions, sucking the heated and softened thin plastic sheet being formed into them.

FIG. 17b-c depict the formed core, as derived from the mold. It has a front surface [173] that approximates the intended optical shape, but also has a large bonding area (when compared to a conventional honeycomb core). The back of the core [174], comprised of the backs of the formed cups, also features a large bonding area that will attach to the back membrane. In this embodiment, the back surface is curved so as to make the tile thicker in the middle, to optimize it for bending loads when supported by the two guide rulers provided by the ACS. This is evident in the five cups [175] closest to the viewer in the bottom most view of FIG. 17c. The sidewalls [176] of the cups are the members that carry the sheer forces in the completed tile. In this embodiment they are slightly slanted since the depressions in the vacuum mold must be tapered.

FIG. 18a-e show the structure and assembly order of the complete tile. As shown in FIG. 18a, The front membrane [180] is first placed (face down) on a precision bending mold [181] that gives it its proper optical shape. The bending mold pulls the membrane down to it using vacuum, ensuring a good surface fit throughout its area. For the curvatures needed for solar applications, the membrane typically only undergoes elastic in-plane deformation during this step. Electrostatic forces or pressure can be used instead of vacuum to constrain the front membrane to the bending mold. It is important to differentiate between the vacuum mold used during the vacuum forming process to form the core and the bending mold which might use vacuum to constrain the front membrane to it.

As shown in FIG. 18b, the core [182] (which was previously formed to shape) is then placed on the back side of the membrane and bonded to it. Note that since the cups are connected only via the front surface of the core, the core is free to bend in both directions as it is being attached to the front membrane. This is important since the accuracy of the bending mold is higher than the results of the vacuum forming process.

Next, sidewalls [183] are placed around the tile's perimeter. The sidewalls contain fastening features [184] used to later attach the tile to the ACS. At this point in the process, the backs of the core cups are still exposed and free, and if the tile is removed from the mold, the front surface would still be able to deform and lose its desired shape, by causing the individual cups to "wiggle" as it does so.

To complete the tile, as shown in FIG. 18c, the back membrane [186] is bonded to the backs [185] of the cups of the core, preventing them from moving relative to each other, and thus making the structure stiff and capturing the geometry of the front membrane that is still held conformant to the mold. The function of the cups is evident in a cross-section of the complete tile (FIG. 18e), as their sidewalls create a web of cross-ribs [187] all throughout the tile.

In another embodiment, the back membrane is pre-formed around its edges to includes the sidewalls, thus creating a single backshell which encloses the tile, reducing the part count of the complete tile.

Spring clips [188] are then attached to the sidewalls (FIG. 18d). The clips will be used during dish assembly to mount the tile to the ACS ribs and preload the tile in the forward direction against the ACS rib guide rulers [121, in FIG. 12].

Figure 19A:
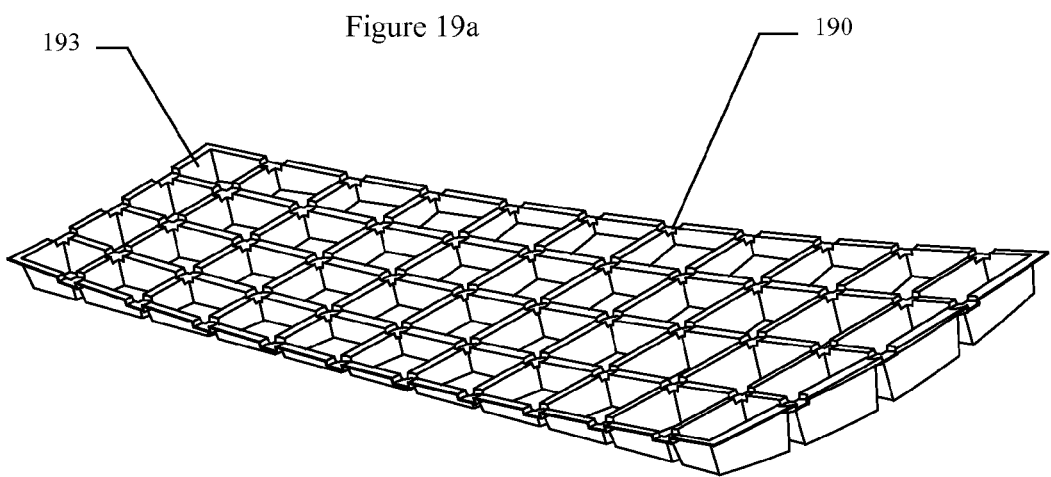
FIG. 19: Reflector tile—Core rib patterns according to an embodiment of the invention
Figure 19B:
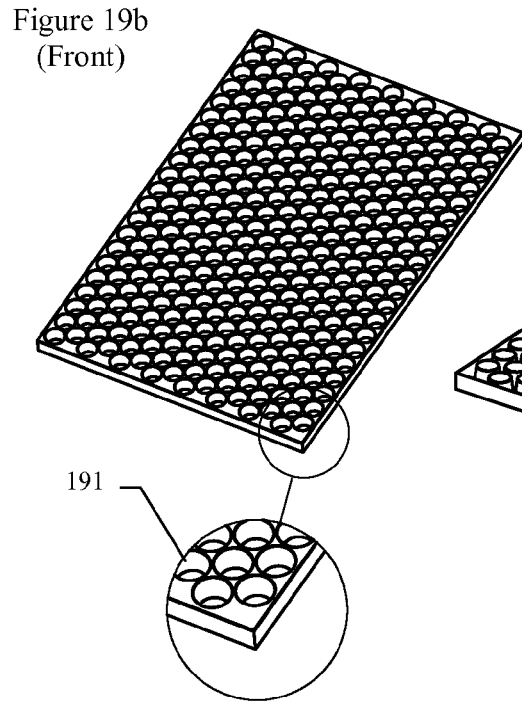
Figure 19C:
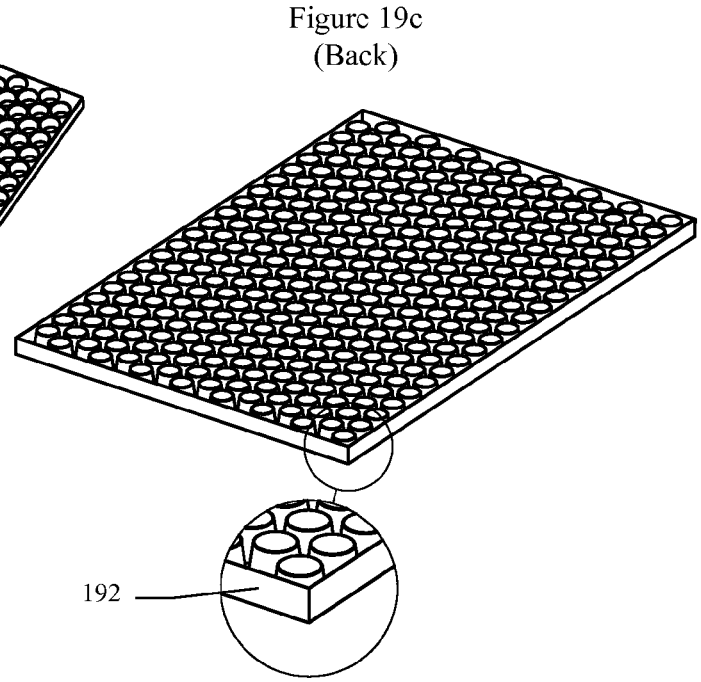

FIG. 19a-c shows several embodiments of the core with different tile and cup geometries. In the first embodiment shown (FIG. 19a), the tile core is implemented with trapezoid or rectangular cups [193] instead of triangular one. The packing of the cups is more efficient than that of the triangles, and their fit to the side edges of the tile is more consistent and uniform. In this embodiment, reliefs [190] are formed to alleviate thermal expansion conflicts between the core material and the membrane material. The reliefs are formed by adding corresponding depressions to the vacuum mold.

The next embodiment shown (FIG. 19b, front, and FIG. 19c, back) is of a core for a rectangular almost-flat reflector panel (such as is used with Heliostats) which uses round cups [191], and additionally has sidewalls [192] formed during the vacuum forming process, helping in sealing the tile structure against dirt and moisture. In a slight variation, the circular cups can be replaced by hexagonal cups, packed in the same exact pattern. Round or hexagonal cups are easier to vacuum form than rectangular or triangular ones, since their walls form oblique angles.

The overall tile shape can be trapezoid as is appropriate for a sector of a dish, but can also be any other shape for other reflector types such as heliostats.

In other embodiments, processes such as blow molding (for plastics), or stamping or hot forming (for aluminum) can be used to create similarly-shaped cores from other materials. The key requirement of the core forming process is that the mold matches the desired curvature of the front sheet, so the bonding process does not have to fill large gaps between the core and the front sheet.

In these embodiments, the cups are 1-2 inches deep, and 2-3 inches across, and made from an ABS or HIPS plastic sheet 1-2 mm thick, but other dimensions, aspect ratios, and materials can also be used.

For optimal use of material in the core, it is best to have the walls of the cups thicker than the front and back surfaces of the core, since it is the walls of the cups that transfer the sheer between the membranes of the panel. The vacuum forming process tends to stretch the wall surfaces more, and so they actually end up thinner. To fix this problem, the plastic sheet is pre-painted so that the areas that end up being the front and back surfaces are dark, and the area that end up being the walls are light.

Figure 20:
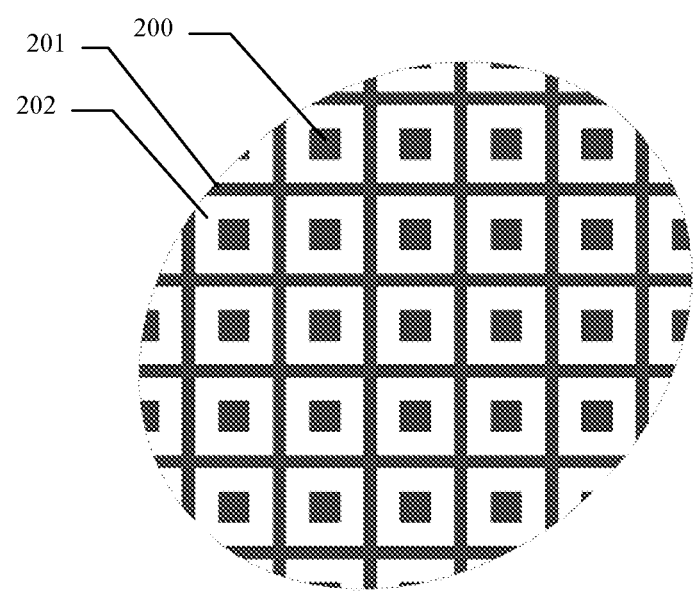
FIG. 20: Reflector tile—Plastic print pattern according to an embodiment of the invention

FIG. 20 shows the paint pattern for a core embodiment that uses square cups (similar to that shown in FIG. 19a, but without the reliefs, to simplify the explanation). The preformed flat sheet of material has three types of regions—the regions that become the backs of the cups [200] and are painted dark, the regions that become the front surface joining the cups [201] and is also painted dark, and the regions that become the sidewalls [202] and are left white. As painted, when the sheet is heated using radiated light, the darker material heats up more, and so during the vacuum forming step it flows more easily and ends up thinner as the vacuum is applied and the sheet is stretched into place.

Another way to look at the construction of this composite panel is that after the front membrane is properly formed by the bending mold, each of the cups bonded to it captures the direction of the normal vector to the surface at its location. Once this is done, fixing the distances between the back sides of the cups by bonding a second membrane to them essentially takes a mechanical snapshot of the entire curvature of the front membrane. For this to work, the core structure must allow each cup to tip and tilt independently in space, while keeping the cups themselves rigid. For this reason, the core can be replaced by individual cups with no effect on the final result, or (for manufacturability reasons) a large panel can use several small cores laid side by side.

Other embodiments of this method and structure are shown in FIG. 21a-c, where the vacuum-formed plastic core is replaced by a bent sheet-metal sheet [210], formed in a similar way as the core of a corrugated structure, but with addition cuts [211] introduced so as to leave only a planar portion [212] of the metal intact. This structure can bend in both directions, and so can be bonded to an arbitrarily formed front sheet, just like the vacuum formed cups. Once a second sheet is bonded to its back side, the structure becomes rigid, and retains the shape of the front surface, as it was when the bonding occurred. In comparison with the plastic vacuum-formed plastic core, this core structure is less form fitting since the individual contact points are flat, but it has the advantage of creating a fully metallic tile.

A second method of creating the same geometrical function is shown in FIG. 21b, using multiple separate narrow corrugated strips [213] which together form the same shape as the single metal core structure. While this embodiment has a higher part count, the strips can be reversed and alternated as shown in FIG. 21c [214a, 214b] to create a more homogenous checkered contact pattern with the membranes.

In all of these methods, the underlying principle remains the same. The connecting bodies (cups, trapezoids, etc) must first be attached to the front sheet (whose front surface shape is the one being controlled), so that they are able to capture the directions of the normals to the surface without interference from the back sheet. Only once they are in place do we attach the back sheet to capture the positions of the back sides of the connecting bodies.

In a slight variation, during manufacturing it is sometimes advantageous to attach the connecting bodies to the back sheet first. It is possible to do this with the tray of cups embodiment described above by first placing it on a mold without attaching the front sheet to it, but still having it deform in the same way it would had it been attached to the front sheet. The back sheet is then attached, capturing the positions of the cups as if they were already attached to the front sheet. Once done, the back sheet and cups can then re-attached to the front sheet while on the mold, but care must be taken that they are positioned accurately, since any deviation in position will result in internal stresses and deviation from the prescribed shape.

The utility of the embodiments of this process is that they get around the limitations of traditional honeycombs in that the core is free-formed, has large bonding areas, is cheap, is mass-producible, and requires minimal handling when being assembled into the panel.

For a reflective solar tile, the front membrane needs to have a reflective surface. This can be achieved by using a reflective material, such as silvered glass, front surface silvered-aluminum, or other similar products, or by using a two layer membrane such as silvered Mylar bonded to an aluminum or steel backer.

This method works for any structure that has arbitrarily shaped front and back skins, as it creates a lightweight ribbed core layer that precisely connects the two skins to each other while maintaining the mold shape and giving the structure high rigidity and very low weight—a functionality that is very difficult to achieve with a pre-made honeycomb, and a performance that is much better than a foam filler layer. The structure is useful, for example, when creating a secondary reflector, or slightly-curved heliostat mirrors as discussed below.

As explained above, the mirror tile is located on the ACS by being pressed forward against the ACS rib guide rulers. This mounting scheme means that the surface being located is the optical surface, and so any variations in the thickness of the tile do not enter the assembly tolerance stack-up.

[Cleaning]

Figure 22:
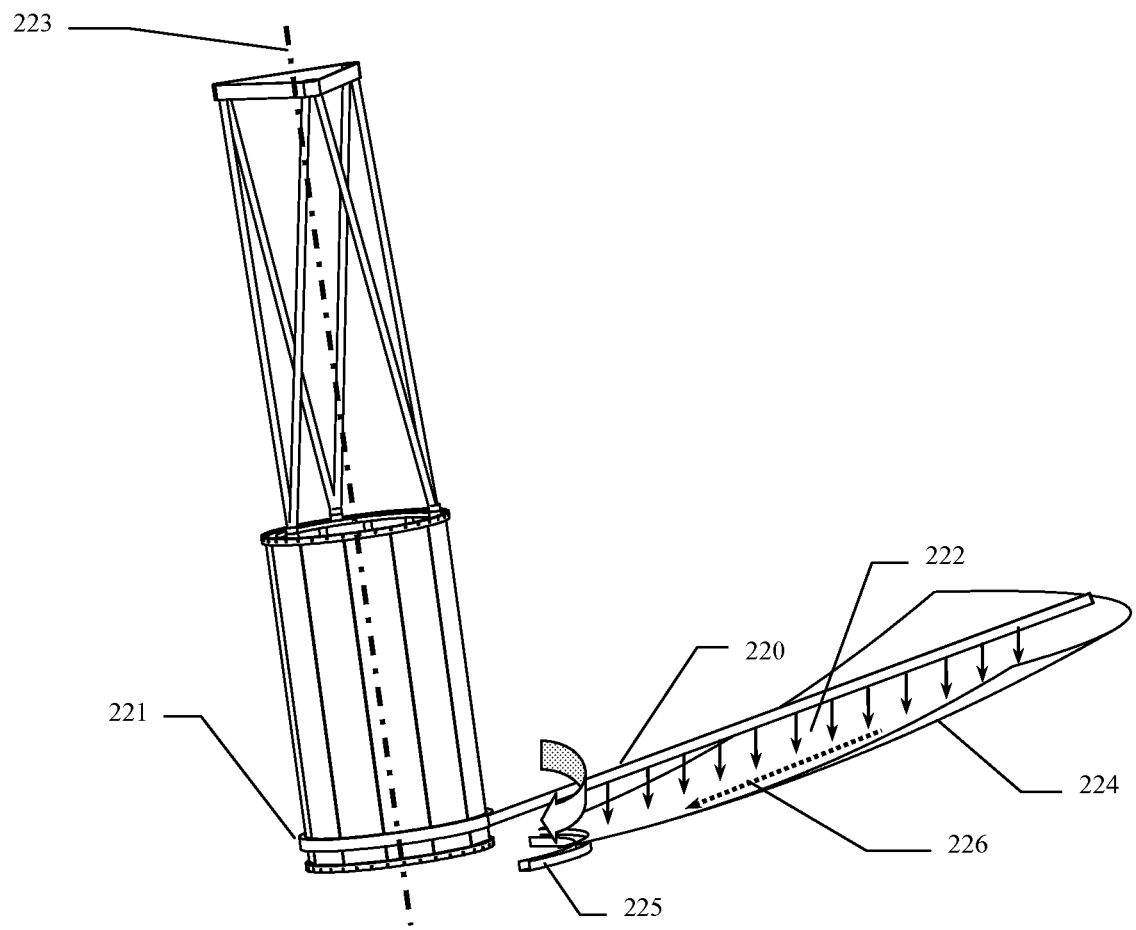
FIG. 22: Dish—Hub mounted cleaning arm according to an embodiment of the invention

As attached, the tiles create a single continuous surface around the dish (as opposed to a discrete piece-wise surface). To clean the dish, it is first placed in a horizontal orientation, and so the cleaning water flows towards the center of the dish where it is collected by a gutter for reuse, (in a similar way as it does in most residential roofs) which allows for frequent washing and reduced soiling problems, and even collection of rain water for subsequent cleaning FIG. 22 shows a rotating washing arm [220] attached to the hub through a bearing which allows the arm to rotate around the dish axis [223], providing convenient close-range access to the entire surface of revolution of the mirror [224] for the purpose of cleaning. The washing nozzles are located at the edge of the arm [220] nearest the mirror surface and spray towards it [222], but some can be tilted so as to propel the arm [220] when water pressure is applied. Since the mirror is horizontal when washed and since the ACS and tile structure creates a continuous surface, the used water flows [226] down the face of the dish and is collected using a gutter [225] located on its inner rim and so can be reclaimed, filtered, and reused, allowing for frequent daily cleaning cycles, and plentiful use of cleaning water. This results in a cleaner mirror and increased electricity production.

Water is supplied by an on-board system, or by a washing service vehicle that services the mirror and supplies both water pressure and drainage. A second system provides air pressure for drying the mirror, also using the arm for delivering the airflow.

The nozzles optionally are also pointed towards the center of the dish, assisting the gravity-induced flow of dirty water from the rim inwards.

[Heat Exchanger]

Figure 23:
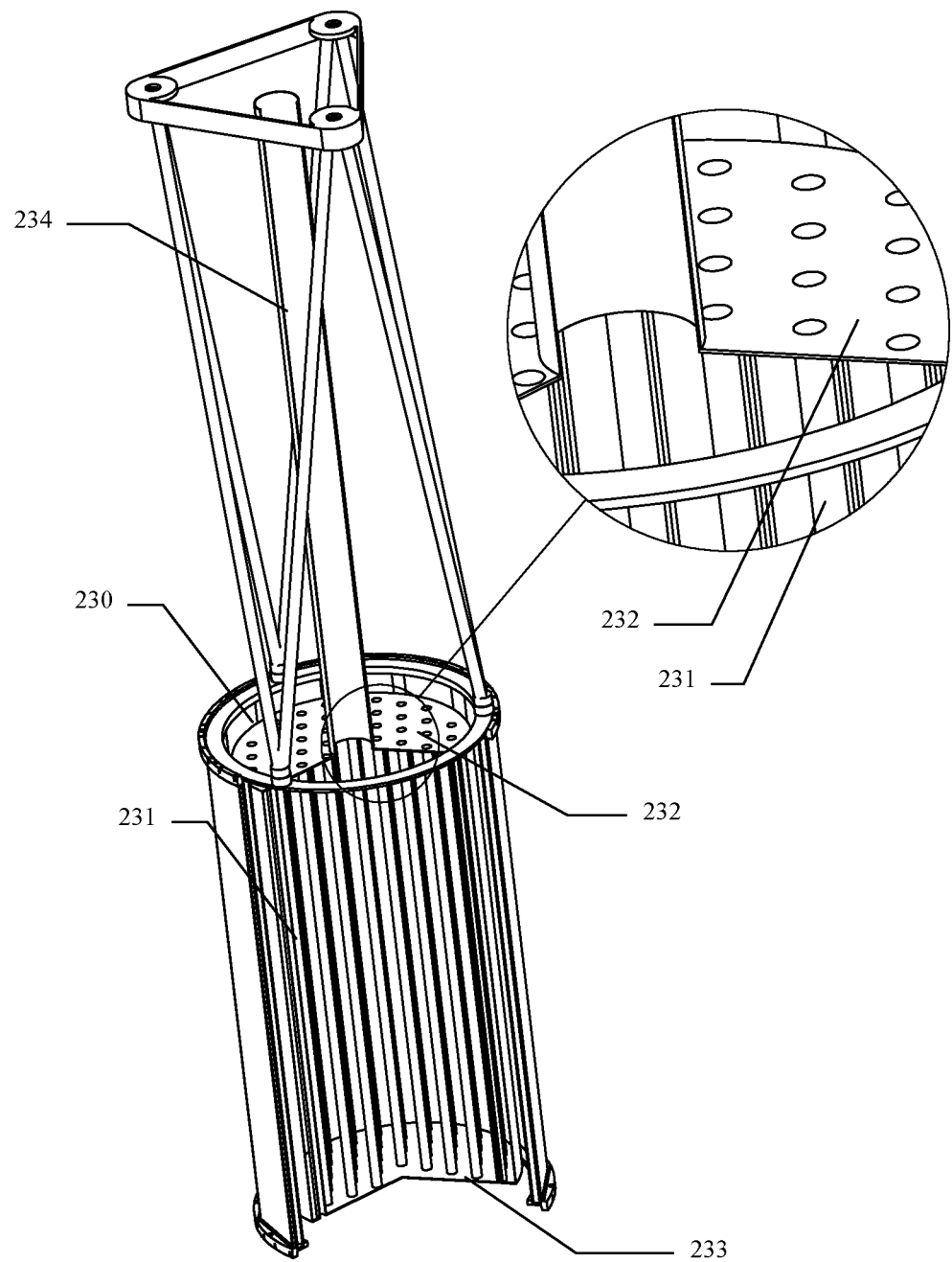
FIG. 23: Dish—Hub mounted condenser/heat exchanger according to an embodiment of the invention

FIG. 23 shows an embodiment of this invention that has a heat exchanger built into the hub of the ACS. Both photovoltaic and thermal PCUs need a heat exchanger to keep the PV cells or the cold side of the thermal engine as close as possible to the ambient temperature.

In this embodiment, a heat exchanger is located inside the hub [239], comprised of a cylindrical body [230] that has a large number of thin wall tubes [231] connected to its front [232] and back [233] surfaces, such that the inside of the tubes is open to the ambient atmosphere. Hot coolant, possibly in vapor form, is brought into the heat exchanger through an input duct [234] and comes in contact with the outer surface of the thin walled tubes, inside the cylindrical body. Ambient air is blown forward by a fan [not shown] located at the back of the heat exchanger through the thin walled tubes and so comes in contact with their inner surfaces. The ambient air therefore does not enter the enclosure of the cylindrical body but only flows through the tubes and exists at the front surface. Heat exchange occurs through conduction across the thickness of the tube walls. The cold coolant is collected at the back surface of the cylindrical body and sent to the PCU via a pump and a pipe [not shown]. Since the coolant flows in the backwards direction, the ambient air and the coolant are counter-flowing, as is advantageous in heat exchangers.

When hot coolant arrives at the heat exchanger in vapor form and cold coolant leaves the heat exchanger in liquid form, the heat exchanger is referred to as a condenser. In this case, the vapor is typically at a pressure lower than 1 Atmosphere, and so the many small tubes through the condenser are loaded in tension, which means that very thin-walled tubes can be used. The placement of the condenser in the hub guarantees that the coolant always condenses at its back end.

[Thermal PCU]

Figure 24:
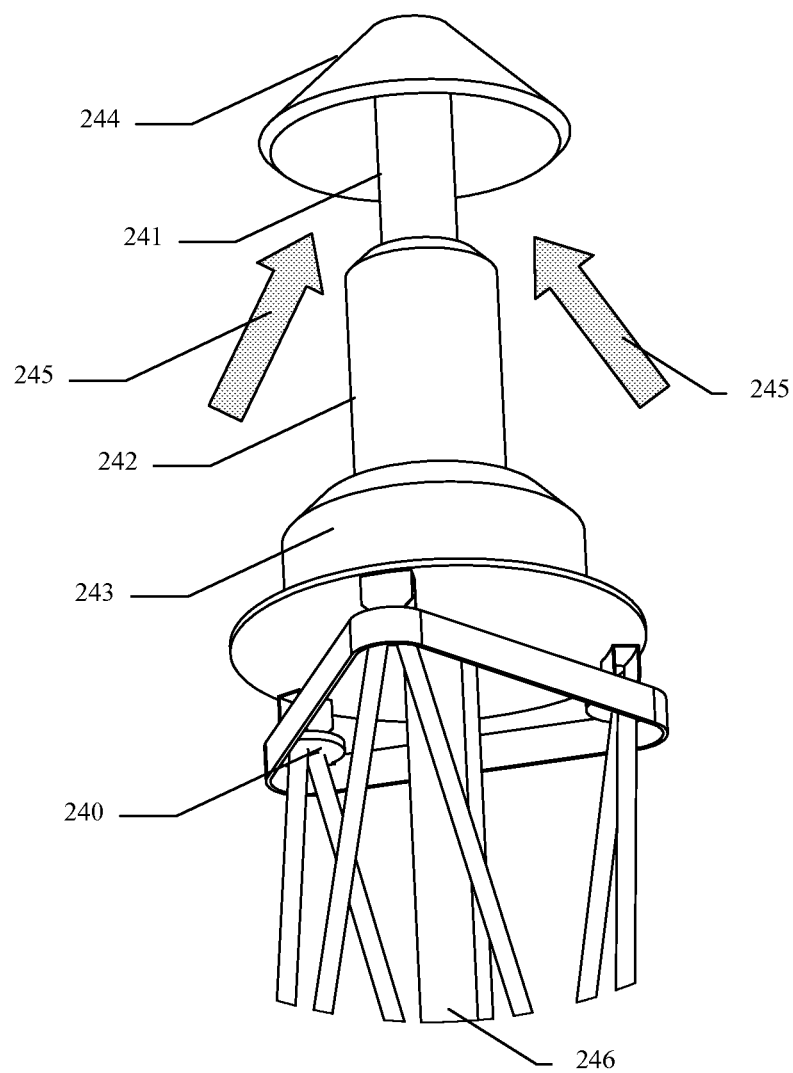
FIG. 24: Thermal receiver—Hexapod mount according to an embodiment of the invention

FIG. 24 depicts an embodiment with a thermal receiver mounted to the hexapod through the fiduciary interface [240]. Like all thermal receivers (See FIG. 2), the solar thermal receiver has a hot side [241], a cold side [242], and an electrical generator [243]. The internal structure of the thermal receiver is outside the scope of this specification, as such receivers (E.g. Stirling engines) are commonly available.

The outer skin of the hot end of the thermal engine is illuminated from all sides by the sun light [245] reflected from the primary dish. In this embodiment, a reflector [244] is placed around the hot side to redirect light that was reflected from the skin (rather than absorbed by it) back onto the skin, thus reducing reflection losses.

The cold end of the thermal engine is connected to the coolant duct that leads to the condenser [246], and to the pipe that bring coolant back from the pump [not shown].

This orientation of the thermal engine is opposite of the standard practice, in which the engine is mounted with its hot end facing the dish. The utility in this placement is that the heavy components of the receiver, which are the generator and the cold end of the engine, are located closer to the pivot point of the dish, and so result in a reduced moment of inertia, and that the heat exchanger is conveniently located in the hub of the ACS and easily connected to the cold end of the engine.

[PV PCU]

Figure 26:
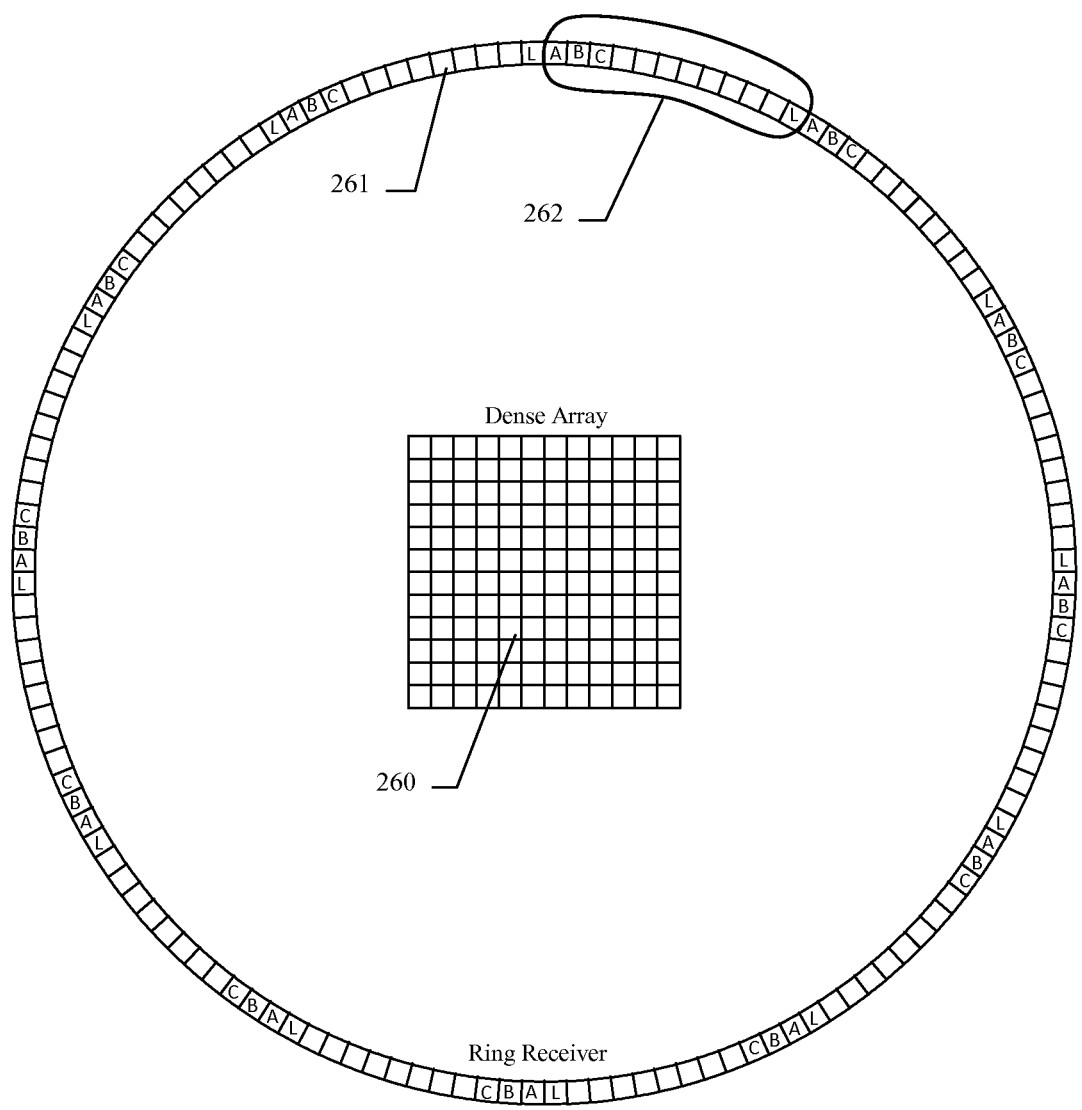
FIG. 26: Ring receiver—Interleaved cell circuit according to an embodiment of the invention

In the embodiment of the invention described here, the problems associated with dish-based photovoltaic receivers (described in the background portion of this specification) are solved by changing the shape of the focal area from a dense array to a narrow ring of cells, while keeping the total receiver area constant. In a narrow ring, all cells are equivalent as far as their placement within the receiver—there are no cells closer or further from the edge of the receiver. When the diameter of the ring is much larger than its width, the system is essentially one dimensional, and so the radial direction, which is perpendicular to both the direction of insolation and to the tangent to the ring, can be used to flow cooling media, route electrical connections and eliminate internal shadowing. FIG. 26 shows the basic cell layout, with a traditional dense-array arrangement [260], and the equivalent (same number of cells) ringed arrangement [261]. The lettering on the cells [262] is explained further below when discussing cell wiring.

From a thermal perspective, the ring geometry becomes most advantageous when its width is significantly smaller than its circumference. The size of the cells is not important— the cells in FIG. 26 could have equally been half sized, and the ring would have had two cells across it. What's important is that the width is (for example) $1/144$ of the circumference, and so replaces a square array whose edge would have been 12 times the width of the ring. This advantage is significant when the circumference of the ring is greater than 10 times its width.

From a wiring perspective, the ring geometry becomes advantageous when its width is small enough so that the grid on the cells can conduct the electricity to bus bars that are outside the ring. This advantage starts to become significant when the ring is narrower than 2 cm, but this is highly dependent on the technology used to fabricate the front-surface collection layer of the PV cell.

From an optical perspective, the ring geometry becomes advantageous when the diameter of the ring is much wider than the spot size created by the natural divergence of the light coming from the sun, which allows the optics to remain principally 2-dimensional since the curvature of the ring is negligible. This advantage becomes significant when the diameter of the ring is at least 10 times its width, but this also depends on the optical design of the secondary optical element as described further below.

In this specification, the term "narrow ring PV receiver" is used to designate a photovoltaic receiver whose active photovoltaic surface is shaped as a ring that is narrow enough for the receiver to benefit from the specific advantages discussed in the context where the term is used. It is useful to think of any receiver as having a "characteristic width" which is the dimension determining how difficult it is to perform a certain task such as cooling or wire routing. In a two dimensional receiver with a shape such as a square or a circle, this dimension is the square root of the area. Thus a 400 cm$^2$ receiver is "20 cm across". A one dimensional, or "narrow", receiver is therefore one in which the characteristic width is much smaller than the square root of its area. A ring with a circumference of 200 cm and a width of 2 cm would qualify as such, since for the same area, its characteristic width is only 10% that of the characteristic width of a two dimensional receiver.

A sufficient, but not necessary, criterion for a narrow ring is a ring whose circumference is at least 10 times larger than its width. A similar criterion is that the width is less than a third of the square root of the area.

Figure 25:
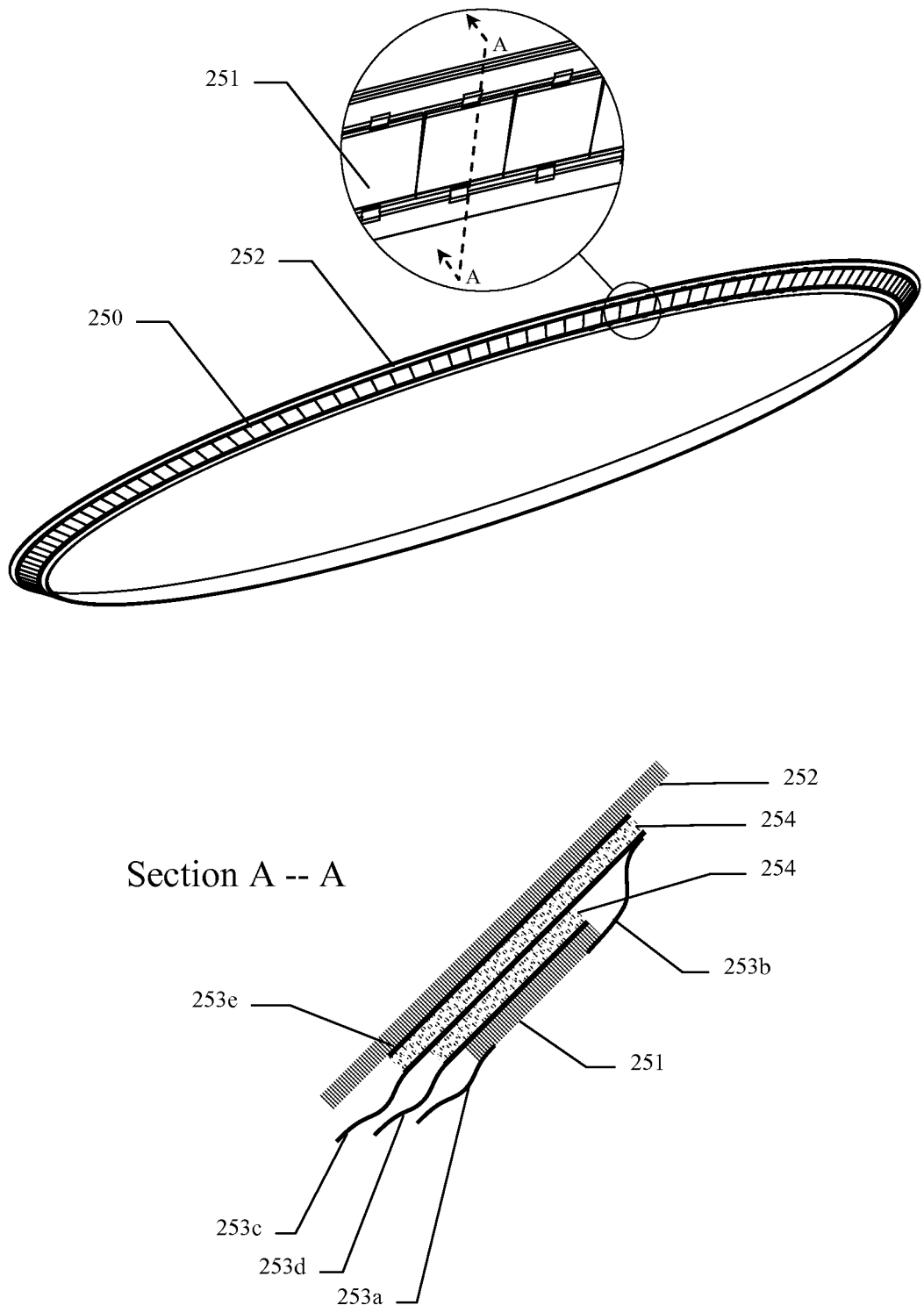
FIG. 25: Ring receiver—Cell placement according to an embodiment of the invention

FIG. 25 shows the cell placement on a physical ring receiver [250]. In this embodiment the ring is conical, approximately 1.14 m in diameter, and holds 360 square PV cells [251] in a single row, each 1 cm on edge, making it about equivalent to a 19 cm square receiver, and suitable for a dish with an optical area of 36 m$^2$ with a concentration factor of 1000. (FIG. 25-FIG. 30 show a smaller number of cells, for clarity of presentation). In other embodiments the ring can be cylindrical or flat, can be of any size, and hold cells of various sizes and in any quantity and in more than a single row, though two rows is the most amount of rows that still give each cell at least one edge that has no cells adjacent to it. As explained under "Optical Path", a narrow ring is determined by its width-to-circumference ratio, not by the number of cells across the width, since PV cells are available in many sizes, and for example four 0.5 cm cells in a 2×2 grid are equivalent to one 1.0 cm cell.

For conical and flat rings, square or rectangular cells do not achieve 100% area coverage, since small wedge shaped gaps form between them when they are laid out. To remedy this, it is possible to use trapezoid-shaped PV cells that match the angle of these wedges. Such cells can be manufactured by dicing them from the semiconductor wafer at slight alternating angles.

The carrier ring is made out of Copper, which has a thermal conductivity of 400 W/m-K, one of the best thermal conductors. For a 5 mm thick ring, and a typical 65 W/cm$^2$ thermal load, the temperature differential across the ring is 650,000/400*0.005=8 degrees. Since operating temperature for typical PV cell should not exceed 100 C, and since the ambient temperature in the desert can reach 40 C, the thermal conductivity of the material of the carrier ring should not be below 100 W/m-K, which constrains the choice of materials used for its construction. Another possible material for the carrier ring is Aluminum, which has a thermal conductivity of 250 W/m-k.

Section A-A shows a diagram of the cell mount in cross section. The PV cells [251] are soldered to two layers of double-sided metalized Alumina ceramic [254], which are in turn soldered to each other and to a copper carrier ring [252]. The Alumina serves as structural support to the PV cell, since unlike copper, its coefficient of thermal expansion is close to that of the typically Germanium based cell. The soldered metalized coatings of the Alumina serve as current paths from the cell to the foils or wires [253a-d] leading to the collection circuit board (not shown).

The bus bar nearest the collection board is wired [253a] directly to it. The bus bar farther from the collection board is wired [253b] to the second metalized layer and that same layer is then wired [253c] to the collection board. The back side of the PV cell [251] is naturally soldered to the front metalized layer, and this layer is then wired [253d] to the collection board. The backmost metalized layer [253e] serves only as a mechanical and thermal interface to the copper ring. The collection boards contain any additional circuit components such as bypass diodes, and the wiring terminals for the overall collection circuitry.

The collection circuitry wires the cells together. To ensure uniform electrical loading, the cells are grouped into several electrical circuits, each circuit being a parallel connection of cells that are interleaved and distributed evenly around the ring. The circuits are then connected (strung) in series for the final output of the receiver. FIG. 26 shows the cell and circuits layout for a 144 cell ring, with 12-cell-per-circuit and 12 circuit ring. The cells are labeled by their circuit number (A-L, only A,B,C and L shown explicitly), so that all the same-lettered cells are wired electrically in parallel (thus acting as a single distributed cell). The output voltage of the receiver is thus 12 times the output voltage of a single circuit, which is itself equal to the output voltage of a single cell. One group of adjacent cells is marked [262], containing one cell from each circuit. Such a contiguous group of adjacent cells is labeled a "zone".

The higher the number of cells within each circuit, the better they are distributed around the receiver, and the less sensitive the receiver is to an illumination variance. An absolute minimum number of cells per circuit is two, since the expected non-uniformity due to mis-tracking is two-lobed. However, since the two-lobed distribution is not necessarily linear, a higher number of cells per circuit is desirable, with a minimum of 6 cells per circuit being a sufficient design goal. On the other hand, the higher the number of circuits within the receiver, the higher the output voltage and the lower the output current—both desirable from an electrical standpoint. With each cell (and cell circuit) producing only 3 volts, a minimum of 8 cell circuits is a sufficient design goal, yielding at least 24 volts. The eventual values chosen for a particular design are constrained of course by the fact that the product of the number of cells per circuit and the number of circuits per receiver equals the number of cells in the receiver.

Another way to describe the wiring of cells into circuits is that the cells of each circuit are required to avoid clustering near any contiguous region of the ring, so as to prevent any localized optical effect from influencing only one of the circuits. Thus for example any quadrant of the ring will nominally have exactly 25% of the cells of each circuit, but since the number of cells is finite in reality it might have one cell more. Thus a sufficient condition is to require that each quadrant will not have more than one more than 25% of the cells, rounded upwards.

Yet another way to describe the wiring of the cells into circuits is to define contiguous zones on the ring, and require that one cell from each zone be wired together in parallel to form a circuit. The number of cells in the zones is therefore the number of circuits in the receiver.

The expected optical non-uniformity for a ring focus due to mis-tracking will occur in two main lobes (aligned with the direction of misalignment)—with diametrically opposed maximum and minimum regions, and a gradual transition between them as measured around the ring. Since the cells of each circuit are distributed uniformly around the ring, the effect of the uneven illumination on each circuit will be very similar, and so the circuits can be strung in series without loss of performance.

If the ring receiver is two cells wide, then a similar scheme is employed, except a checkerboard-like pattern can be used. It is important in that case to ensure that each circuit has a similar number of cells in each of the two concentric cell rings.

Figure 27:
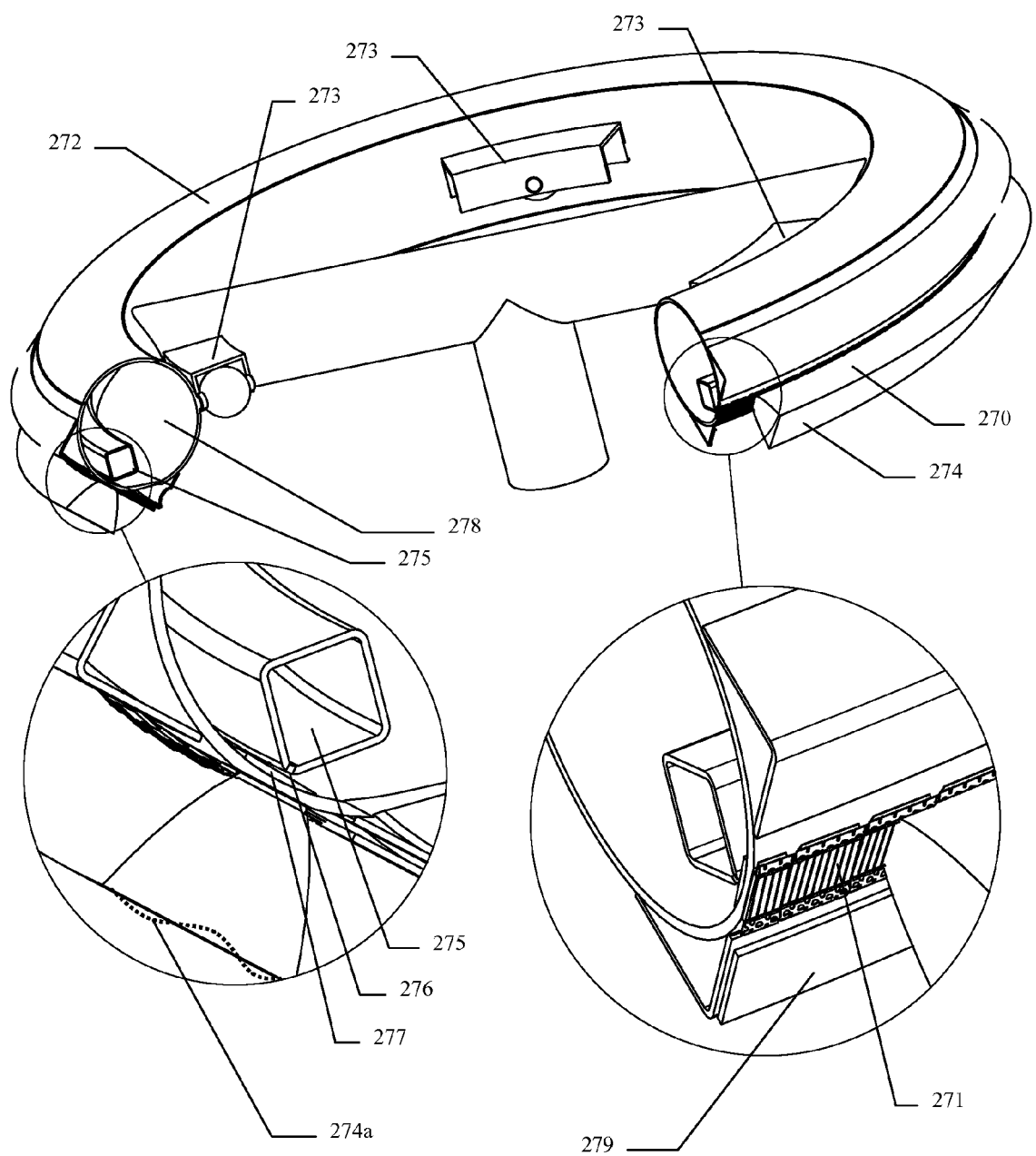
FIG. 27: Ring receiver—Ring receiver with pumped vapor chamber according to an embodiment of the invention

FIG. 27 shows the physical structure of the receiver, comprised of the conical copper ring and cells [271], collection circuit boards [279], a secondary optical element (SOE) [270], a cooling structure [272], and a positioning interface to the fiduciary [273]. (The ring is shown with a slice cut-through for purposes of illustration. The wiring between the PV cells and the collection circuit boards is not shown.)

The SOE, just like the primary, is defined by a planar generatrix which is revolved around the main axis of the system. Irrespective of the specific shape of the generatrix, as long as the radius of revolution is much larger compared to the size of the generatrix, the optics behave close to the case of 2-D (planar) optics, but revolved around the main axis.

In this embodiment, the generatrix is a two-dimensional compound parabolic concentrator (CPC). Unlike a standard revolved CPC, which is revolved around its own axis, this secondary is revolved around the main dish axis, and so forms a ring shape. The CPC is realized as a cast glass solid refractive body using total internal refraction, but in other embodiments can also be realized as two reflective surfaces faces (e.g. using coated electroformed or lathed surfaces). In the case of a refracting CPC, the accepting aperture face [274] can be further curved in an undulating manner in order to help homogenize the light, as shown by the dotted line [274a] depicting the cross section of the aperture face of the SOE. The manner of undulation has to be determined empirically using a ray-tracing computer program by trying different undulation curves and observing the illumination homogeneity.

Figure 38:
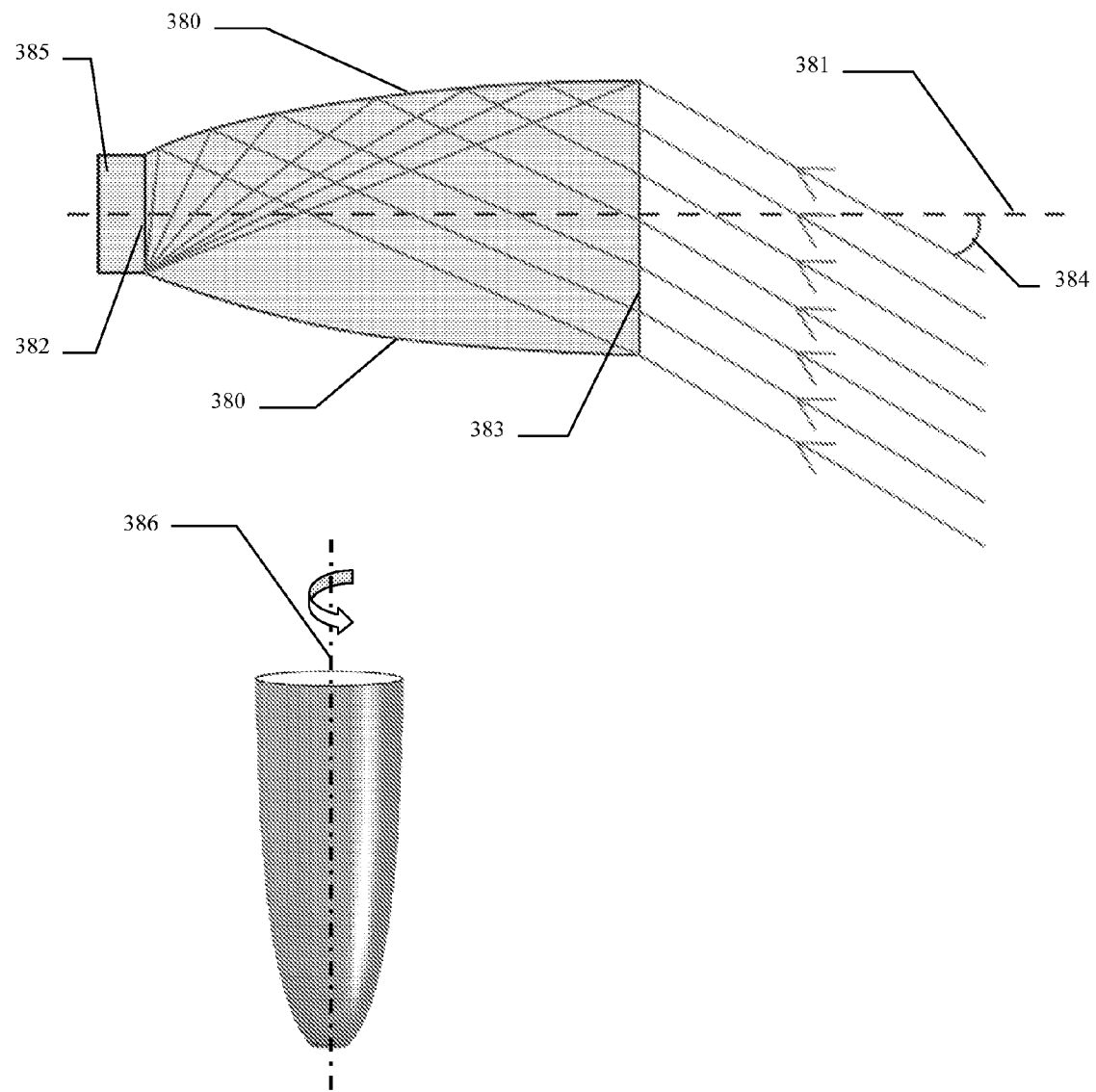
FIG. 38: Prior Art—A compound Parabolic Concentrator (CPC)

A compound parabolic concentrator (CPC) [FIG. 38a] is a well-known non-imaging concentrator comprised of two opposing parabolic arcs [380] each of whose respective focal points lie on its opposing arc or its continuation. The optical axis of the CPC [381] is the line of symmetry between the arcs. The shape just described is a two-dimensional shape, and in two-dimensional optics a CPC is an ideal concentrator, since it accepts all rays arriving at its large aperture [383] within a certain acceptance angle [384] of the optical axis and directs them into the small aperture [382]. The traditional three-dimensional embodiment of the a CPC [FIG. 38b] consists of the two-dimensional contours, revolved around the CPC's optical axis [386], forming a curved cone-like shape. In solar applications, the PV cells [385] are placed near the small aperture.

A traditional three-dimensional CPC is not an ideal concentrator, since it rejects some "skew rays" that do not travel in a meridian plane. In this embodiment, the concentrator is formed by revolving the a two-dimensional CPC-shaped generatrix around the main axis of revolution of the dish. Since the CPC is much smaller than the radius of revolution (as a result of the receiver being a narrow ring) the resultant annular shape operates with only a very small deviation from each meridian plane, and so the optical path is principally two-dimensional and the CPC operates in a very close to ideal manner.

In this embodiment, the SOE entry aperture is about 7 cm wide, its revolved diameter is about 1 m, and the exit aperture is 1 cm wide. In other embodiments the geometry will vary in size, proportions, and choice of material.

In another embodiment the SOE is a concentrating refracting form, such as a convex lens or a circle, again revolved around the main axis of the dish, thus forming a torus (in the case of a circle) or a toroid (in the general case) around the dish axis of revolution.

Coolant fluid arrives by a distribution conduit [275] and is pushed out through distribution holes in its wall [276] located next to a wick [277] located on the copper ring carrier, on the opposite side of the PV cells. The short distance between the distribution holes and the wick ensures that the wick is saturated with coolant irrespective of the orientation of the ring, guaranteeing uniform cooling all around the circumference of the ring. The coolant is allowed to boil out of the wick, with the vapor flowing onto the larger evacuation conduit [278], which is connected to a condenser and a pump that leads back to the distribution conduit. The condenser is located inside the hub, shown separately. The flow conduits between the distribution and evacuation conduits and the condenser and pump are not shown in this drawing.

The conduit system is initially filled with coolant under vacuum, so the pressure inside it is only the vapor pressure of the coolant at ambient temperature. (For example, water at 30 C has a vapor pressure of about 0.75 PSI). Once the cells are illuminated, their excess heat begins to boil the coolant. Initially, there isn't enough temperature different for the condenser to condense the vapor, and so the pressure rises, and with it so does the boiling temperature of the coolant, thus allowing the condenser to work over a larger temperature difference—this is the same pressure self-regulation principle employed in any heat pipe or vapor chamber, except that in this implementation the condenser is distinct from the evaporator and the fluid coolant is actively pumped.

The advantage of using a phase-change over simple convective cooling (as is done for example in a typical car engine) is that the evaporation temperature is constant around the ring, even if some of the cells receive more illumination due for example to a tracking error. In a convective system, a localized increase in heat load results in a localized increase in temperature. In an evaporative system, the same localized increase in heat load simply results in an increased rate of boiling over that region.

In this embodiment, the evacuation conduit is made from a stainless steel tube, bent to form the torus. The ring is then slit circumferentially where the conical copper ring fits, and the two parts brazed together, so that the coolant inside the conduit comes into direct contact with the copper ring, and so the heat from the cells does not have to flow across the stainless steel wall. Alternatively, the ring conduit can be manufactured using a roll-formed profile instead of a tube. Alternatively, the entire evacuation conduit can be made from a copper tube, in which case the conduit and the ring carrier are unified into a single part.

Figure 28:
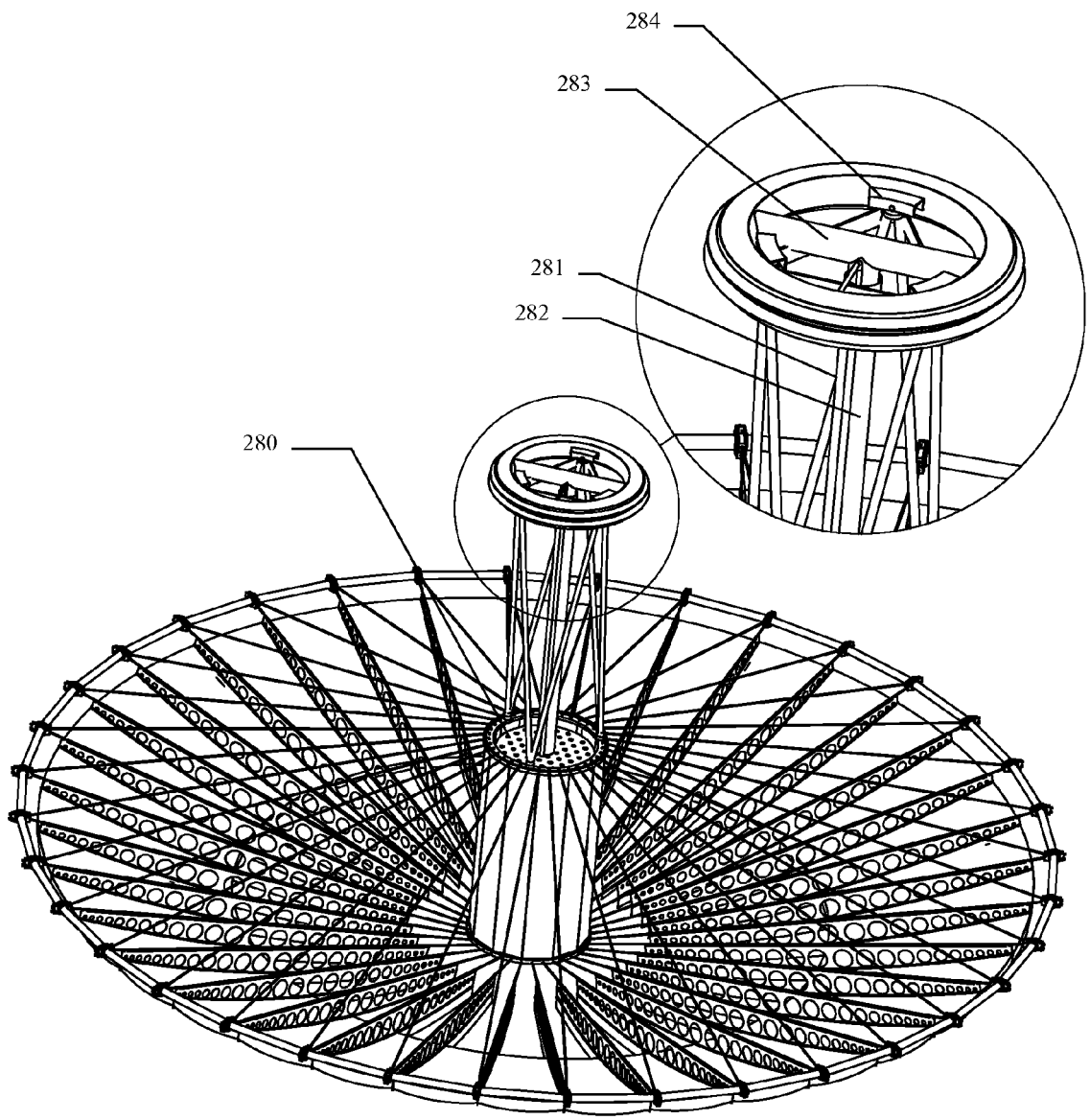
FIG. 28: Ring receiver—Ring receiver in context of ACS according to an embodiment of the invention

FIG. 28 shows the ring receiver in context of the ACS. A condenser [280] is located inside the hub of the mirror, as described previously.

Liquid coolant flows forward through a small conduit [281] that connects to the coolant distribution conduit inside the receiver. Vapor coolant flows backwards through a larger conduit [282] that connects through a manifold [283] to the ring evacuation conduit.

Also visible is the connection between the receiver and the fiduciary mount [284]. As described in U.S. patent application Ser. No. 13/032,607, each of the three spheres that are part of the receiver slides along its shaft until it sits tangent in the corresponding conical depression in the fiduciary. This mount is unique, stress-free, and can accommodate thermal expansion. Since the fiduciary has multiple sets of three cones, other devices such as the Laser Alignment Guide can be attached to it while the PV receiver is in place.

Figure 29:
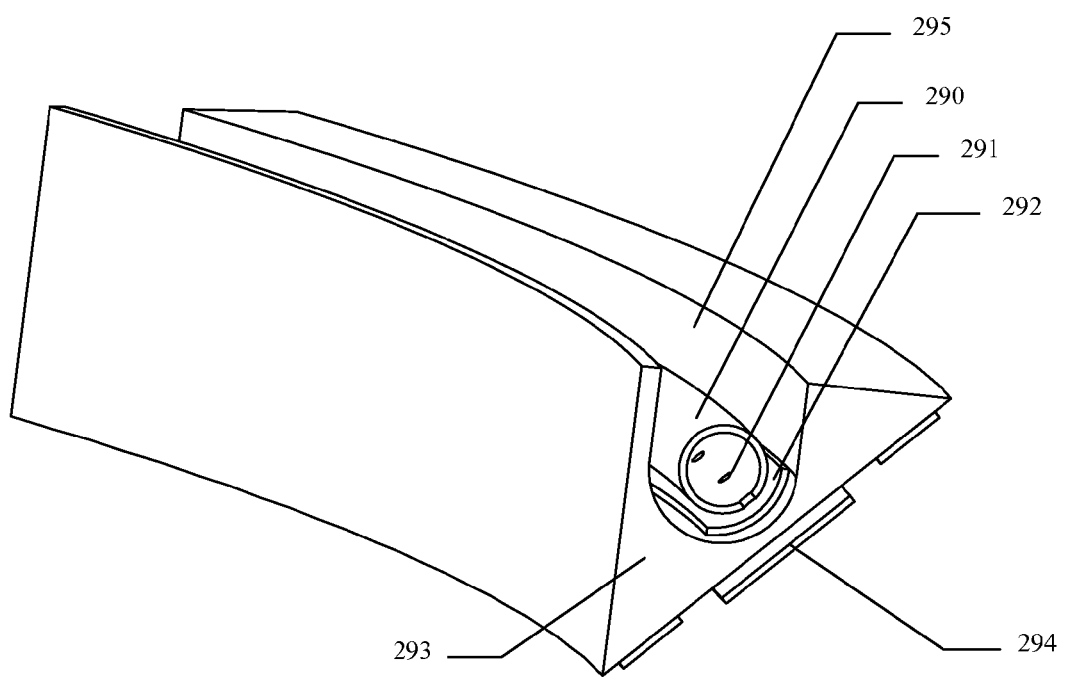
FIG. 29: Ring receiver—Ring receiver with convective cooling according to an embodiment of the invention

FIG. 29 shows in a slice cut-away a second cooling embodiment, using coolant with no phase change. Coolant is supplied through a distribution conduit [290] and distribution hole onto a wick [292] located on the ring carrier [293] opposite the PV cells [294]. The hot coolant, still in liquid form, exits through the evacuation conduit [295] to a heat exchange that is similarly located inside the hub of the ACS. In this embodiment, the pressure inside the system can remain 1 Atmosphere.

Figure 30:
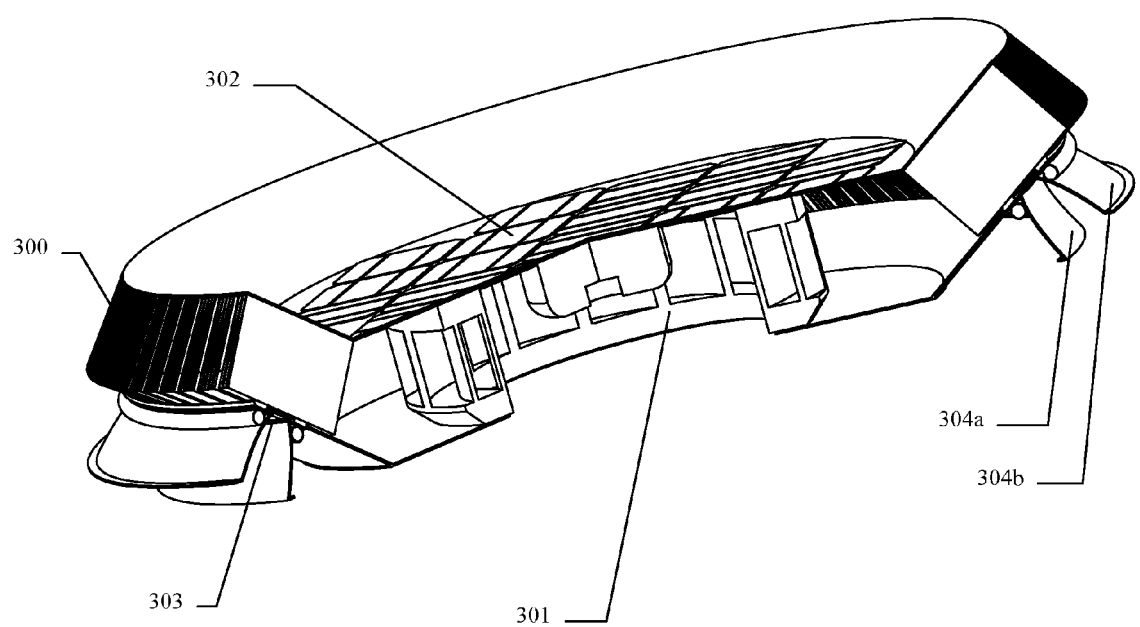
FIG. 30: Ring receiver—Ring receiver with air-cooled heat sink according to an embodiment of the invention

FIG. 30 shows an alternative embodiment of the cooling system where the liquid cooling mechanism is replaced by a conductive finned heat sink [300] and a centrifugal fan [301] that flows air over the fins. The fan is driven by standard non-concentrating auxiliary PV panels [302]. This embodiment is simpler than the coolant-based one, but the area available for heat rejection into the environment is smaller, and so the working temperature of the cells will be higher. The PV cells [303] are mounted in the sane fashion as they are in the coolant-based embodiment.

The SOE in this embodiment is reflective rather than refractive, and so the bulk glass is replaced by two reflective walls [304a-b], which are typically created by simple machining, turning, or electroforming.

While the invention has been described with reference to particular embodiments thereof, it is not limited to those embodiments. Specifically, various variations and modifications may be implemented by those of ordinary skill in the art without departing from the invention's spirit and scope, as defined by the appended claims. The various aspects and advantages of the invention can be considered as follows.

[A: ACS]

Aspects of the invention include an apparatus intercepting a radiation flux, where the apparatus is comprised of a carrier structure and intercepting tiles, the carrier structure comprising: a rim, a hub, and spokes, said rim being a slender member lying principally in a plane and forming the approximate shape of a ring, the hub being a rigid member located inside said rim and extending out from said plane in both directions, and the spokes being slender tensile members connecting the rim to the hub and preloaded in tension, and the tiles being attached to said structure so as to collectively intercept said radiation flux propagating towards the rim. In some embodiments the spokes may connect the rim to the hub in a radial bicycle wheel geometry, while in other embodiments the spokes may connect the rim to the hub in a torque bearing bicycle wheel geometry.

(ACS—Rim)

Aspects of the invention further modify the rim to comprises a plurality of straight rigid members coupled end-to-end to approximate the shape of a ring, and such approximation can take the form of a convex polygon having at least six sides.

Aspects of the invention further modify the rim members to rigid tubes, and said tubes can include spherical protrusions or depressions at their ends.

(ACS—Spokes)

Aspects of the invention further have the tension preload greater than 10% or even 25% of the Ultimate Tensile Strength (UTS) of the spokes, and said spokes can be realized as braids made of multiple strands, and material belonging to the group consisting of steel, fiber reinforced composite, synthetic fibers, Kevlar, Zylon or combination thereof.

(ACS—Tensioners)

Aspects of the invention can further have the hub including two crowns, each connected to spokes on a different side of the plane defined by the rim, and further comprising a mechanism for moving said crowns away from each other in the axial direction, such that said motion increases the tension in the spokes.

Aspects of the invention can further comprise at least one adjustment mechanism connecting a spoke to the hub, said adjustment mechanism capable of changing the distance between a fixed point on the spoke and a fixed point on the hub.

Aspects of the invention can further comprise at least one adjustment mechanism connecting a spoke to the rim, said adjustment mechanism capable of changing the distance between a fixed point on the spoke and a fixed point on the rim, and can have said adjustment mechanism connect two spokes to a common point on the rim, said two spokes being coplanar, and can further have said point being between an adjacent pair of said rigid members of the rim.

(ACS—Ribs, Tile Attachment)

Aspects of the invention can further comprise at least one planar stiffening member, attached to a corresponding spoke, said stiffening members each having orthogonal thickness, width and length dimensions, said thickness being smaller than 10% of said width and said width being smaller than 33% of said length, said thickness direction being parallel to the plane of the rim, and said length direction being essentially parallel to said spoke. At least one of said planar stiffening members can also attach to at least one of said tiles, and can also further comprise a member configured for attachment to said tile, said tile having a reflective face, and said member contacting said tile on said reflective face.

(ACS—Optical Shape)

Aspects of the invention can further have at least one of said tiles comprise an optical surface partial to an optical shape having a focal region, and have said optical surface be reflective and of a shape of a portion of a paraboloid or functional approximation thereof, or approximate a Fresnel paraboloid or functional approximation thereof, or approximate a portion of a paraboloid whose focal distance is between 0.5 and 1.5 times the diameter of the rim or approximate a portion of a concave surface depressed near its center and whose deviation from a flat plane is smaller than 10% of the diameter of the rim, or approximate a portion of a flat reflector or functional approximation thereof, or approximate a portion of an offset revolved paraboloid comprising a generatrix in the shape of a parabola whose optical axis is parallel but radially offset from the axis of revolution, or approximate a portion of an offset revolved paraboloid whose focal distance is between 0.5 and 1.5 times the diameter of the rim.

(ACS—Tiles)

Aspects of the invention can further have the tiles made out of a material from the group consisting of sheet metal, fiber-reinforced plastic, Mylar, plastic, glass or combination thereof.

Aspects of the invention can further have the reflective surfaces made out of a material from the group consisting of Silver, Aluminum, metal coated plastic, metal-coated aluminum, metal coated glass or combination thereof.

Aspects of the invention can further have the tiles be energy conversion devices that convert the energy carried in the radiation flux into electricity.

(ACS—Fiduciary/Receivers)

Aspects of the invention can further comprise a kinematic coupling having two mating components, one of said mating components being rigidly connected to said hub, and a power conversion unit (PCU) and a rigid structure connecting said PCU to said hub, said PCU encompassing said axis of revolution of the dish.

Aspects of the invention can further have said PCU belong to the group consisting of thermal engine, Stirling engine, gas turbine, and photovoltaic converter, and have said PCU be a photovoltaic converter, whose photovoltaic surface is shaped like a ring, said ring having a width smaller than 10% of its diameter.

Aspects of the invention can further comprise a heat rejection device located inside said hub and connected to said PCU.

Aspects of the invention can further comprise an actuation subsystem between said rigid structure and the hub, said actuation system configured to tilt said rigid structure thereby moving the PCU in relation to said axis of revolution of the dish.

Aspects of the invention can further have the PCU be a thermal engine comprising a hot compartment and a cold compartment, and wherein said thermal engine is oriented such that the hot compartment encompasses said focal region, and the cold compartment lies along the imaginary line connecting the hot compartment and the hub, and is closer to the hub.

Aspects of the invention can further comprise a heat rejection device located inside said hub and connected to said cold compartment.

[Ring Receiver]

Aspects of the invention comprise a solar receiver having a power conversion layer in the shape of a ring, said ring having a first axis of revolution, a photovoltaic active front surface, a back surface, a width and a diameter, said width being less than 10% of said diameter.

(Ring—Shape)

Aspects of the invention can further have said power conversion layer be of a shape belonging to the group consisting of cylindrical ring, flat ring, conical ring.

(Ring—Cooling)

Aspects of the invention can further comprise an annular substrate in thermal contact with said back surface of said power conversion layer, said annular substrate having the same axis of revolution as said photovoltaic layer and a thermal conductivity better than 100 W/m-K, and can also be specifically made from Copper, Aluminum, alloys of Copper, alloys of Aluminum, or a combination thereof.

Aspects of the invention can further comprise a ring shaped first conduit configured to deliver coolant fluid onto the annular substrate, and having an axis of revolution coincident with said first axis of revolution.

Aspects of the invention can further comprise a ring shaped second conduit configured to evacuate coolant fluid from near said annular substrate, and having an axis of revolution coincident with said first axis of revolution, and have the pressure within said second conduit is below 1 Atmosphere.

(Ring—Cells)

Aspects of the invention can further have said power conversion layer be comprised of a plurality of PV cells, each of whose shape individually belongs to the group consisting of square, rectangular, trapezoid.

Aspects of the invention can further have said power conversion layer be comprised of a plurality of PV cells, said photovoltaic cells are grouped into a first number of circuits, the cells within each circuit being electrically connected in parallel, and physically distributed around the ring so that any quadrant of the ring contains at most a third of the cells of any circuit, and can have the circuits be further connected to each other in series, and can further have at least six cells per circuit.

Aspects of the invention can further have said power conversion layer be comprised of a plurality of PV cells, said photovoltaic cells are grouped into a first number of circuits, the cells within each circuit being electrically connected in parallel, and physically distributed around the ring so that any contiguous half of the ring contains at most 60% of the cells of any circuit, and can have the circuits are further connected to each other in series, and can further have at least six cells per circuit.

Aspects of the invention can further have said power conversion layer be comprised of a plurality of PV cells, said photovoltaic cells are grouped into a first number of zones, the cells of each zone being physically contiguous, and also grouped into a second number of circuits, and each circuit comprised of cells belonging to every zone, and can have the circuits be further connected to each other in series, and can further have said have at least six cells per circuit.

(Ring—SOE)

Aspects of the invention can further comprise a secondary optical element (SOE), said second optical element being of a shape of revolution around said primary axis and having an annular input aperture and an annular output aperture, said shape of revolution having a generatrix form, and said secondary optical element configured to transmit light arriving into said input aperture through said output aperture and onto said photovoltaic receiver surface. The SOE can concentrate said solar light by a process belonging to the group consisting of refraction, reflection, total internal refraction or a combination thereof. The generatrix of said secondary optical element can comprise at least one parabolic arcs or two parabolic arcs describing the arcs of a compound parabolic concentrator, the axis of said compound parabolic concentrator being tilted relative to said first axis of revolution so that the smaller aperture of said compound parabolic concentrator is closer to said first axis of revolution than the large aperture of said compound parabolic concentrator. The form of the shape of revolution can be further deformed in an undulating manner so as to more homogeneously distribute the incoming light across said output aperture. Aspects of the invention can further have at least one of the arcs that compose the generatrix shape of the concentrator are further deformed in an undulating manner so as to more homogeneously distribute the incoming light across the small aperture of the compound parabolic concentrator.

(Ring—Dish)

Aspects of the invention can further comprise a reflector dish connected to it through a rigid structure, where said reflector dish can further be comprised of a hub, rim a plurality of spokes, and a plurality of tiles, said rim being a slender member lying principally in a plane and forming the approximate shape of a ring, said hub being a rigid member located inside said rim and extending out from said plane in both directions, said spokes being slender tensile members connecting the rim to the hub and preloaded in tension, and said tiles having reflective surfaces and collectively forming a reflective shape having a ring-shaped focal region, said focal region coinciding with said ring-shaped photovoltaic receiver.

[C: Optical Path]

Aspects of the invention comprise an apparatus for converting light energy into electric energy, comprising a reflector having a reflective surface shaped as a surface of revolution having a first generatrix and a first axis of revolution, whereby the reflective surface is configured to focus reflected radiation arriving along a direction parallel said first axis of revolution onto a ringed-shaped focus area.
(Optical—Shape)

Aspects of the invention can further have said first generatrix be a parabolic arc whose optical axis is parallel to but radially offset from said first axis of revolution.

Aspects of the invention can further comprise a ring-shaped photovoltaic receiver positioned at the ringed-shaped focus area.

Aspects of the invention can further have said photovoltaic receiver be of a shape belonging to the group consisting of cylindrical ring, flat ring, conical ring.
(Optical—Cells)

Aspects of the invention can further have the photovoltaic converter comprise a plurality of photovoltaic cells, and can further have the plurality of photovoltaic cells be divided into contiguous zones, each zone having several photovoltaic cells, wherein one cell from each zone is electrically connected in parallel to one cell from each of the other zones.
(Optical—SOE)

Aspects of the invention can further have the ring-shaped receiver comprise an optical concentrator focusing light received at the ring-shaped area onto the photovoltaic converter, and further have said optical concentrator is shaped as a shape of revolution whose axis of revolution is coincident with said first axis of revolution.

Aspects of the invention can further have the generatrix of said optical concentrator comprise two parabolic arcs of a compound parabolic concentrator, the axis of said compound parabolic concentrator being tilted relative to said axis of revolution and pointing towards said first generatrix.
(Optical—Cooling)

Aspects of the invention can further comprise a ring-shaped heat sink, and can also comprise a ring shaped cooling fluid delivery system for cooling the photovoltaic converter.
(Optical—ACS)

Aspects of the invention can further have said reflector comprise a plurality of reflector tile bodies, said tile bodies held in position by a carrier structure comprising a hub, a rim, and a plurality of spokes, said rim being a slender member lying principally in a plane and forming the approximate shape of a ring, said hub being a rigid member located inside said rim and extending out from said plane in both directions, and said spokes being slender tensile members connecting the rim to the hub and preloaded in tension.
[D: Tile Structure]

Aspects of the invention comprise method for fabricating curved reflector tiles, comprising bending a front membrane, having a reflective surface, so that the reflective surface assumes a desired curved surface; fabricating a core such that the core has a front surface approximating the desired curved surface; placing the core over the front membrane, such that the front surface of the core touches backside of the reflective surface; placing a back membrane over the core; securing the core to the front membrane; and securing the back membrane to the core.

Aspects of the invention further have the step of bending a front membrane comprise placing the front membrane over a bending mold using a process from the group consisting of vacuum, fluid pressure, and electrostatic adhesion.

Aspects of the invention further have the step of placing the core performed while the front membrane is held over the bending mold and the step of placing the back membrane over the core performed while the front membrane is held over the bending mold.

Aspects of the invention further have the steps of securing the core to the front membrane and securing the back membrane to the core comprise adhering the core to the front membrane and adhering the back membrane to the core while the front membrane is held over the bending mold.

Aspects of the invention further have the step of fabricating a core comprise vacuum forming a core from a flat membrane to resemble a plurality of interconnected cups, or comprising vacuum forming a core from a flat membrane to resemble a plurality of interconnected cups having rims whose shape belongs to the group consisting of round, triangular, square, rectangular, trapezoid, and hexagonal or comprising vacuum forming a core from a flat membrane to resemble a plurality of interconnected tapered cups having rims that are larger than their bases.

Aspects of the invention further have the step of fabricating a core comprise vacuum forming a core from a flat membrane to resemble a plurality of cups interconnected along said front surface of core, or comprising vacuum forming a core from a flat membrane to resemble a plurality of cups interconnected along said front surface of core so that cups located towards the edges of the formed core are formed to be shallower than cups located towards its center.

Aspects of the invention further have the step of fabricating a core comprise corrugating a sheet of metal, followed by slotting the surfaces of the sheet that do not belong to said front surface of the core, followed by bending said unslotted front surface to approximate said desired curved surface Aspects of the invention further have the step of fabricating a core comprise corrugating a plurality of strips of metal, followed by aggregating them side by side to constitute the core, followed by bending said aggregate strips along their length to approximate said desired curved surface.
[E: Tile Attachment]

Aspects of the invention comprise a solar reflector comprising: a carrier structure; a plurality of rigid guides coupled to the carrier structure; a plurality of curved reflector tiles, each having a reflective surface; and each mounted to the carrier structure such that its reflective surface is pressed at its outer edges against at least two of the rigid guides; a plurality of fasteners resiliently supporting said reflector tiles in the forward direction against said rigid guides, such that the rigid guides force the reflective surface to its proper position.

Aspects of the invention further have said rigid guides be elongated and curved and have the fasteners force said reflective surfaces against the rigid guides such that the reflective surfaces assume a curvature matched curvature of the curved rigid guides.

Aspects of the invention further have the carrier comprise: a rim; a hub; a plurality of spokes coupled between the rim and the hub; wherein each of the plurality of rigid guides is coupled to a respective spoke.

Aspects of the invention further have the plurality of spokes comprise slender tensile members connecting the rim to the hub and preloaded in tension, and have the reflector further comprise a plurality of stiffeners provided on selected spokes, and wherein each stiffeners carries two of the rigid guides.

Aspects of the invention further have the reflector surface be an optically reflective surface and have the rigid guides shade no more than five percent of the optically reflective surface.

Aspects of the invention further have the plurality of curved reflector tiles form a circular reflector, and have each of the tiles shaped as a slice of the circle.

Aspects of the invention further have each of the tiles shaped as a section of an offset revolved paraboloid comprising a generatrix in the shape of a parabola whose optical axis is parallel but radially offset from axis of revolution, whereby the reflector focuses reflected radiation onto a ringed-shaped focus area.

Aspects of the invention further comprise a support structure positioning a ring-shaped receiver at the ringed-shaped focus area.

Aspects of the invention further have the ring-shaped receiver comprise a ringed-shaped counter-reflector.

Aspects of the invention further have the counter reflector comprise two revolved surfaces having a common axis of revolution and whose generatrix is a compound parabolic concentrator whose axis is offset and parallel to the axis of revolution.

Aspects of the invention further have the support structure comprise a hexapod.

Aspects of the invention further have the hexapod comprise six rods defining a base and a top, and wherein at the base the six rods are connected to form three pairs, each of the three pairs being connected to an actuator.

Aspects of the invention further have each rod of the three pairs connected at the top to a rod from another one of the three pairs.

Aspects of the invention further have each of the tiles comprise a flexible core sandwiched between a top reflective membrane and a bottom membrane.

Aspects of the invention further have the top reflective membrane conform to the top surface of the flexible core to thereby assume a shape in the form of a section of an offset revolved paraboloid comprising a generatrix in the shape of a parabola whose optical axis is parallel but radially offset from axis of revolution.

Aspects of the invention further have the flexible core comprise a vacuum-formed plastic core, and wherein the top reflective membrane and the bottom membrane are glued to the vacuum-formed plastic core.

Aspects of the invention further have each of the tiles further comprise rigid sides having provisions for engaging a plurality of fasteners to resiliently support the tile in the forward direction against said rigid guides.

[F: Cleaning Arm Mechanism]

Aspects of the invention comprise a reflective surface of revolution having a primary axis of revolution, a stationary member encompassing said axis of revolution, a rotating subsystem extending from said stationary member towards the perimeter of said surface of revolution and having an internal conduit having an inlet near said stationary member and at least one outlet facing said reflective surface, and a fluid delivery means capable of supplying coolant to said conduit.

Aspects of the invention further have a rotary manifold configured to allow said rotary subsystem to rotate while providing a fluid path from said stationary member to said inlet.

Aspects of the invention further have a means for converting fluid pressure into a mechanical motive force for rotating said rotary subsystem.

Aspects of the invention further have a stationary conduit for collecting fluid from said surface of revolution, said conduit being shaped as a ring around said stationary member.

[G: Vacuum Forming Painting Job]

Aspects of the invention comprise a method for controlling the wall thickness of vacuum molded parts consisting of providing a vacuum mold, vacuum generator, a plastic sheet, and a radiative heater, and further pre-painting said plastic sheet in a pattern to thereby generate regions of varying heat absorbance, heating said plastic sheet with said radiative heater thus generating regions of different temperatures in said sheet according to the regions of varying heat absorbance, attaching said sheet to said vacuum mold, and applying said vacuum source to said vacuum mold so that said sheet is sucked to conform to the shape of the vacuum mold, whereby hotter regions deform and flow more readily as the sheet is stretches and so become thinner than colder regions.

[H: Standalone Revolved CPC]

Aspects of the invention comprise an optical concentrator comprising two revolved surfaces having a common axis of revolution and whose generatrix is a compound parabolic concentrator whose axis is offset and tilted to the axis of revolution so that its small aperture is closer to the common axis of revolution than its large aperture.

Aspects of the invention further have the two revolved surfaces comprise mirrored surfaces.

Aspects of the invention further comprise a solid ring of optically transparent material wherein the two said revolved surfaces are part of the surface of said solid of revolution and are configured for total internal refraction of propagating radiation.

Aspects of the invention further have the ring further comprise a radiation accepting surface of revolution at a distal position from the axis of revolution and a radiation emitting surface of revolution proximal the axis of revolution, and wherein the generatrix of said radiation receiving surface is curved in an undulating manner configured to homogenize radiation emitted from said radiation emitting surface.

Aspects of the invention further comprise a photovoltaic arrangement positioned to receive solar radiation from said emitting surface.

Aspects of the invention further comprise a photovoltaic arrangement positioned to receive solar radiation from said small aperture.

[I: Holistic]

Aspects of the invention comprise a concentrated solar system, comprising: a pedestal; a dish mounted onto the pedestal; a plurality of tiles mounted onto the dish, each having a reflective upper surface; a solar converter positioned to receive solar energy reflected from the plurality of tiles; wherein the dish comprises: a hub mounted onto the pedestal, the hub comprising an upper crown and a lower crown; a rim; a plurality of tensile upper spokes connecting the rim to the upper crown and preloaded in tension and, a plurality of tensile lower spokes connecting the rim to the lower crown and preloaded in tension.

Aspects of the invention further comprise a plurality of coupling nodes spread evenly about the rim, and wherein each of the upper spokes is paired with a corresponding one of the lower spokes, and wherein each pair of upper and lower spokes is coupled to one of the coupling nodes.

Aspects of the invention further have each of the coupling nodes comprise: a central joint, an upper tensioner link coupling the upper spoke to the central joint; and a lower tensioner link coupling the lower spoke to the central joint.

Aspects of the invention further have the rim comprise a plurality of rim segments, and wherein each central joint is held in compression between two rim segments.

Aspects of the invention further have the rim comprise a plurality of rim segments, and further comprise a plurality of central joints, wherein each central joint is coupled between two rim segments.

Aspects of the invention further comprise a plurality of stiffeners, each attached to one of the lower spokes.

Aspects of the invention further have each of the tiles coupled to two of the stiffeners.

Aspects of the invention further have each of the stiffeners comprise an elongated guide provided on each side thereof, and wherein each of the tiles is pressed against the guides along its reflective upper surface.

Aspects of the invention further have the reflective upper surface of each tile shaped to approximate a portion of a revolved paraboloid.

Aspects of the invention further have the reflective upper surface of each tile shaped to approximate a portion of an offset revolved paraboloid comprising a generatrix in the shape of a parabola whose optical axis is parallel but radially offset from the axis of revolution.

Aspects of the invention further have the reflective upper surface of each tile shaped so that the plurality of tiles reflect incident light onto a focal area in the shape of a ring.

Aspects of the invention further have each of the tiles comprise a front reflective membrane, a back membrane, and a core provided in between the front reflective membrane and the back membrane.

Aspects of the invention further have the solar converter comprise a plurality of photovoltaic cells arranged in a shape of a ring.

Aspects of the invention further comprise a hexapod mounted at its lower side onto the hub, and wherein the solar converter is mounted onto an upper side of the hexapod.

Aspects of the invention further comprise actuators coupled to the back side of the hexapod to adjust the position of the solar converter.

Aspects of the invention further have the solar converter further comprise a secondary optical element focusing the light reflected from the tiles onto the photovoltaic cells.

Aspects of the invention further have the secondary optical element comprise a two-dimensional compound parabolic concentrator.

Aspects of the invention further have the solar converter further comprise a cooling system for cooling the photovoltaic cells.

Aspects of the invention further have the plurality of solar cells divided into contiguous zones, each zone having several photovoltaic cells, wherein one cell from each zone is electrically connected in parallel to one cell from each of the other zones.

Aspects of the invention further have the hub further comprise a heat exchanger for cooling fluids received from the solar converter.

[J: Holistic Method]

Aspects of the invention comprise a method for fabricating a solar concentrator, comprising: securing a pedestal to the ground; mounting a hub onto the pedestal; attaching a first plurality of spokes to front crown of the hub; attaching a second plurality of spokes to rear crown of the hub; attaching the first and second plurality of spokes to a rim; adjusting tension of the first and second plurality of spokes such that the rim assumes a planar orientation; mounting a plurality of reflective tiles onto the spokes.

Aspects of the invention further have the step of adjusting tension further comprise illuminating the rim with a laser to ensure all points on the rim lie in a single plane.

Aspects of the invention further have the step of mounting a plurality of reflective tiles further comprise mounting a plurality of stiffeners onto the second plurality of spokes, and mounting the plurality of reflective tiles onto the stiffeners.

Aspects of the invention further have the step of comprising attaching a plurality of elongated guides to the plurality of stiffeners, and pressing each of the tiles against at least two of the elongated guides.

Aspects of the invention further have the step of pressing each of the tiles against at least two of the elongated guides comprises fastening a plurality of resilient members between each tile and its respective stiffeners.

Aspects of the invention further have the step of mounting a solar converter at a focal location of the plurality of reflective tiles.

Aspects of the invention further have the step of mounting a solar converter comprising mounting a hexapod onto the hub and mounting the solar converter onto the hexapod.

Aspects of the invention further have the step of fabricating a heat exchanger inside the hub, and providing fluid conduits between the heat exchanger and the solar converter.

Aspects of the invention further have the step of mounting a solar converter comprising arranging a plurality of photovoltaic solar cells in a ring.

Aspects of the invention further comprise the step of dividing the ring into contiguous zones, each zone having several of the photovoltaic solar cells, and electrically connecting in parallel one cell from each zone to one cell from each of the other zones.

Aspects of the invention further comprise the step of mounting a secondary optical element to focus the light reflected from the tiles onto the solar converter.

Aspects of the invention further comprise the step of mounting a rotating washing arm onto the rim.

Aspects of the invention further comprise the step of forming the reflective tile by shaping a front reflective membrane to a desired curvature, and sandwiching a flexible core in between the front reflective membrane and a back membrane.

Aspects of the invention further having the step of shaping a front reflective membrane to a desired curvature comprising shaping the front reflective membrane to a curvature such that the plurality of tiles when mounted together reflect incident light onto a focal area in the shape of a ring.

Aspects of the invention further have the step of shaping a front reflective membrane to a desired curvature comprising shaping the front reflective membrane to approximate a portion of an offset revolved paraboloid comprising a generatrix in the shape of a parabola whose optical axis is parallel but radially offset from the axis of revolution.

What is claimed is:

1. A concentrated solar system, comprising:
    a pedestal;
    a dish mounted onto the pedestal;
    a plurality of tiles mounted onto the dish, each having a reflective surface;
    a solar converter positioned to receive solar energy reflected from the plurality of tiles;
    wherein the dish comprises:
        a hub mounted onto the pedestal, the hub comprising an upper crown and a lower crown;
        a rim comprising a plurality of rim segments; and,
        a plurality of coupling nodes, each coupling node positioned between two rim segments;
        a plurality of tensile upper spokes, each connecting one of the coupling nodes to the upper crown and preloaded in tension and,
        a plurality of tensile lower spokes, each connecting one of the coupling nodes to the lower crown and preloaded in tension,
        wherein each of the upper spokes is paired with a corresponding one of the lower spokes and both are connected to one of the coupling nodes such that lines of force of paired upper and lower spokes intersect at a single point at the coupling node thereby eliminating out-of-plane forces on the rim segments.

2. The system of claim 1, wherein said hub further comprises a mechanism configured to move the upper and lower crown away from each other alone a direction of the axis of the dish.

3. The system of claim 1, wherein each of the coupling nodes comprises:
a central joint,
an upper tensioner link coupling the upper spoke to the central joint; and,
a lower tensioner link coupling the lower spoke to the central joint.

4. The system of claim 3, wherein each central joint is held in compression between two rim segments.

5. The system of claim 3, wherein at least one of the upper and lower tensioner links comprise a mechanism configured to adjustably move a corresponding upper or lower spoke towards said coupling node, thereby changing the effective length of the corresponding upper or lower spoke.

6. The system of claim 1, further comprising a plurality of stiffeners, each attached to one of the lower spokes.

7. The system of claim 6, wherein each of the tiles is coupled to two adjacent stiffeners.

8. The system of claim 7, wherein each of the stiffeners comprises an elongated guide provided on each side thereof, and wherein each of the tiles is pressed against the guides of adjacent stiffeners along its reflective surface.

9. The system of claim 1, wherein the reflective surface of each tile is shaped to approximate a portion of a revolved paraboloid.

10. The system of claim 1, wherein the reflective surface of each tile is shaped to approximate a portion of an offset revolved paraboloid comprising a generatrix in the shape of a parabola whose optical axis is parallel but radially offset from the axis of revolution.

11. The system of claim 1, wherein the reflective surface of each tile is shaped so that the plurality of tiles reflect incident light onto a focal area in the shape of a ring.

12. The system of claim 1, wherein each of the tiles comprises a front reflective membrane, a back membrane, and a core provided in between the front reflective membrane and the back membrane.

13. The system of claim 1, wherein the solar converter comprises a plurality of photovoltaic cells arranged in a shape of a ring.

14. The system of claim 13, further comprising a hexapod mounted at its lower side onto the hub, and wherein the solar converter is mounted onto an upper side of the hexapod.

15. The system of claim 14, further comprising actuators coupled to the back side of the hexapod to adjust the position of the solar converter.

16. The system of claim 13, wherein the solar converter further comprises a secondary optical element focusing the light reflected from the tiles onto the photovoltaic cells.

17. The system of claim 16, wherein the secondary optical element is shaped as a two-dimensional compound parabolic concentrator revolved around the axis of the dish.

18. The system of claim 17, wherein the solar converter further comprises a cooling system for cooling the photovoltaic cells.

19. The system of claim 18, wherein the plurality of solar cells are divided into contiguous zones, each zone having several photovoltaic cells, wherein one cell from each zone is electrically connected in parallel to one cell from each of the other zones.

20. The system of claim 1, wherein the hub further comprises a heat exchanger for cooling fluids received from the solar converter.

* * * * *